(12) United States Patent
Blauvelt et al.

(10) Patent No.: US 12,431,690 B1
(45) Date of Patent: Sep. 30, 2025

(54) SEMICONDUCTOR WAVEGUIDE OPTICAL GAIN DEVICE WITH OPTICAL MODE SHAPING

(71) Applicant: HieFo Corporation, Alhambra, CA (US)

(72) Inventors: Henry A. Blauvelt, San Marino, CA (US); Wei Hsin, Arcadia, CA (US)

(73) Assignee: HieFo Corporation, Alhambra, CA (US)

( * ) Notice: Subject to any disclaimer, the term of this patent is extended or adjusted under 35 U.S.C. 154(b) by 0 days.

(21) Appl. No.: 19/057,892

(22) Filed: Feb. 19, 2025

Related U.S. Application Data

(62) Division of application No. 18/957,531, filed on Nov. 22, 2024.

(51) Int. Cl.
  *H01S 5/22* (2006.01)
  *H01S 5/223* (2006.01)
  *H01S 5/227* (2006.01)

(52) U.S. Cl.
  CPC .............. *H01S 5/2205* (2013.01); *H01S 5/22* (2013.01); *H01S 5/223* (2013.01); *H01S 5/2231* (2013.01); *H01S 5/227* (2013.01)

(58) Field of Classification Search
  CPC .......... H01S 5/2205; H01S 5/22; H01S 5/223; H01S 5/2231; H01S 5/227
  See application file for complete search history.

(56) References Cited

U.S. PATENT DOCUMENTS

| | | | |
|---|---|---|---|
| 6,556,605 B1* | 4/2003 | Shtengel | H01S 5/227 372/46.01 |
| 2002/0118717 A1* | 8/2002 | Nagashima | H01S 5/227 372/46.01 |
| 2010/0124245 A1* | 5/2010 | Kobayashi | B82Y 20/00 257/E21.158 |
| 2021/0044090 A1* | 2/2021 | Fuchida | H01S 5/2206 |

* cited by examiner

*Primary Examiner* — Yuanda Zhang
(74) *Attorney, Agent, or Firm* — David S. Alavi

(57) ABSTRACT

A semiconductor optical device includes n-doped, p-doped, and active layers, an optical waveguide structure, and drive current structure(s). The waveguide structure defines optical mode(s); the drive current structure defines a drive current path. One or both of those structures are arranged to result in a selected (or maximized) degree of overlap between lateral profiles of current density and optical intensity. The optical device can be arranged as a diode laser or optical amplifier.

23 Claims, 45 Drawing Sheets

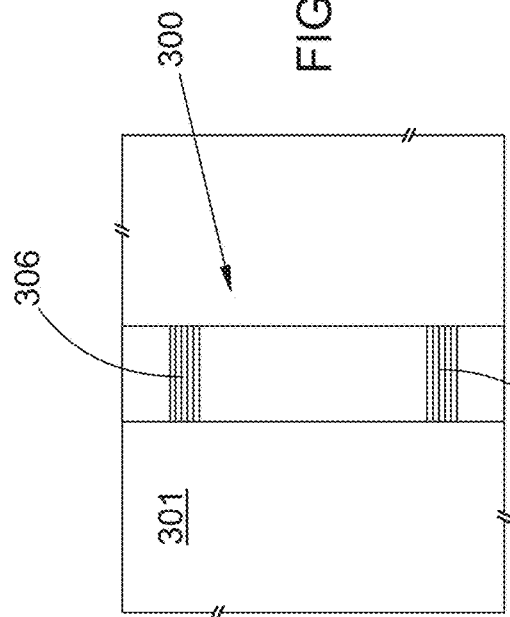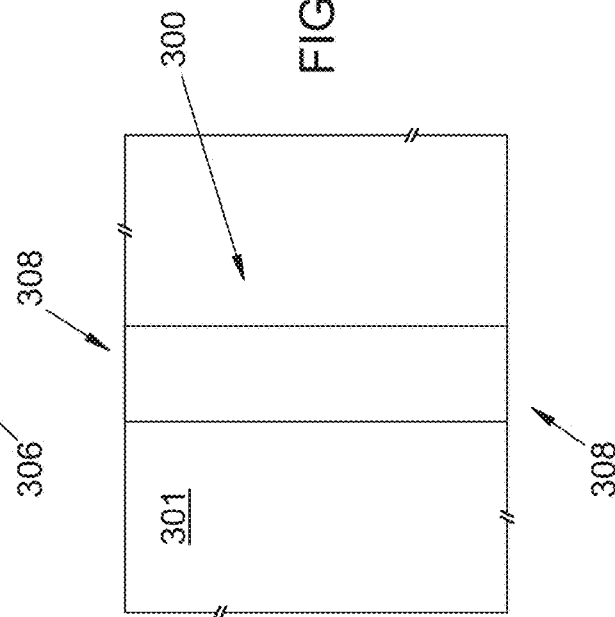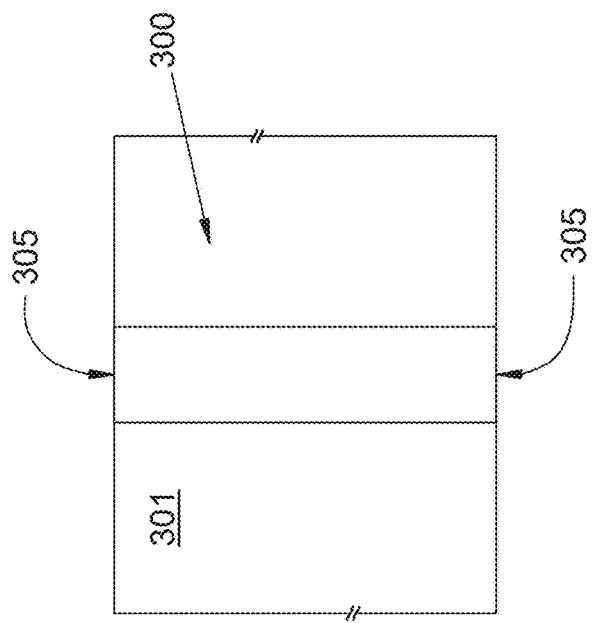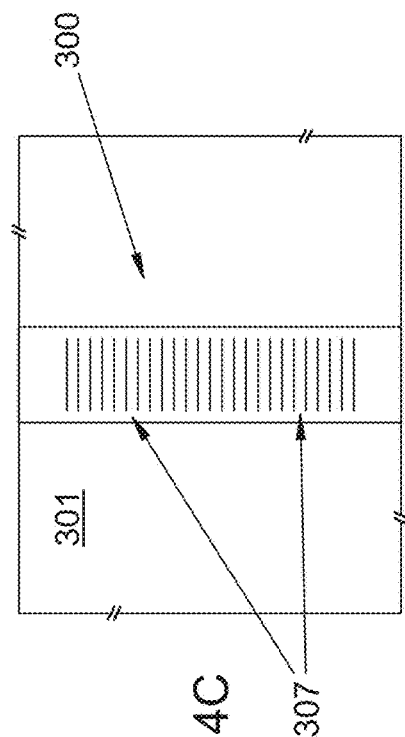

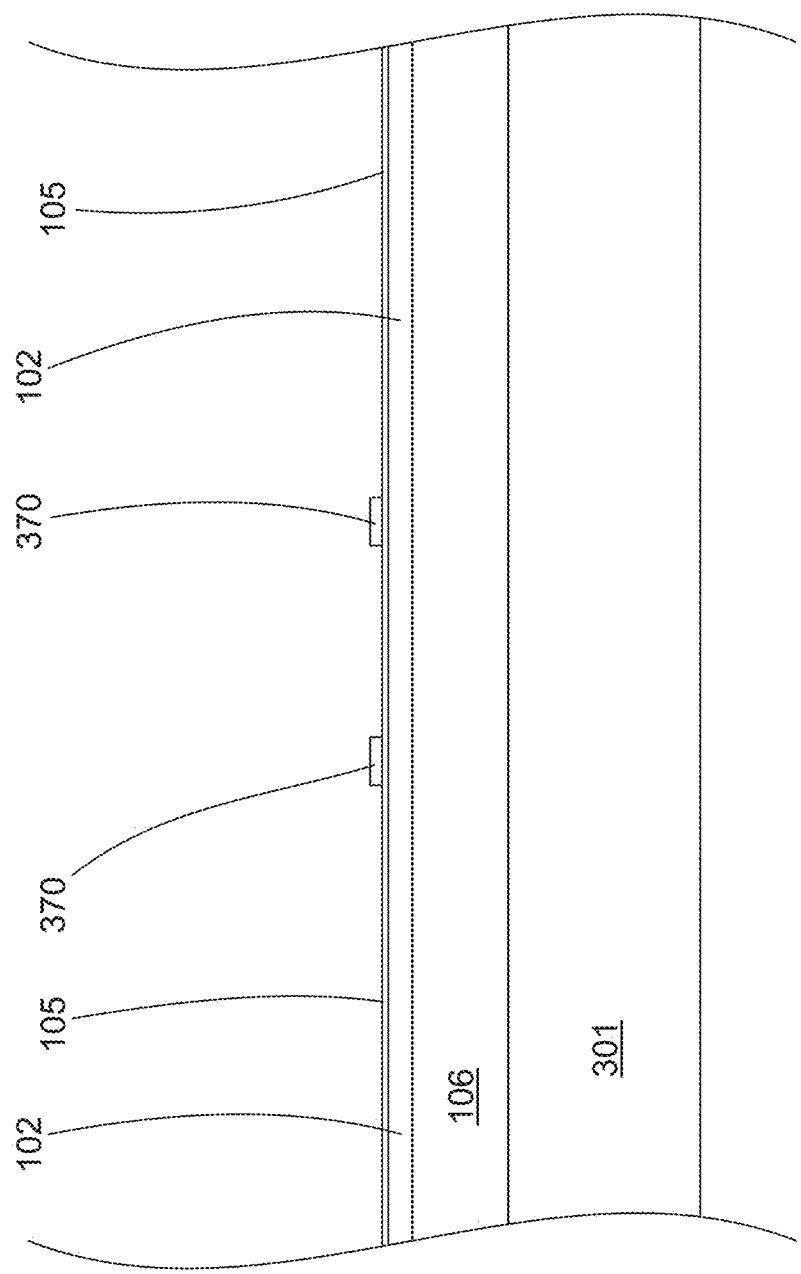

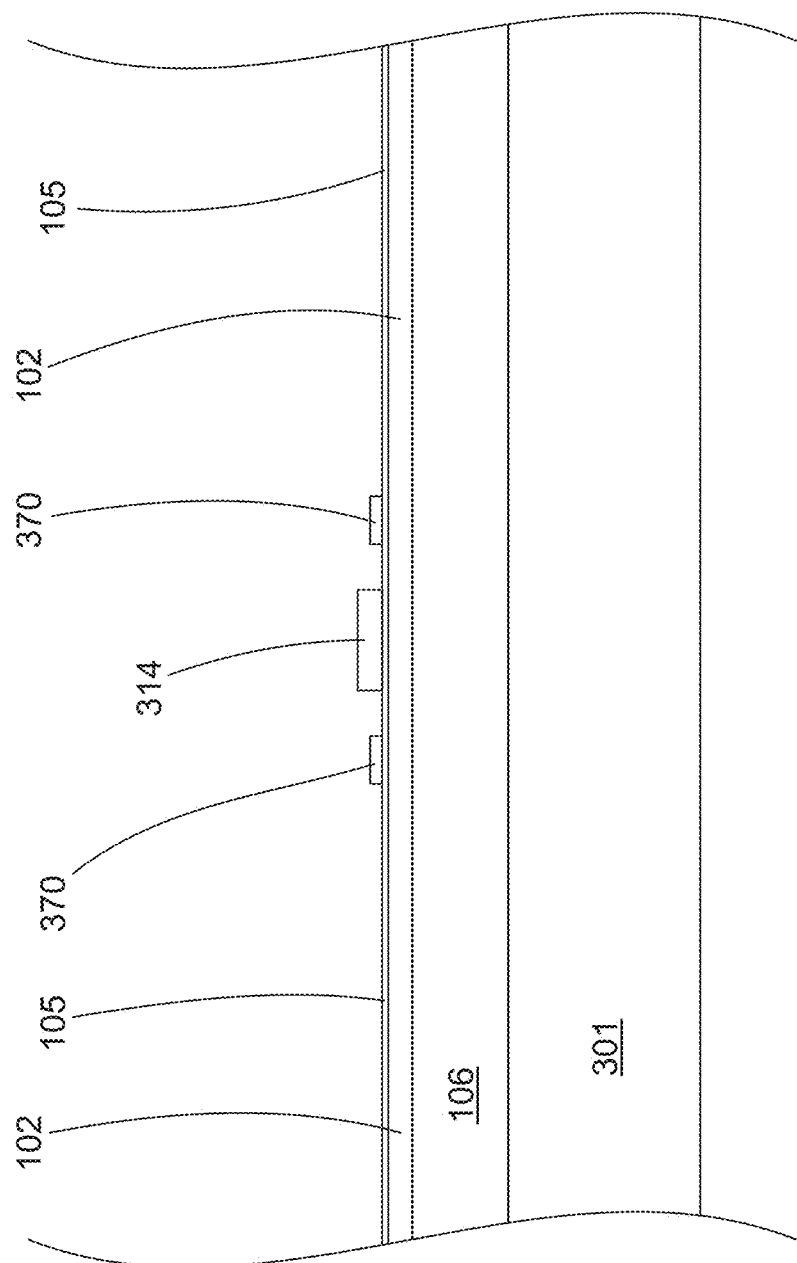

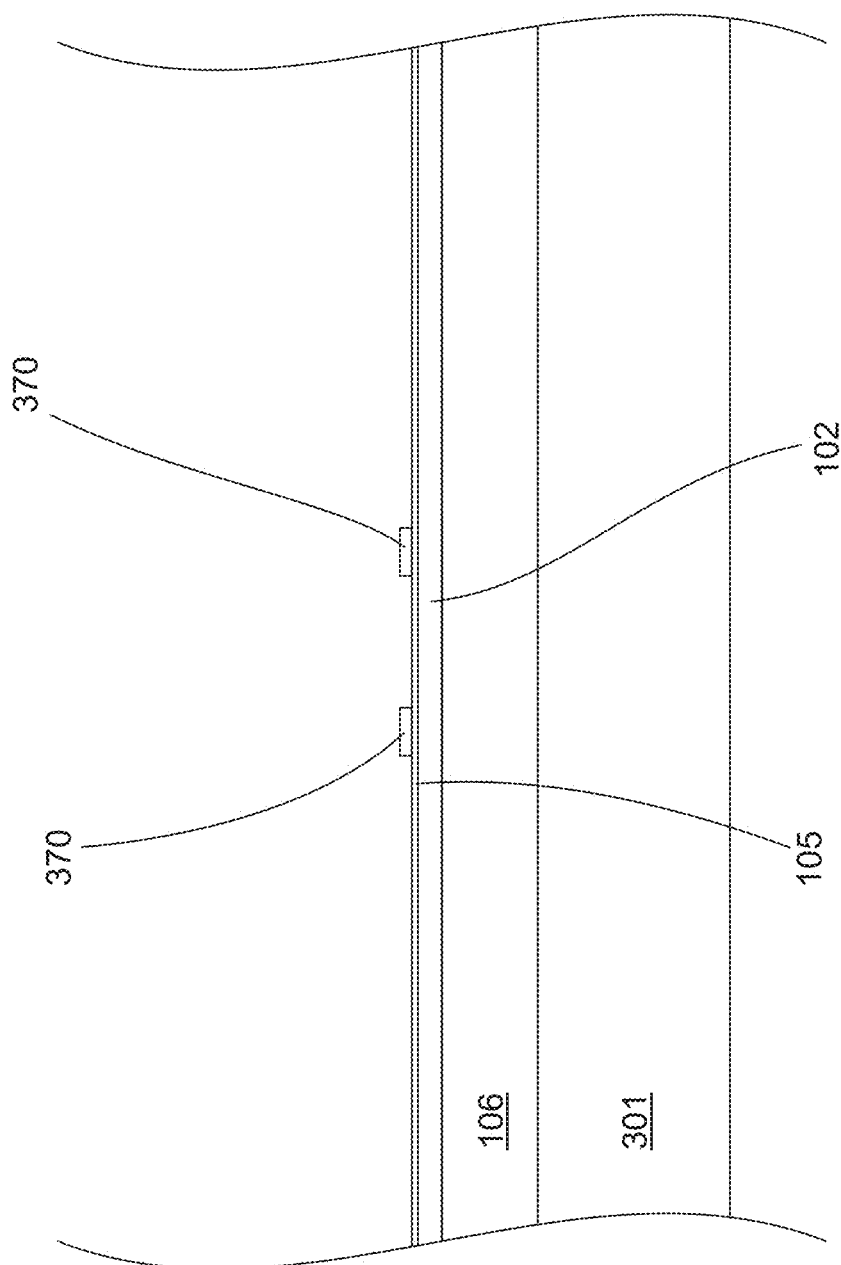

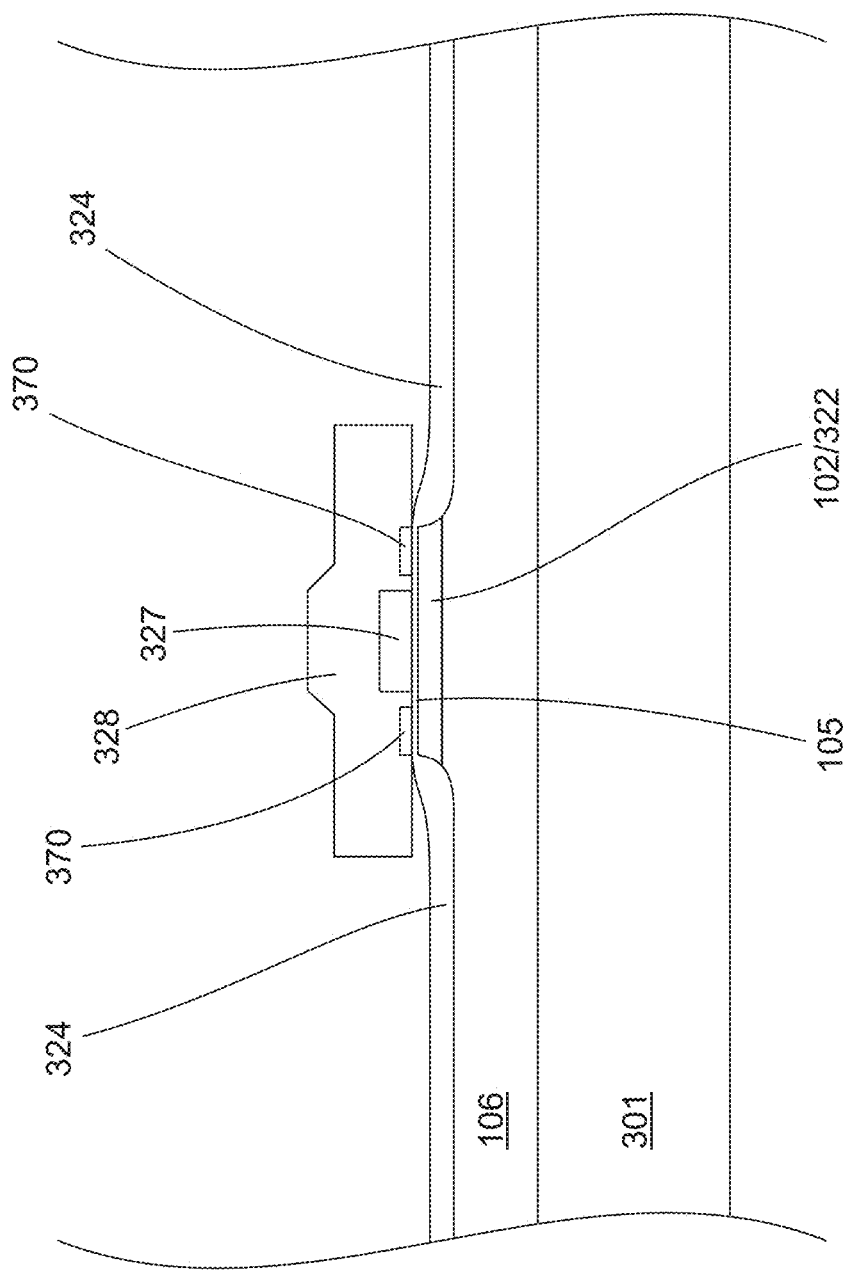

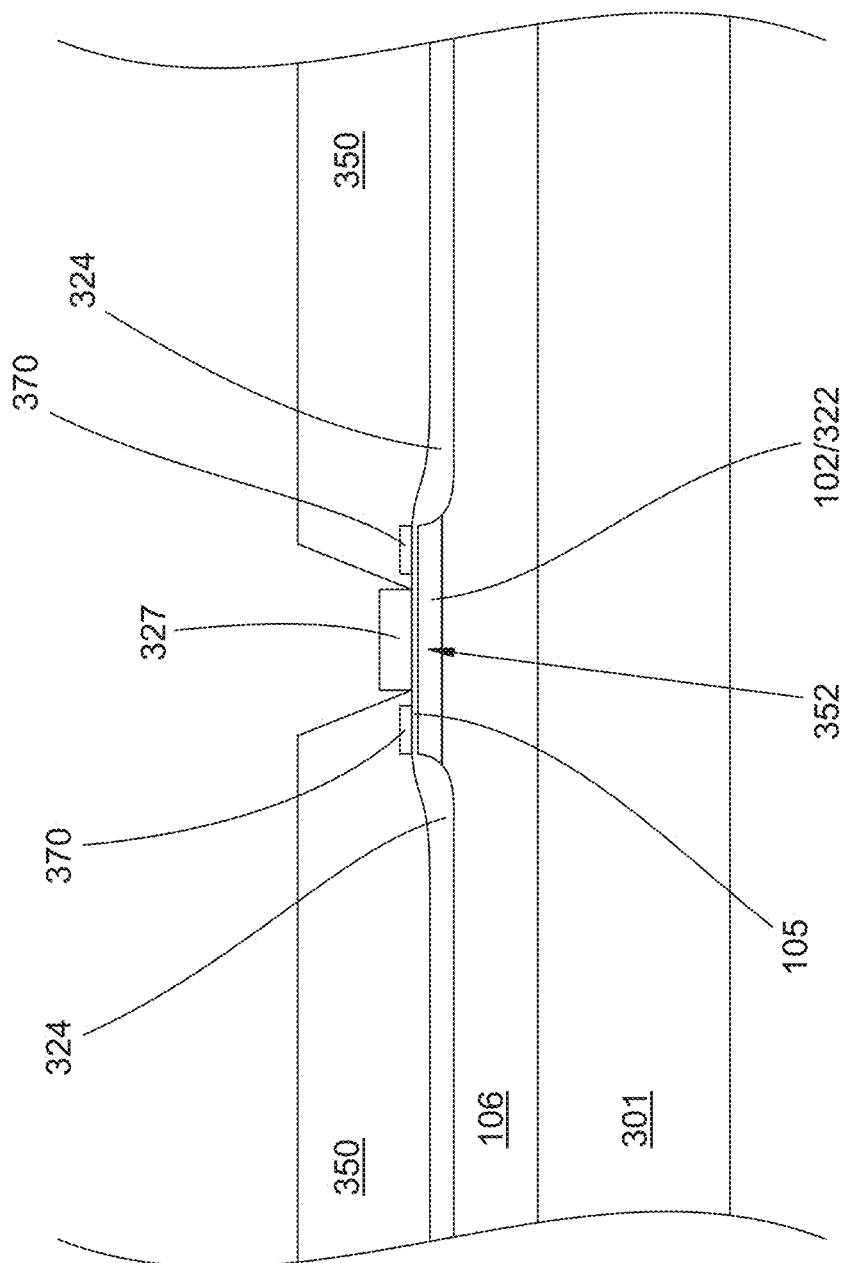

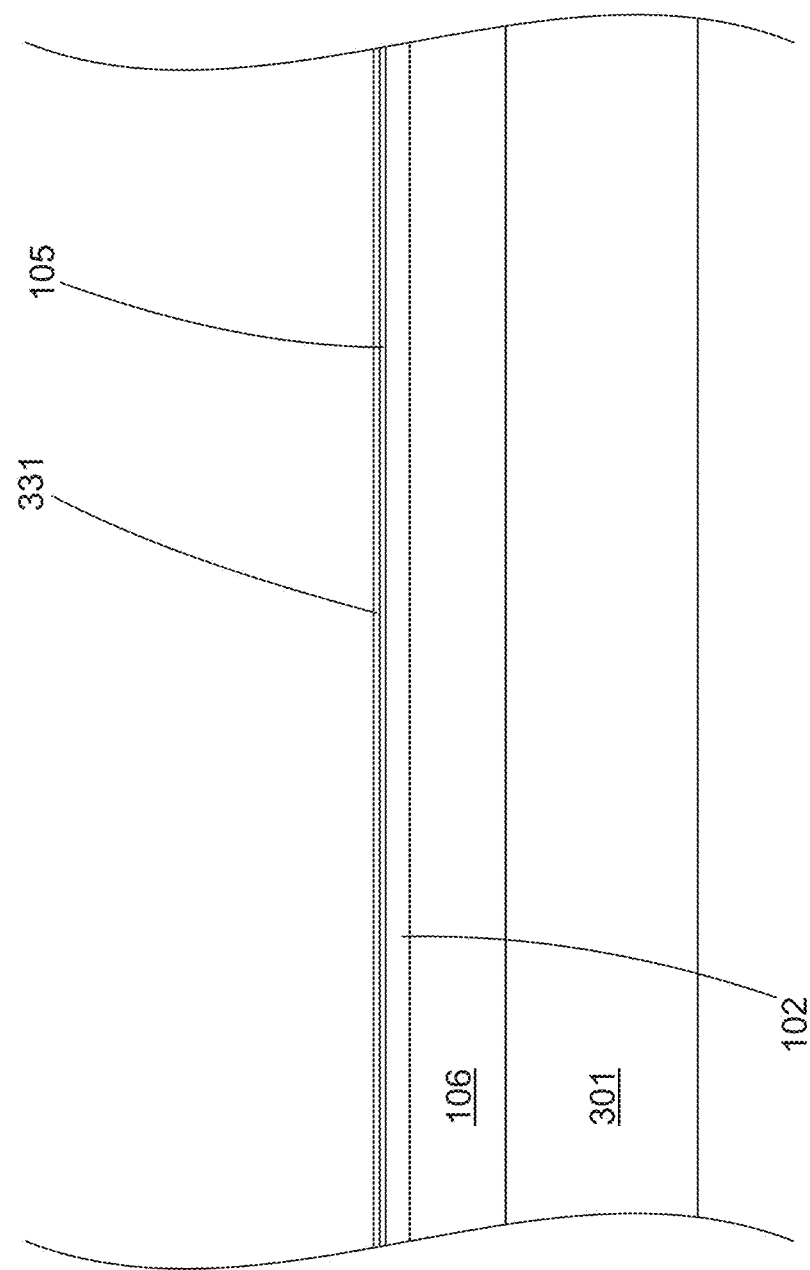

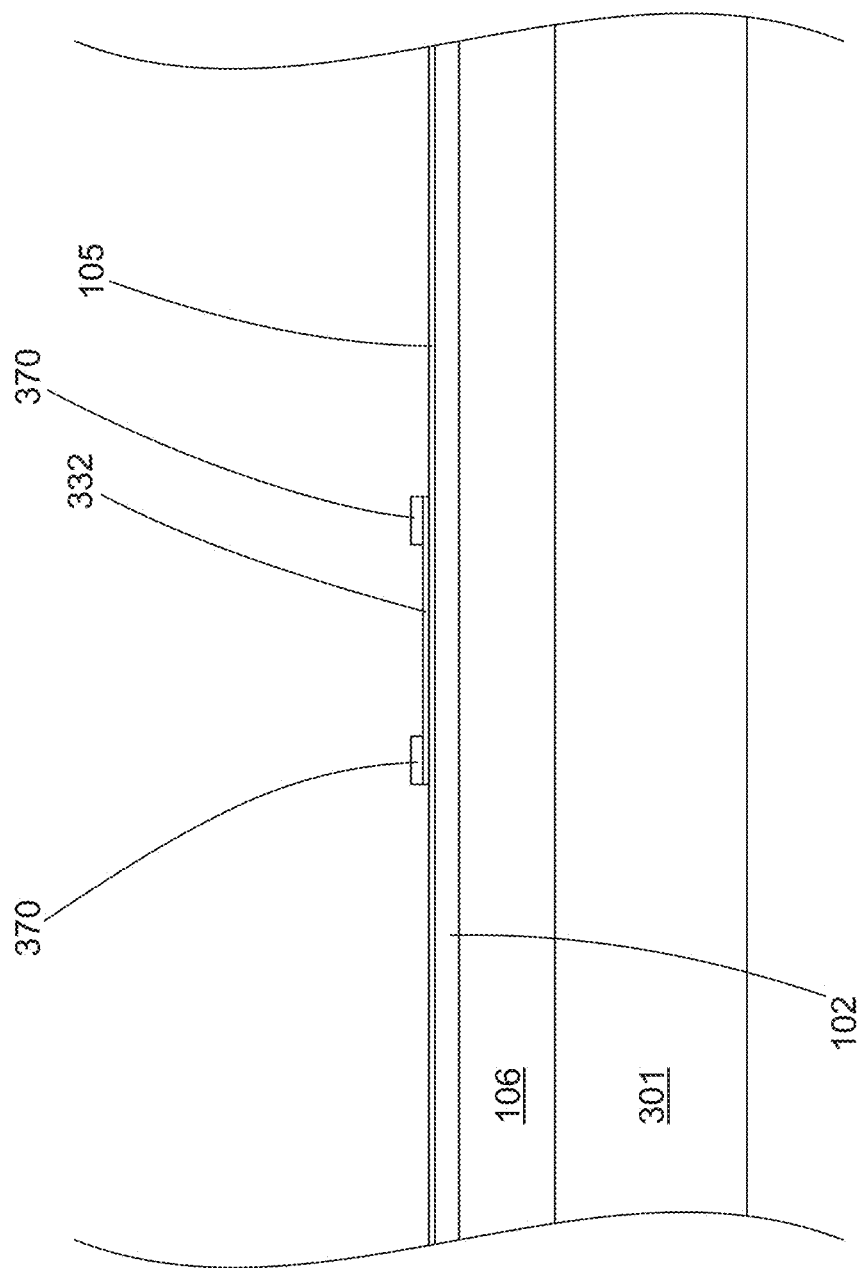

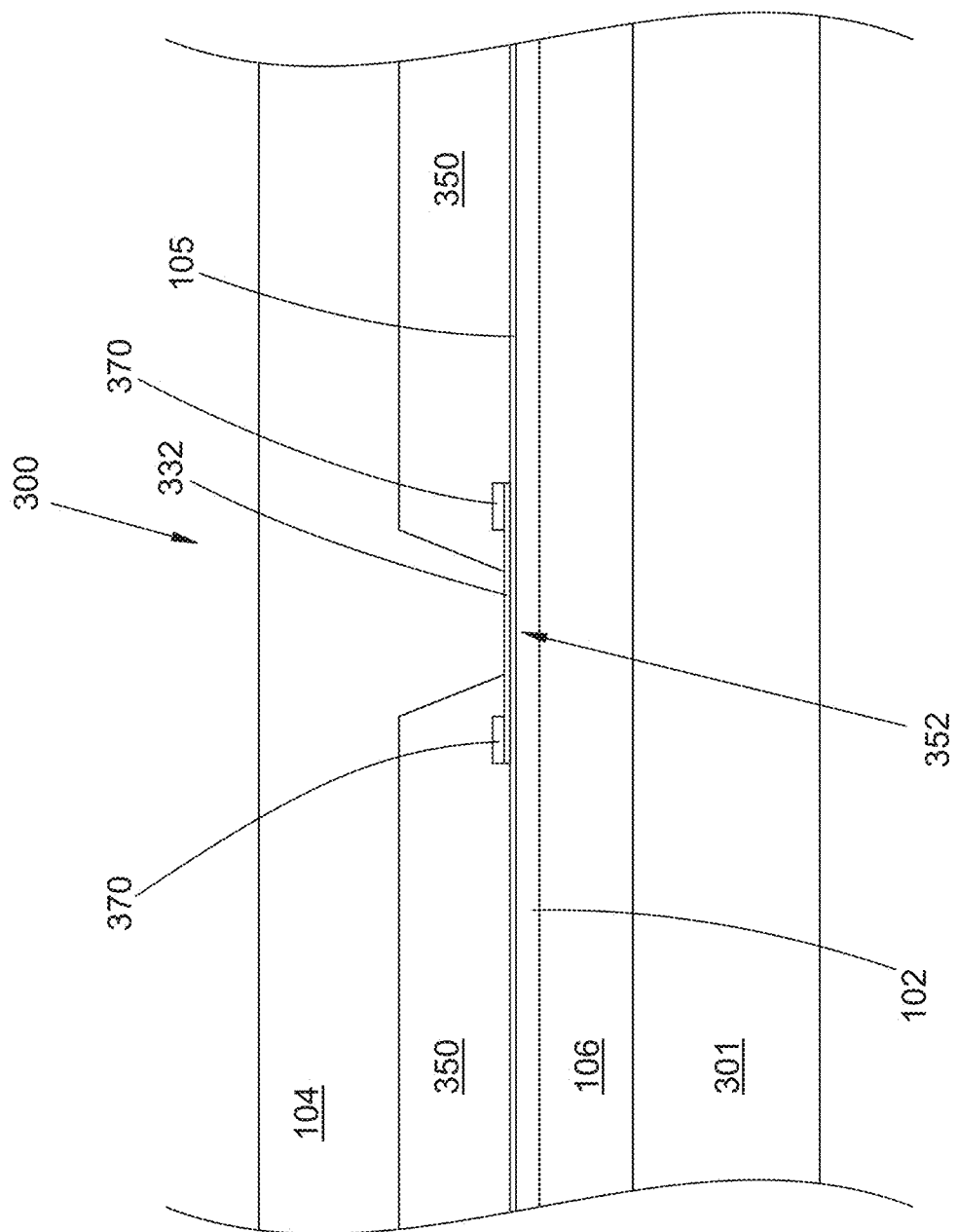

SEMICONDUCTOR WAVEGUIDE OPTICAL GAIN DEVICE WITH OPTICAL MODE SHAPING

CROSS-REFERENCE TO RELATED APPLICATIONS

This application is a divisional of U.S. non-provisional application Ser. No. 18/957,531 entitled "Semiconductor waveguide optical gain device with lateral current confinement or optical mode shaping" filed 22 Nov. 2024 in the names of Henry A. Blauvelt and Wei Hsin, said application being incorporated herein by reference in its entirety.

FIELD OF THE INVENTION

The field of the present invention relates to semiconductor waveguide optical devices. In particular, semiconductor waveguide optical gain devices (e.g., semiconductor diode lasers or semiconductor optical amplifiers) are disclosed that include lateral current confinement, optical mode shaping, or both.

BACKGROUND

Semiconductor waveguide optical gain devices typically take the form of an elongated waveguide structure on a substrate. The waveguide structure (of various suitable types or arrangements; discussed in more detail below) defines longitudinal and lateral directions parallel to the substrate and layers thereon. The waveguide structure supports one or more optical modes that propagate along the waveguide, and includes a semiconductor active region between doped semiconductor layers of opposite doping types (e.g., one n-type and the other p-type). The active layer is arranged so as to emit light and exhibit optical gain at a nominal optical wavelength $\lambda_0$ through radiative recombination of charge carriers at the active layer resulting from forward-biased drive current flowing between the top and bottom doped layers through the active layer.

Those segments of the waveguide structure where drive current flows through the active region provide optical gain for the one or more supported optical modes. The optical device can include one or more drive current structures that define a drive current path through segments of the active layer. Such drive current structures can include, e.g., metal electrodes or contacts connected to certain portions of the optical device, or insulating or otherwise non-conductive structures for excluding the drive current from certain regions of the optical device.

In some examples the waveguide structure can be arranged as a semiconductor diode laser (SDL) that includes one or more reflective structures (e.g., reflective facets or distributed Bragg reflectors) or diffractive structures (e.g., waveguide gratings) that define a laser resonator along the waveguide structure. The supported optical modes are resonant optical modes of the laser, and one or more segments of the active region where the drive current flows act as the optical gain medium for the diode laser. In some other examples the waveguide structure can be arranged to define a pair of optical ports positioned along the waveguide structure, with the drive current flowing through one or more segments of the active layer between them. In such an arrangement the optical device can function as a semiconductor optical amplifier (SOA) for optical signals propagating along the waveguide structure between the optical ports.

Two examples of conventional arrangements of semiconductor waveguide optical gain devices are illustrated schematically in the cross sections FIGS. 1 and 2. FIG. 1 illustrates a so-called ridge waveguide (RWG) structure 10; FIG. 2 illustrates a so-called buried heterostructure waveguide (BHWG) structure 20. Both of those waveguide structures can be arranged to form a diode laser or an optical amplifier, as described above.

The waveguide structures 10 and 20 each include a semiconductor active layer positioned between a top doped semiconductor layer 14 and a bottom doped semiconductor layer 16 on a substrate 11. Forward-biased laser drive current flows between the top and bottom doped layers 14 and 16 through the active layer, which in turn emits light and exhibits optical gain at a nominal laser wavelength $\lambda_0$ through radiative recombination of charge carriers at the active layer. In some examples arranged as in FIGS. 1 and 2 the bottom doped layer 16 (i.e., the doped layer of the two that is closer to the substrate 11) can be an n-doped layer and the top doped layer 14 (i.e., the doped layer of the two that is farther from the substrate 11) can be a p-doped layer. In other examples the bottom doped layer can be a p-doped layer and the top doped layer can be an n-doped layer. With respect to any examples described or shown in which the bottom doped layer is the n-doped layer 16 and the top doped layer is the p-doped layer 14, it should be understood that those examples are also intended to encompass other examples in which the bottom doped layer is a p-doped layer and the top doped layer is an n-doped layer (referred to for convenience as being "doping-inverted"). Any other doped semiconductor layer of the examples shown that is described as having particular doping type (p-type or n-type) would have the opposite doping type in such "doping-inverted" examples.

In the RWG structure 10 the active layer 12 guides the supported optical modes in the vertical dimension and a protruding ridge 18 of doped semiconductor material guides those modes in the lateral dimension; the active layer 12 and the protruding ridge 18 act together as the optical waveguide structure. In many examples the protruding ridge 18 is formed from material of the top doped layer 14 (e.g., a p-doped material); in other examples the ridge can be formed from a different semiconductor material. The drive current 99 flows through the top of the ridge 18 (typically through an electrically conductive electrode or contact; not shown), through the top doped layer 14, through the active layer 12, and through the bottom doped layer 16 (e.g., an n-doped layer). The height, width, and refractive index of the ridge 18 (relative to refractive indices of the top doped layer 14, the active layer 12, and the bottom doped layer 16) determine the two-dimensional transverse profiles of the supported optical modes, and the corresponding one-dimensional optical intensity lateral profile of those modes across the active layer 12. The width of the ridge 18 also determines the one-dimensional drive current lateral profile across the active layer 12.

In the BHWG structure 20 the active layer is limited to an elongated strip 22 between adjacent current blocking layers 24. The strip 22 of the active layer acts as a higher-index core of the BHWG structure 20, with the top doped layer 14, the bottom doped layer 16, and the current-blocking layers 24 acting as lower-index cladding. The drive current 99 flows between the top and bottom doped layers 14 and 16 only through the strip 22 of the active layer; suitably doped layers 26 are arranged to prevent current flow elsewhere. The height, width, and refractive index of the strip 22 of the active layer (relative to refractive indices of the top and bottom doped layers 14 and 16) determine the transverse profiles of the supported optical modes, and the corresponding optical intensity lateral profile of those modes across the active layer. The width of the strip 22 also determines the drive current lateral profile across the active layer.

To increase overall output power of a SDL, or overall amplification of a SOA, it is typically desirable to increase the width of the optical waveguide structure (e.g., the width of the ridge 18 or the strip 22), so that total current can be increased while maintaining current density within acceptable or desirable limits. In both the conventional RWG structure 10 and the conventional BHWG structure 20, it has been observed that as the width of the waveguide structure is increased, the ratio of the optical mode width to the width of the transverse current density distribution decreases with increasing width of the optical device (e.g., as in FIGS. 3A and 3B). The resulting mismatch between lateral profiles across the active layer of the optical intensity and the drive current can degrade the efficiency of the SDL or SOA (i.e., decrease the fraction of charge carriers of the drive current that are converted to photons of output light). In the case of an SDL, such a mismatch also can result in excessive optical gain at lateral portions of the waveguide structure (not depleted or saturated by laser oscillation in the desired resonant optical mode) that can in turn enable laser oscillation in other, unwanted resonant optical modes; such multimode operation can degrade the spatial or frequency characteristics of the output light.

SUMMARY

An inventive optical device includes a substrate, a bottom doped semiconductor layer on the substrate, a top doped semiconductor layer on the bottom doped layer, and a semiconductor active layer between the top and bottom doped layers. The bottom doped layer is between the substrate and the top doped layer, and the top and bottom doped layers are of opposite n- or p-doping types. The active layer emits light and exhibits optical gain at a nominal optical wavelength $\lambda_0$ through radiative recombination of charge carriers at the active layer resulting from forward-biased drive current flowing between the top and bottom doped layers through the active layer. An optical waveguide structure includes an optical gain section and defines lateral and longitudinal directions parallel to the top and bottom doped layers, and supports one or more optical modes that spatially overlap portions of the bottom doped, top doped, and active layers in the optical gain section. One or more drive current structures define a drive current path along which the drive current flows through the active layer in the optical gain section.

The optical waveguide structure, the one or more drive current structures, or both, are positioned and arranged to result in a selected degree of spatial overlap (or in some examples maximal overlap) between (i) a drive current lateral profile across the active layer in the optical gain section and (ii) a corresponding optical intensity lateral profile across the active layer in the optical gain section of a selected one of the one or more optical modes. In some instances, the selected or maximal degree of spatial overlap can enable operation of wider devices at larger total drive current and higher overall optical power while maintaining a desired level of efficiency or suppressing output in unwanted optical modes.

The optical waveguide structure includes a pair of longitudinal, laterally spaced-apart strips of higher-index semiconductor material (higher than the top and bottom doped layers) positioned along the optical waveguide structure. Arrangement of the spaced-apart strips results in the corresponding optical intensity lateral profile across the active layer that has a higher fraction of optical intensity within its full width at half maximum intensity (FWHM) compared to a corresponding mode of an otherwise identical reference optical waveguide structure that lacks the spaced-apart strips. In other words, the spaced-apart strips somewhat flatten the optical intensity lateral profile.

In some examples the optical device can be arranged as a semiconductor laser diode (SDL). In some other examples the optical device can be arranged as a semiconductor optical amplifier (SOA).

The optical waveguide structure is arranged as a planar-buried-rib waveguide (PBRWG) structure that includes a longitudinal strip of higher-index semiconductor material (higher than the top and bottom doped layers) on the active layer. The drive current structures include lateral current-blocking layers that define a portion of the drive current path.

Objects and advantages pertaining to semiconductor diode lasers may become apparent upon referring to the example embodiments illustrated in the drawings and disclosed in the following written description or appended claims.

This Summary is provided to introduce a selection of concepts in a simplified form that are further described below in the Detailed Description. This Summary is not intended to identify key features or essential features of the claimed subject matter, nor is it intended to be used as an aid in determining the scope of the claimed subject matter.

BRIEF DESCRIPTION OF THE DRAWINGS

FIGS. 4A, 4B, and 4C are schematic plan view of examples of semiconductor diode lasers (SDLs) including reflective facets (FIG. 4A), distributed Bragg reflectors (FIG. 4B), or a waveguide grating (FIG. 4C). FIG. 4D is a schematic plan view of an example of a semiconductor optical amplifier (SOA).

FIGS. 9A through 9F illustrate schematically a process sequence for making the example devices of FIGS. 5A-5C.

FIGS. 10A through 10H illustrate schematically a process sequence for making the example devices of FIGS. 6A-6C.

FIGS. 12A through 12G illustrate schematically a process sequence for making the example devices of FIGS. 8A-8C.

Figure 1:
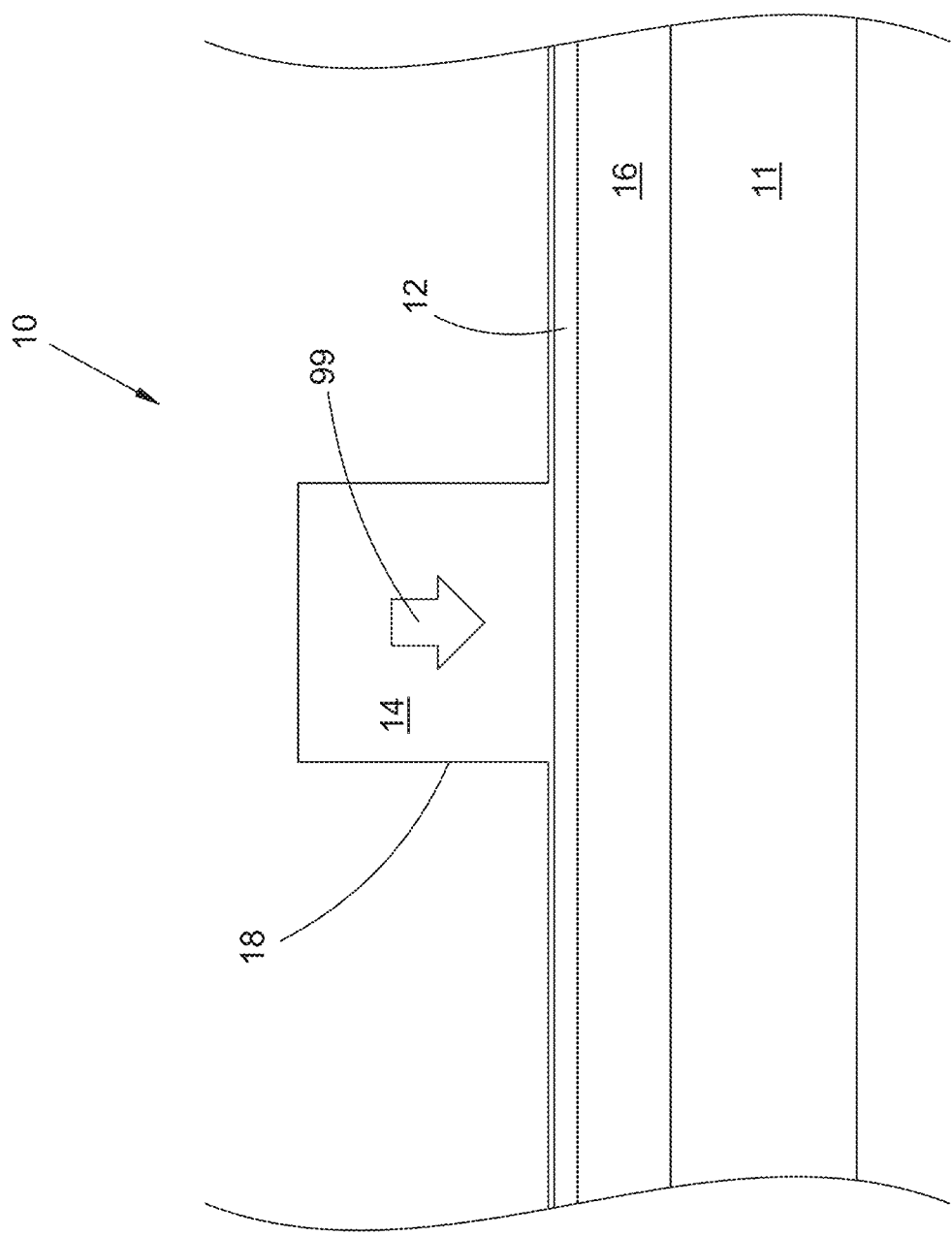
FIG. 1 is a schematic transverse cross-sectional view of a conventional waveguide structure arranged as a ridge waveguide (RWG) structure.

The embodiments depicted are shown only schematically; all features may not be shown in full detail or in proper proportion; for clarity certain features or structures may be exaggerated or diminished relative to others or omitted entirely; the drawings should not be regarded as being to scale unless explicitly indicated as being to scale. In the drawings, some schematic illustrations of example structures of various devices and assemblies described herein may be shown with precise right angles and straight lines, but it is to be understood that such schematic illustrations may not reflect real-life process limitations or defects. Such process limitations or defects can cause the features to look not so "ideal" when any of the structures described herein are examined using, e.g., scanning electron microscopy (SEM) images or transmission electron microscope (TEM) images. In such images of real structures, possible processing limitations or defects might be visible, e.g., not-perfectly straight edges of materials, tapered vias or other openings, inadvertent rounding of corners or variations in thicknesses of different material layers. There may be other limitations or defects not listed here that can occur within the field of device fabrication. The embodiments shown are only examples and should not be construed as limiting the scope of the present disclosure or appended claims.

DETAILED DESCRIPTION

The following detailed description should be read with reference to the drawings, in which identical reference numbers refer to like elements throughout the different figures. The drawings, which are not necessarily to scale, depict selective examples and are not intended to limit the scope of the inventive subject matter. The detailed description illustrates by way of example, not by way of limitation, the principles of the inventive subject matter.

For purposes of the present disclosure and appended claims, any arrangement of a layer, surface, substrate, diode structure, or other structure "on," "over," or "against" another such structure shall encompass arrangements with direct contact between the two structures as well as arrangements including some intervening structure between them. Conversely, any arrangement of a layer, surface, substrate, diode structure, or other structure "directly on," "directly over," or "directly against" another such structure shall encompass only arrangements with direct contact between the two structures. For purposes of the present disclosure and appended claims, a layer, coating, structure, or material described as "transparent" or "substantially transparent" shall exhibit, over one or more pertinent wavelength ranges, a level of optical transmission that is sufficiently high, or a level of optical loss (due to absorption, scattering, reflection, or other loss mechanism) that is sufficiently low, that the optical device can function within operationally acceptable parameters (e.g., output power, amplification factor, efficiency, or other figures-of-merit including any described below). Similarly, a layer, coating, structure, or material described as "reflective" shall exhibit reflectivity that is sufficiently high, over one or more pertinent wavelength ranges, that the optical device can function within operationally acceptable parameters such as those listed above or described below.

In some examples described below and shown in the drawings, the bottom doped layer may be an n-doped layer and the top doped layer may be a p-doped layer. Some of those examples may include additional n- or p-doped layers. However, the present disclosure and appended claims shall be construed not only as encompassing explicitly those examples described and shown, but also as encompassing implicitly other, "doping-inverted" examples (not shown) in which the bottom doped layer is a p-doped layer and the top doped layer is an n-doped layer. Any additional doped semiconductor layer in such "doping-inverted" examples would have the opposite doping type (p-type or n-type), compared to the analogous additional layers in the examples shown or described.

Figure 2:
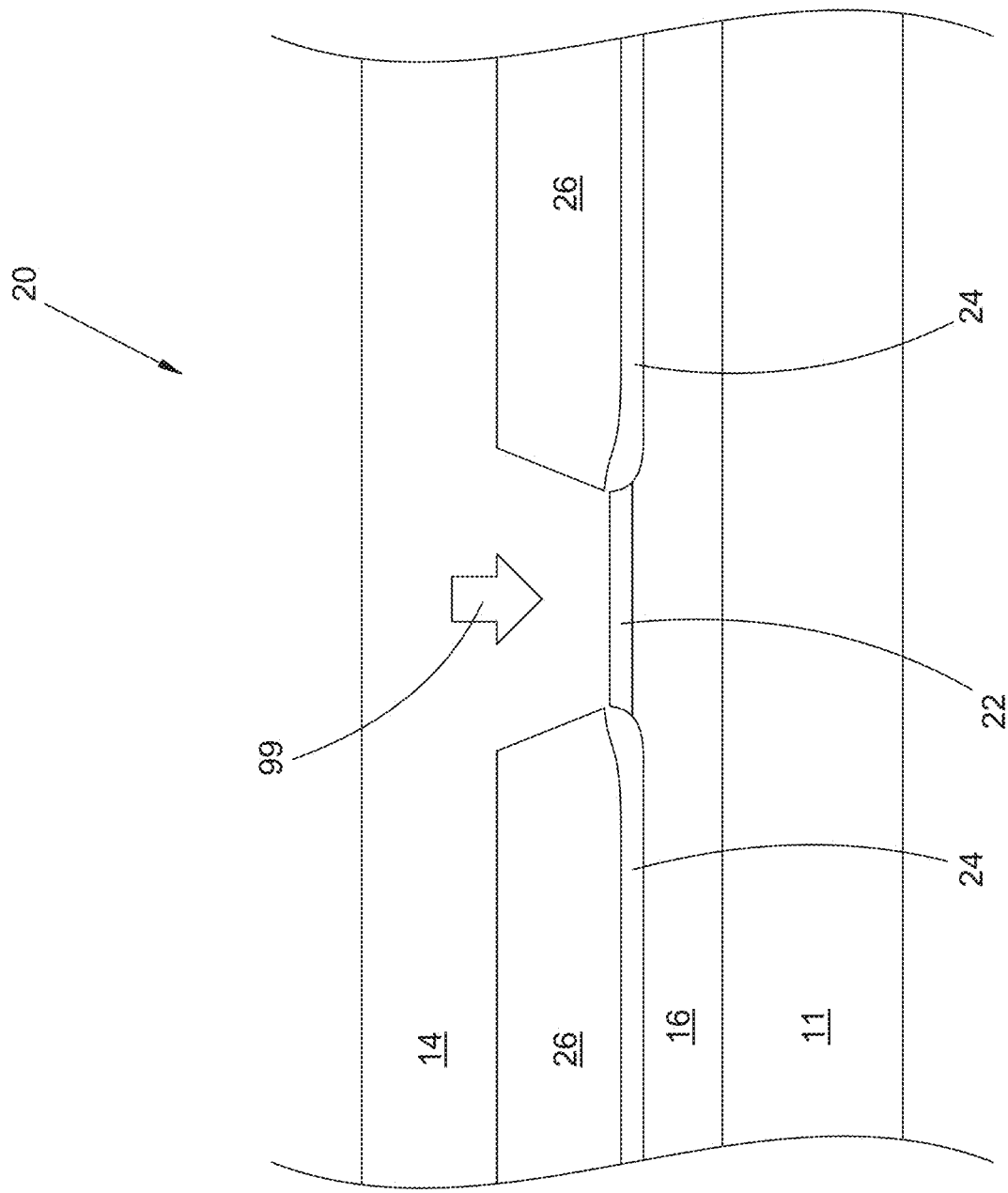
FIG. 2 is a schematic transverse cross-sectional view of a conventional waveguide structure arranged as a buried heterostructure waveguide (BHWG) structure.
Figure 3B:
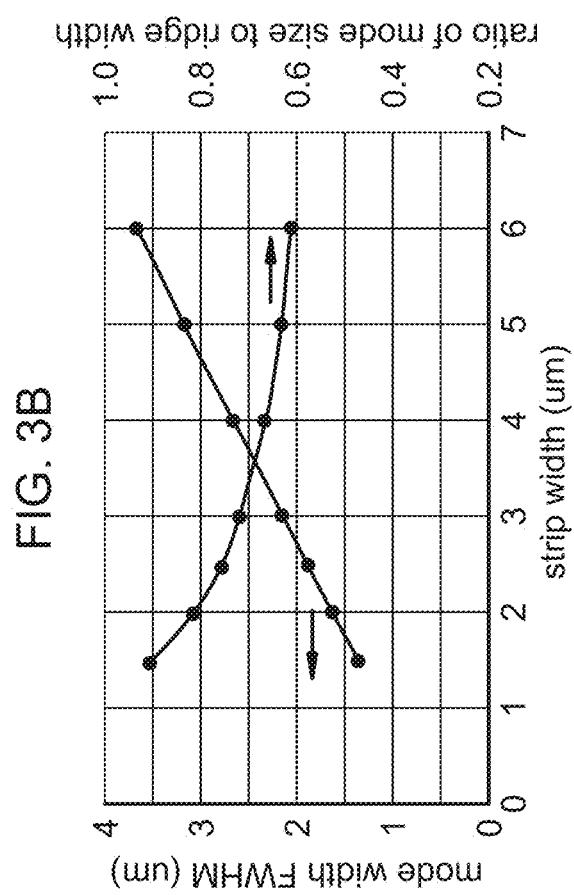
FIGS. 3A and 3B are plots of calculated mode width and mode-to-waveguide width ratio versus waveguide width for example waveguide structures of the types shown in FIGS. 1 and 2, respectively.
Figure 3A:
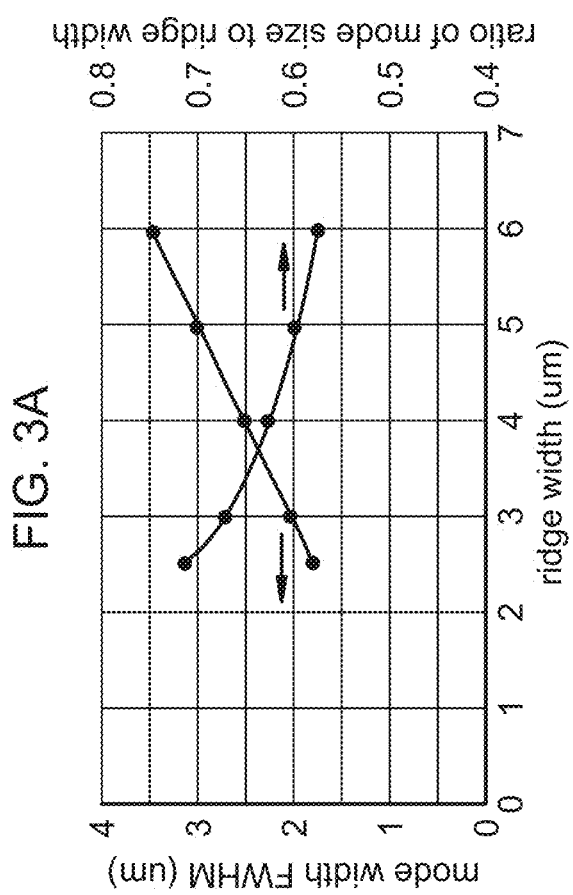

As discussed above, in the conventional waveguide arrangements of FIGS. 1 and 2, the same structure (e.g., the ridge 18 or the active layer strip 22) determines both widths of the supported resonant optical modes and also the transverse distribution of drive current (and hence optical gain) across the active layer. To produce devices that operate at larger total drive current to produce higher overall optical output power, it is generally necessary to increase the width of the optical device to keep the current density within acceptable or desirable limits. However, the transverse mode width and the width of the current distribution do not increase at the same rate with respect to width of the waveguide structure, leading to significant mismatch at larger widths of the waveguide structure. Typically, the ratio of the optical mode width to the width of the current density distribution decreases with increasing width of the optical device (e.g., as in FIGS. 3A and 3B). The resulting mismatch can result in reduced efficiency of the optical device, unwanted multimode laser oscillation, or other degradation of performance of the diode laser or optical amplifier.

Accordingly, it would be desirable to provide a semiconductor waveguide optical gain device (e.g., a SDL or a SOA) in which the transverse optical mode size (or more specifically, the optical intensity lateral profile across the active layer) and the drive current distribution lateral profile across the active layer can be varied at least partly independently of one another, to enable a selected degree (or maximal degree) of spatial overlap between those lateral profiles. That in turn can enable devices of greater overall width to be operated with larger total drive current and higher optical output power, e.g., while maintaining a desired level of efficiency or avoiding multimode optical output.

Several examples of SDL arrangements are illustrated schematically in the general plan views of FIGS. 4A through 4C; a SOA arrangement is illustrated schematically in the plan view of FIG. 4D. Transverse cross-sectional views of the optical gain sections of various inventive examples (representative of both SDLs and SOAs) are shown in FIGS. 5A-5C, 6A-6C, 7A-7C, and 8A-8C. The plan views of FIGS. 4A through 4D illustrate schematically an elongated optical waveguide structure 300 in or on a substrate 301. In many examples the optical device includes one or more III-V semiconductor materials, or one or more compounds, mixtures, or alloys thereof, with various levels of one or more various dopants in different layers or structures of the optical device. At or near a first surface of the substrate 301 are the bottom doped semiconductor layer 106, the top doped semiconductor layer 104, and the active layer 102 between them in the optical gain section of the waveguide structure 300; in many examples the top doped layer 104 is at the first substrate surface, or at least the nearest of those three layers to the first substrate surface. The substrate 301 also can include one or more additional layers for providing mechanical support or electrical conductivity. The optical gain section of the waveguide structure 300 can be arranged in various suitable ways: as a ridge waveguide (RWG) structure as in FIGS. 5A-5C; as a buried heterostructure waveguide (BHWG) structure as in FIGS. 6A-6C and 7A-7C (i.e., an active strip waveguide); as a planar buried rib waveguide (PBRWG) structure as in FIGS. 8A-8C (i.e., a passive strip waveguide), or as combinations of those arrangements (e.g., a passive strip plus ridge, and so forth).

The waveguide structure 300 defines a lateral direction (i.e., transverse, or across the waveguide) and a longitudinal direction (i.e., along the waveguide) along the first substrate surface. If arranged as a SDL, the waveguide structure 300 can include one or more reflective or diffractive structures that define a laser resonator. In some examples those reflective or diffractive structures can be in sections of the waveguide structure 300 separate from the gain section; in other examples the reflective or diffractive structures can overlap the gain sections within the waveguide structure 300. In the example of FIG. 4A reflective end facets 305 of the waveguide structure 300 define the laser resonator; in the example of FIG. 4B a pair of distributed Bragg reflectors (DBRs) 306 formed on or in the waveguide structure 300 define the laser resonator; in the example of FIG. 4C a waveguide grating 307 formed on or in the waveguide structure 200 forms a portion of a distributed feedback (DFB) laser. Other arrangements of reflective or diffractive elements can be employed for defining the laser resonator, including combinations of those elements described above (e.g., one reflective facet in combination with a waveguide grating, and so forth). If arranged as a SOA, the waveguide structure 300 can be arranged in any suitable way (e.g., by butt coupling or evanescent lateral coupling, to another waveguide, an optical fiber, or a fiber taper) to define a pair of optical ports 308. In all of these examples the waveguide structure 300 supports one or more optical modes that, in the optical gain section, spatially overlap portions of the top, bottom, and active layers 104/106/102.

Turning to the cross-sectional views of FIGS. 5A through 8C, each of those diode laser examples includes (as discussed above) a bottom doped semiconductor layer 106 (e.g., an n-doped layer), a top doped semiconductor layer 104 (e.g., a p-doped layer), and a semiconductor active layer 102 between them. The active layer 102 is arranged so as to emit light and exhibit optical gain at a nominal laser wavelength $\lambda_0$ through radiative recombination of charge carriers at the active layer 102. During operation of the optical device, that radiative recombination results from forward-biased laser drive current 99 flowing between the top doped layer 104 and the bottom doped layer 106 through the active layer 102. The active layer 102 can be arranged in any suitable way; in some examples the active layer 102 can include one or more quantum wells, one or more multi-quantum wells, or a multitude of quantum dots. The materials and arrangement of the bottom doped layer 106, the active layer 102, and the top doped layer 104 determine the laser wavelength $\lambda_0$, along with any wavelength-selective element present in the device (e.g., the DBRs 306 or the waveguide grating 307). In some examples the optical device can operate to produce or amplify light at the wavelength $\lambda_0$ in visible or infrared portions of the electromagnetic spectrum, e.g., between 400 nm and 2500 nm. Common wavelengths used in telecommunications are, e.g., between 600 nm and 900 nm or between 1200 nm and 1700 nm. The optical device can be arranged to produce or amplify any suitable or desirable wavelength.

Each device also includes one or more drive current structures that define a drive current path through the active layer 102. Such drive current structures can include, e.g., conductive contact(s) or electrode(s), conductive semiconductor layer(s) or portions thereof, or semiconductor layer(s) that are non-conductive, semi-insulating, or form reverse-biased junction(s) under operating conditions in which forward-biased drive current flows through the active layer 102. In each of the examples of FIGS. 5A, 5C, 6A, 6C, 7A, 7C, 8A, and 8C, the one or more drive current structures of the optical device include one or more current restrictors 350 arranged to form a gap 352. In some examples the gap 352 can be the space between two or more distinct current restrictors 350; in some examples the gap 352 can be one or more slots, grooves, or holes through a current-restricting layer of material. The gap 352 is positioned along the optical waveguide structure and is filled with doped semiconductor material (e.g., material of the top doped layer 104, or a different doped semiconductor material). The one or more current restrictors 350 are arranged to constrain the drive current 99 to flow through the gap 352. The width of the gap 352 is less than width of the optical waveguide structure 300, e.g., less than the width of the ridge 312 in FIG. 5A or 5C, less than the width of the strip 322 of the active layer 102 in FIG. 6A, 6C, 7A, or 7C, or less than the width of the strip 332 of a higher-index material in FIG. 8A or 8C.

The differing widths of the gap 352 and the waveguide structure 300 enable the optical device to be designed with control of the drive current lateral profile across the active layer 102 (or at least its width) that is at least somewhat independent of the optical intensity lateral profile across the active layer 102 of optical modes supported by the waveguide structure. That independent control can enable those two profiles to be suitably matched to or overlapped with one another, so that the desired transverse mode can more efficiently extract the optical gain arising from the laser drive current. Note that "matching" here does not necessarily mean that the two widths or profiles are the same, but rather implies that the two profiles result in overlap of the transverse mode and the current distribution that yields increased or maximized extraction by the transverse mode of optical gain generated by the drive current. Such matching can result in more laser output power or amplification for a given level of laser drive current (e.g., higher conversion efficiency), particularly at larger widths of the waveguide structure 300 employed to accommodate higher laser drive current to produce higher output power.

In addition to generally lower efficiency, significant mismatch between the transverse mode width and the (usually larger) current distribution width leaves optical gain unused at lateral portions of the waveguide structure, which in some instances can support unwanted laser oscillation or light amplification in one or more other, unwanted transverse optical modes, e.g., higher-order transverse modes. The different spatial behaviors of those unwanted transverse modes would degrade the ability to spatially mode-match the diode laser output, e.g., to another waveguide or to an optical fiber, increasing coupling losses. Laser oscillation in additional modes typically causes severe degradation of the frequency behaviors of a diode laser; the unwanted transverse mode(s) would exhibit frequency behaviors different from those of the desired transverse mode. The different frequency behaviors would degrade or even destroy the ability to use the diode laser, e.g., in a wavelength-division multiplexing (WDM) scheme. The width of the gap 352 between the current restrictors 352 can be selected to reduce, minimize, or eliminate the tendency of an SDL device to oscillate in undesired higher-order transverse modes.

It should be noted that the presence of the current restrictors 350 in or near the optical waveguide structure 300 can affect the transverse mode structure of the waveguide structure in some instances. The materials employed for the current restrictors 350 (discussed further below) differ from surrounding materials, and so typically would differ with respect to refractive index as well, affecting the transverse modes supported by the waveguide structure 300. The active layer 102 typically has a refractive index significantly higher than other materials present, and in all examples shown acts as a waveguide core that is the primary constraint on the vertical transverse mode size and profile. In some examples (e.g., FIG. 5A, 5C, 6A, 6C, 7A, or 7C), the presence of the current restrictors 350 might have little or only negligible effect on the lateral transverse mode size and profile supported by the ridge waveguide 312 (as in FIG. 5A or 5C) or the strip 322 of the active layer 102 (as in FIG. 6A, 6C, 7A, or 7C). In such examples the design of the waveguide 300 to achieve a desired transverse mode width can be nearly independent of the design of the current restrictors 350 and the gap 352 to provide a matching laser current distribution width. In some other examples (e.g., FIG. 8A or 8C), the presence of the current restrictors 350 might have a greater effect on the lateral transverse mode sizes and profiles supported by the strip 332 of higher-index material, because typically the corresponding refractive indices are closer to one another than to the index of, e.g., the active layer 102. In such examples, an iterative or concurrently optimized design process can be employed for arriving at a combination of width of the strip 332 and width of the gap 352 that achieves the desired combination of the optical intensity lateral profile and the drive current lateral profile.

Figure 13:
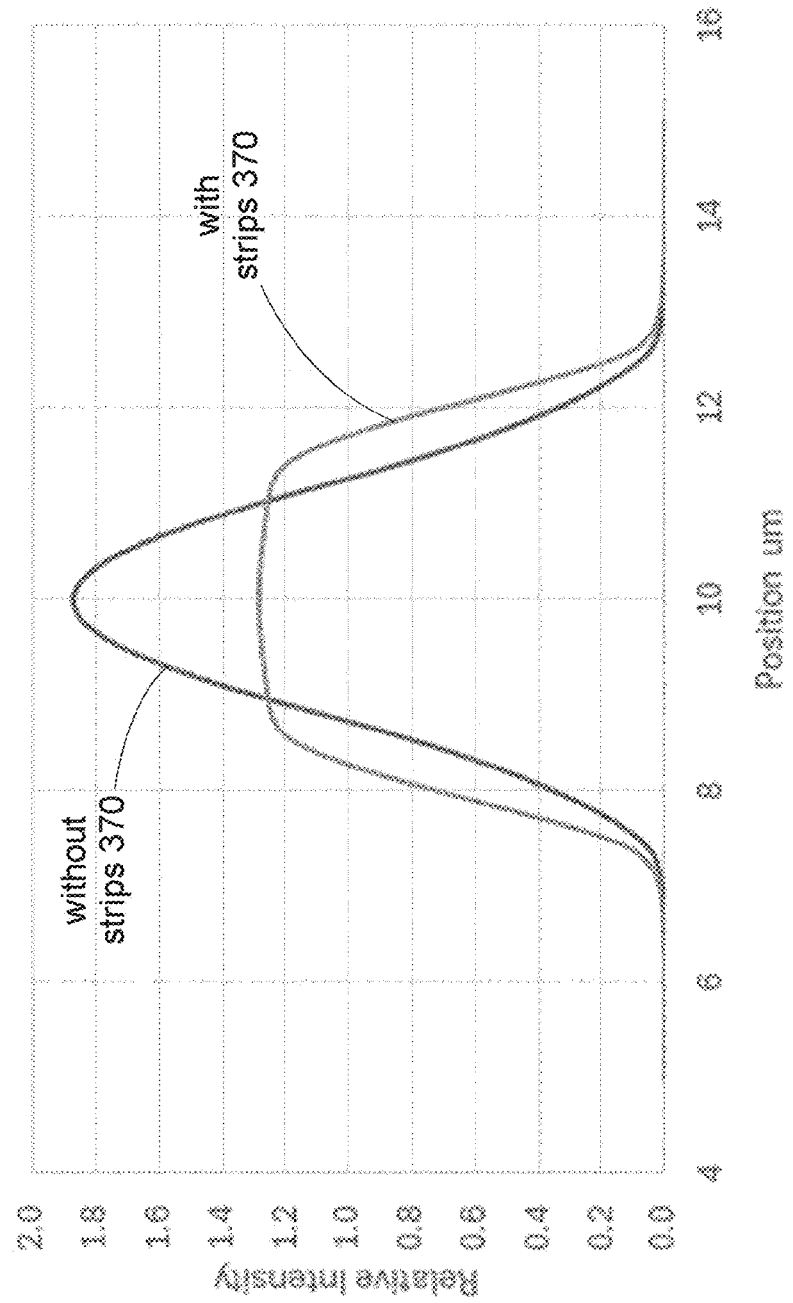
FIG. 13 shows optical intensity lateral profiles for two example waveguide structures.

In each of the examples of FIGS. 5B, 5C, 6B, 6C, 7B, 7C, 8B, and 8C, a spaced-apart pair of longitudinal strips 370 of higher-index semiconductor material are positioned along the waveguide structure. "Higher-index" indicates a refractive index higher than that of the top and bottom doped layers 104 and 106. The size, refractive index, and separation of the strips 370 can be selected to yield desired transverse mode profiles of optical modes supported by the waveguide structure, i.e., for optical mode shaping. In particular, the strips 370 can be arranged to yield an optical mode lateral profile across the active layer 102 that is somewhat "flattened" relative to those profiles in the absence of the strips 370. An example in shown in FIG. 13, with overlaid optical intensity lateral profiles for modes supported by waveguides with and without the longitudinal strips 370. The drive current lateral profile tends to be relatively flat across those portions of the active layer 102 where current is permitted to flow, e.g., across the entire ridge 12 of FIG. 1, across the entire strip 22 of FIG. 2, across the entire ridge 312 of FIG. 5B, across the entire strip 322 of FIG. 6B or 7B, across the entire strip 332 of FIG. 8B, or across the entire gap 352 in FIG. 5A, 5C, 6A, 6C, 7A, 7C, 8A, or 8C. By flattening the optical intensity lateral profile, more optical intensity is pushed laterally to overlap those portions of the drive current lateral profile that might otherwise be under-extracted, limiting efficiency and providing optical gain to undesired optical modes.

The degree of flattening of the optical intensity lateral profile can be characterized or quantified in any suitable way. For example, the fraction of the total power that falls within the full width at half maximum (FWHM) of the profile can indicate the degree to which the profile is flattened. A one-dimensional gaussian profile would have about 60% of its total power within its FWHM, while a perfectly flat-topped rectangular intensity profile would have 100% of its total power within its FWHM. In some examples of optical devices disclosed herein that include the longitudinal higher-index strips 370 for optical mode shaping, the optical intensity lateral profile can include more than 65%, more than 70%, more than 75%, more than 80%, more than 85%, more than 90%, or more than 95% of its total power within its FWHM.

The size, separation, and refractive index of the longitudinal strips 370 enable the optical device to be designed with control of the optical intensity lateral profile across the active layer 102 that is at least somewhat independent of the drive current lateral profile across the active layer 102. That independent control can enable those two profiles to be suitably matched to or overlapped with one another, so that the desired transverse mode can more efficiently extract the optical gain arising from the laser drive current. In some examples the presence of the strips 370 has little or no effect on current flow through the device. In other examples, differences in doping species or concentration of the strips 370 (that provide the higher refractive index) might also affect flow of drive current through the optical device. In such instances, an iterative approach can be employed to achieve a desired degree of spatial overlap between the optical intensity and drive current lateral profiles.

In some examples (e.g., as in FIGS. 5C, 6C, 7C, and 8C), the optical device includes both the current restrictors 350 and the higher-index longitudinal strips 370, enabling even greater flexibility and independence in designing the device with desired optical intensity and drive current lateral profiles.

In some examples (e.g., FIGS. 5A-5C), the optical waveguide structure 300 can be arranged as a RWG structure that includes a longitudinal ridge 312 that protrudes away from the active layer 102. The active layer 102 extends laterally beyond the ridge 312 so as to play no part in lateral confinement of the resonant optical modes. The higher-index longitudinal strips 370 (if present, as in FIGS. 5B and 5C) can be formed on or near the active layer at or near the base of the ridge 312. The current restrictors 350 (if present, as in FIGS. 5A and 5C) can be formed on the active layer 102 (often with a thin doped semiconductor layer 105 therebetween, of the same doping type as the top doped layer 104) at the base of the ridge 312 and are arranged so that the ridge 312 is wider than the gap 352. Note that here and elsewhere herein, two semiconductor materials "of the same doping type" means only that the two materials are either both n-type or both p-type, but could otherwise differ with respect to one or more or all of: base materials, dopant species, or dopant concentrations. In the examples shown, the ridge 312 is part of and protrudes from the top doped layer 104, and the gap 352 is filled with material of the top doped layer 104. The current restrictors 350 are arranged as a pair of longitudinal strips of material positioned on the active layer 102 along each side of the ridge 312. The current restrictors 352 extend medially partly into the ridge 312 and are laterally spaced apart by the gap 352.

In some examples that include a ridge waveguide 312, the top doped layer is p-type, the bottom doped layer 106 is n-type, and the current restrictors 350 include n-doped semiconductor material. The thin doped layer 105 (p-type) separates the n-doped current restrictors 350 from the active layer 102; the doped layer 105 is sufficiently thin so as to prevent or restrict lateral flow of the laser drive current 99 therethrough. In a forward-biased arrangement with the laser drive current 99 flowing through the ridge 312 from the p-doped layer 104 through the active layer 102 into the n-doped layer 106, the boundary between the n-doped current restrictors 350 and the p-doped layer 105 results in a reverse-biased p-n junction that prevents flow of the laser drive current 99 through the current restrictors 350 into the active layer 102.

In some other examples that include a ridge waveguide 312, the current restrictors 350 include semi-insulating semiconductor material that prevents flow of the laser drive current 99 through the current restrictors 350 into the active layer 102. Any suitable semi-insulating semiconductor material can be employed that is compatible with the material of the layers 102, 104, 105, or 106. In some examples the semi-insulating semiconductor material can include a III-V semiconductor material (e.g., InP) doped with iron or ruthenium. In some examples that include semi-insulating semiconductor material the thin doped layer 105 can be present between the current restrictors 350 and the active layer 102.

In some examples (e.g., as in FIGS. 6A-6C and 7A-7C), the optical waveguide structure 300 can be arranged as a BHWG structure that includes a longitudinal strip 322 of the active layer 102 between lateral current-blocking layers 324. The higher-index longitudinal strips 370 (if present, as in FIGS. 6B, 6C, 7B, and 7C) can be formed on or near lateral edges of the longitudinal strip 322. The strip 322 of the active layer 102 is wider than the gap 352 (if present, as in FIG. 6A, 6C, 7A, or 7C). The higher-index longitudinal strips 370 (if present, as in FIGS. 6B, 6C, 7B, and 7C) can be formed on or near lateral edges of the longitudinal strip 322. The relatively high index of the active layer 102, and its limited lateral extent in FIGS. 6A and 6B (i.e., arranged as the elongated strip 322) cause it to act as a waveguide core that constrains the supported optical modes both vertically and laterally. The current-blocking layers 324 prevent flow of the laser current 99 from the sides of the strip 322, and separate the bottom doped layer 106 from the current restrictors 350. The gap 352 is filled with material of the top doped layer 104. The current restrictors 350 extend medially partly between the active layer 102 and portions of the top doped layer 104 and are laterally spaced apart by the gap 352.

In some examples (e.g., as in FIGS. 6A-6C), the top doped layer 104 is p-type, the bottom doped layer is n-type, the lateral current-blocking layers 324 include p-doped semiconductor material, and the current restrictors 350 include n-doped semiconductor material. A thin p-doped layer 105 separates the n-doped current restrictors 350 from the active layer 102; the p-doped layer 105 is sufficiently thin so as to prevent or restrict lateral flow of the laser drive current 99 therethrough. In a forward-biased arrangement with the laser drive current 99 flowing from the p-doped layer 104 through strip 322 of the active layer 102 into the n-doped layer 106, the boundaries between the n-doped current restrictors 350 and the p-doped layer 105, and between the n-doped current restrictors 350 and the p-doped lateral current-blocking layers 324, result in reverse-biased p-n junctions that prevent flow of the laser drive current 99 through the current restrictors 350 into the active layer 102 or into the n-doped layer 106.

In some other examples (e.g., as in FIGS. 7A-7C), current restrictors 350 include semi-insulating semiconductor material that prevents flow of the laser drive current 99 through the current restrictors 350 into the active layer 102. In such examples the lateral current-blocking layers 324 and current restrictors 350 form portions of a common layer of semi-insulating semiconductor material that prevents flow of laser drive current 99 (i) through the lateral current-blocking layers 324 into the bottom doped layer 106 and (ii) through the current restrictors 350 into the active layer 102. In such examples the thin doped layer 105 can be present between the current restrictors 350 and the active layer 102 (as described above).

In some examples (e.g., as in FIGS. 8A-8C), the optical waveguide structure 300 can be arranged as a PBRWG structure that includes a longitudinal strip 332 of higher-index semiconductor material on the active layer 102. The active layer 102 extends laterally beyond the strip 332 so as to play no part in lateral confinement of the resonant optical modes. The higher-index semiconductor material of the strip 332 has a refractive index higher than refractive indices of the bottom doped layer 106 and the top doped layer 104, but typically not higher than that of the active layer 102. The strip 332 acts as a waveguide core that confines the supported optical modes laterally; the active layer 102 provides vertical confinement of those supported optical modes. The gap 352 is filled with material of the top doped layer 104. The current restrictors 350 (if present, as in FIGS. 8A and 8C) extend medially partly between the active layer 102 and portions of the top doped layer 104 and are laterally spaced apart by the gap 352. The higher-index longitudinal strips 370 (if present, as in FIGS. 8B and 8C) can be formed on or near lateral edges of the longitudinal strip 322.

In some examples the top doped layer 104 is p-type, the bottom doped layer 106 is n-type, and the current restrictors 350 include n-doped semiconductor material. A thin p-doped layer 105 separates the n-doped current restrictors 350 from the active layer 102; the p-doped layer 105 is sufficiently thin so as to prevent or restrict lateral flow of the laser drive current 99 therethrough. In a forward-biased arrangement with the laser drive current 99 flowing from the p-doped layer 104 through the active layer 102 into the n-doped layer 106, the boundary between the n-doped current restrictors 350 and the thin p-doped layer 105 results in a reverse-biased p-n junction that prevents flow of the laser drive current 99 through the current restrictors 350 into the active layer 102. In some other examples the current restrictors 350 include semi-insulating semiconductor material that prevents flow of the laser drive current 99 through the current restrictors 350 into the active layer 102. In such examples the thin doped layer 105 can be present between the current restrictors 350 and the active layer 102 (as described above). In some examples the top doped layer 104 can be etched to form a ridge 335.

Any suitable sequence of spatially selective material processing steps can be employed to form an inventive semiconductor waveguide optical gain device, including the examples shown. Specific examples of suitable process sequences for forming the examples of FIGS. 5A through 8C are described below and illustrated schematically in FIGS. 9A through 12G.

Figure 5A:
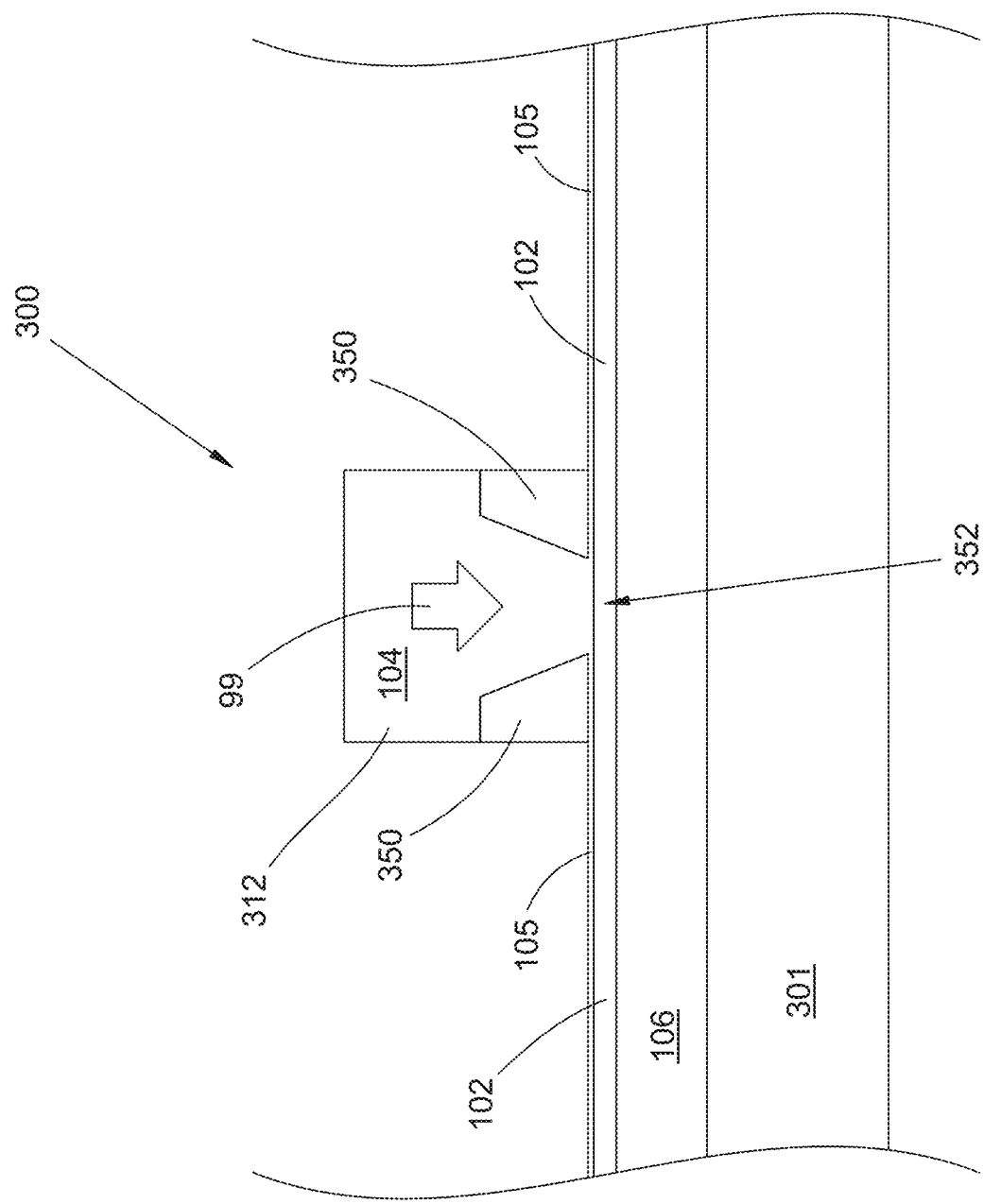
FIGS. 5A-5C are schematic transverse cross-sectional views of examples of inventive semiconductor waveguide optical gain devices that each include a ridge waveguide (RWG) structure.
Figure 5B:
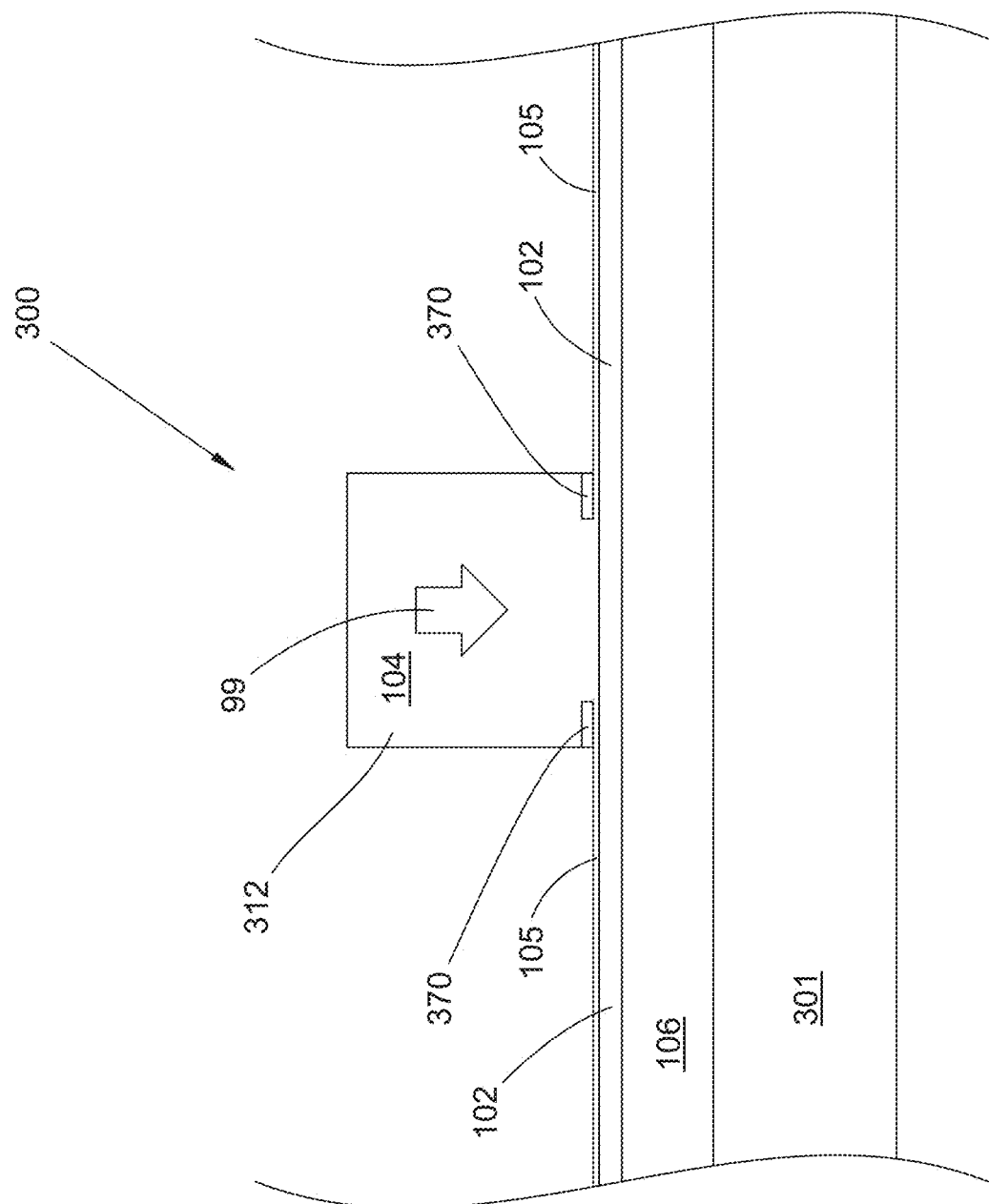
Figure 5C:
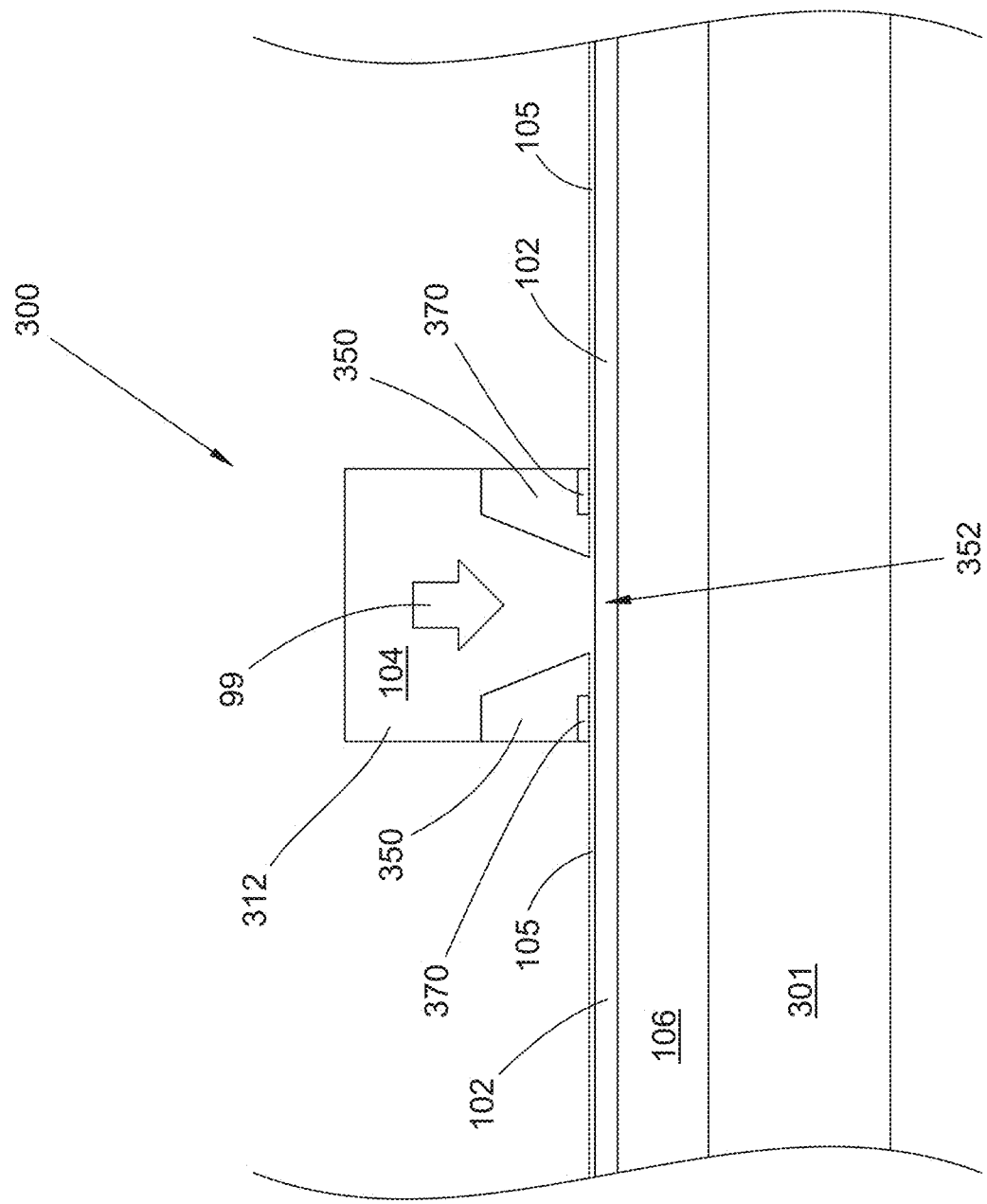
Figure 9C:
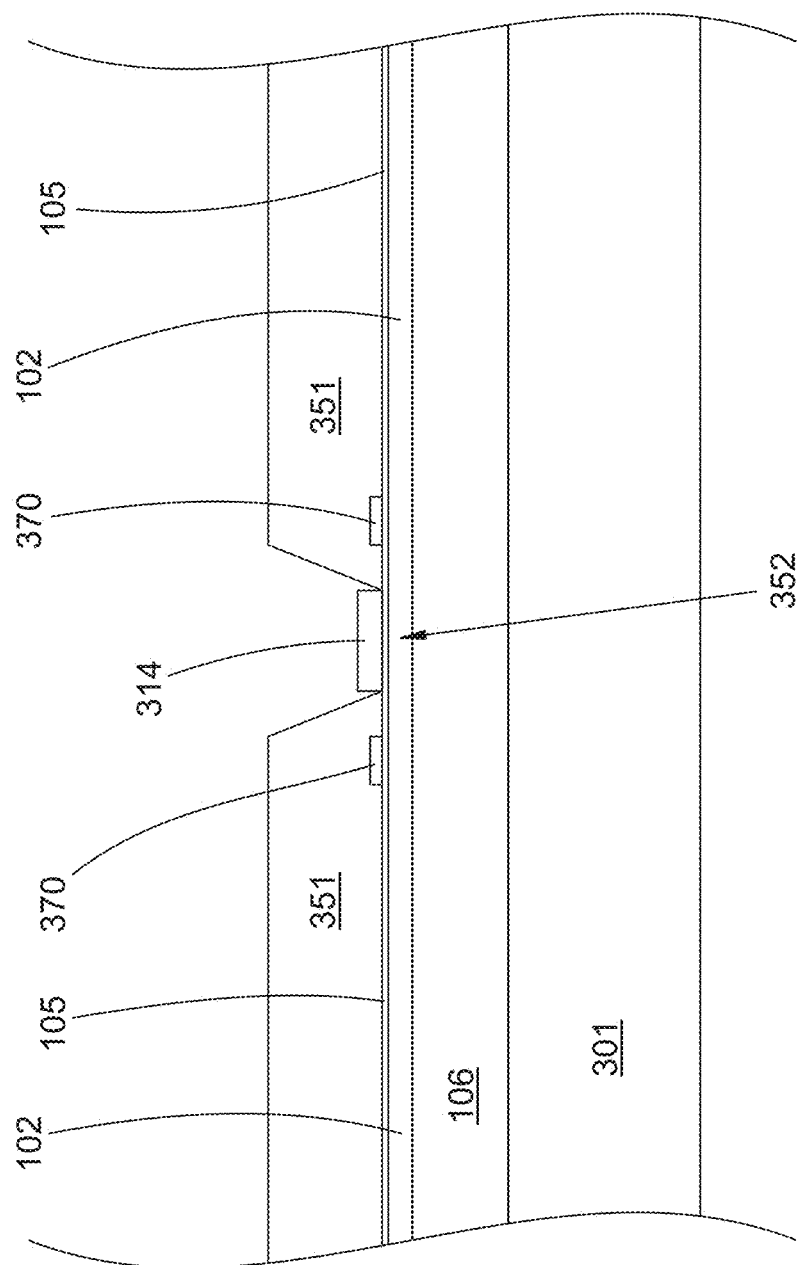
Figure 9D:
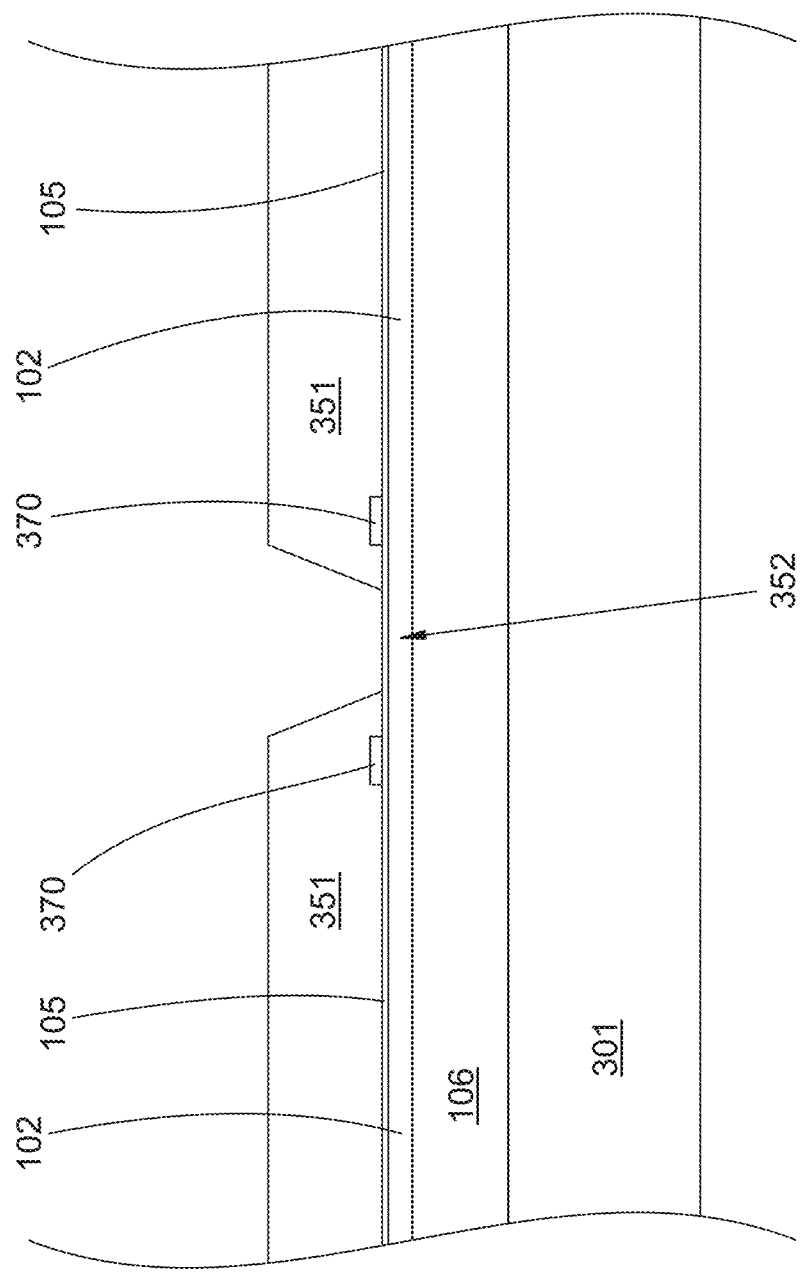

An example of a method for forming the example optical device of FIG. 5C (which includes a RWG structure) is illustrated schematically in FIGS. 9A through 9F, and can begin with forming a current-restricting layer 351 on a first surface of a semiconductor wafer. In FIG. 9A the wafer includes the n-doped layer 106, the active layer 102, the thin p-doped layer 105, and the higher-index strips 370 (formed by any suitable spatially-selective processing technique); in other examples the p-doped layer 105 can be absent; in other examples the higher-index strips 370 can be absent (in which case the method results in an optical device arranged as in FIG. 5A). The current-restricting layer 351 (e.g., n-doped semiconductor material or semi-insulating semiconductor material) is formed with a gap 352 through which an elongated strip of the first wafer surface remains exposed. FIGS. 9B through 9D show the current-restricting layer being formed by first forming a mask 314 (FIG. 9B), growing the current-restricting layer 351 on those portions of the wafer surface left exposed by the mask 314 (FIG. 9C), and then removing the mask 314 (FIG. 9D). The width of the mask 314 determines the width of the gap 352. Alternatively, a continuous layer of current-restricting material 351 could be formed first, and then the gap 352 formed by etching or other spatially selective removal process.

Figure 9E:
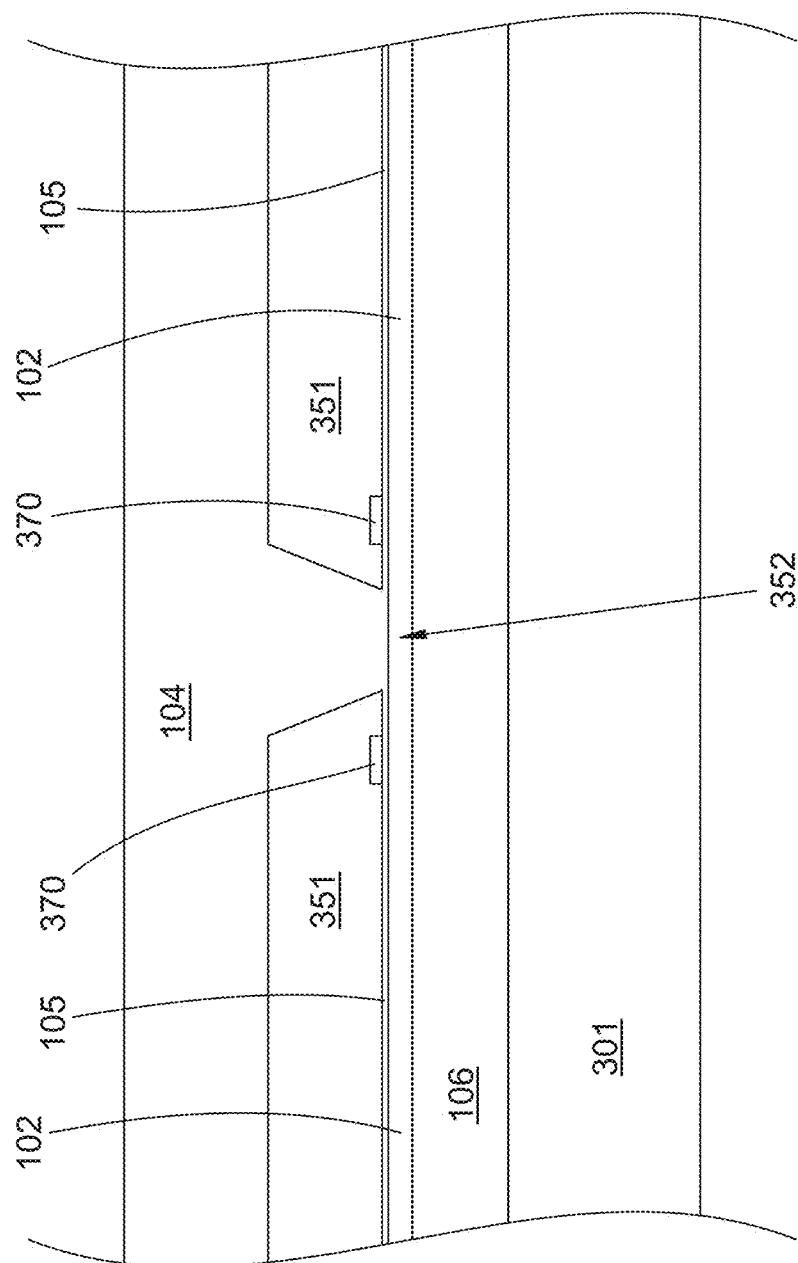
Figure 9F:
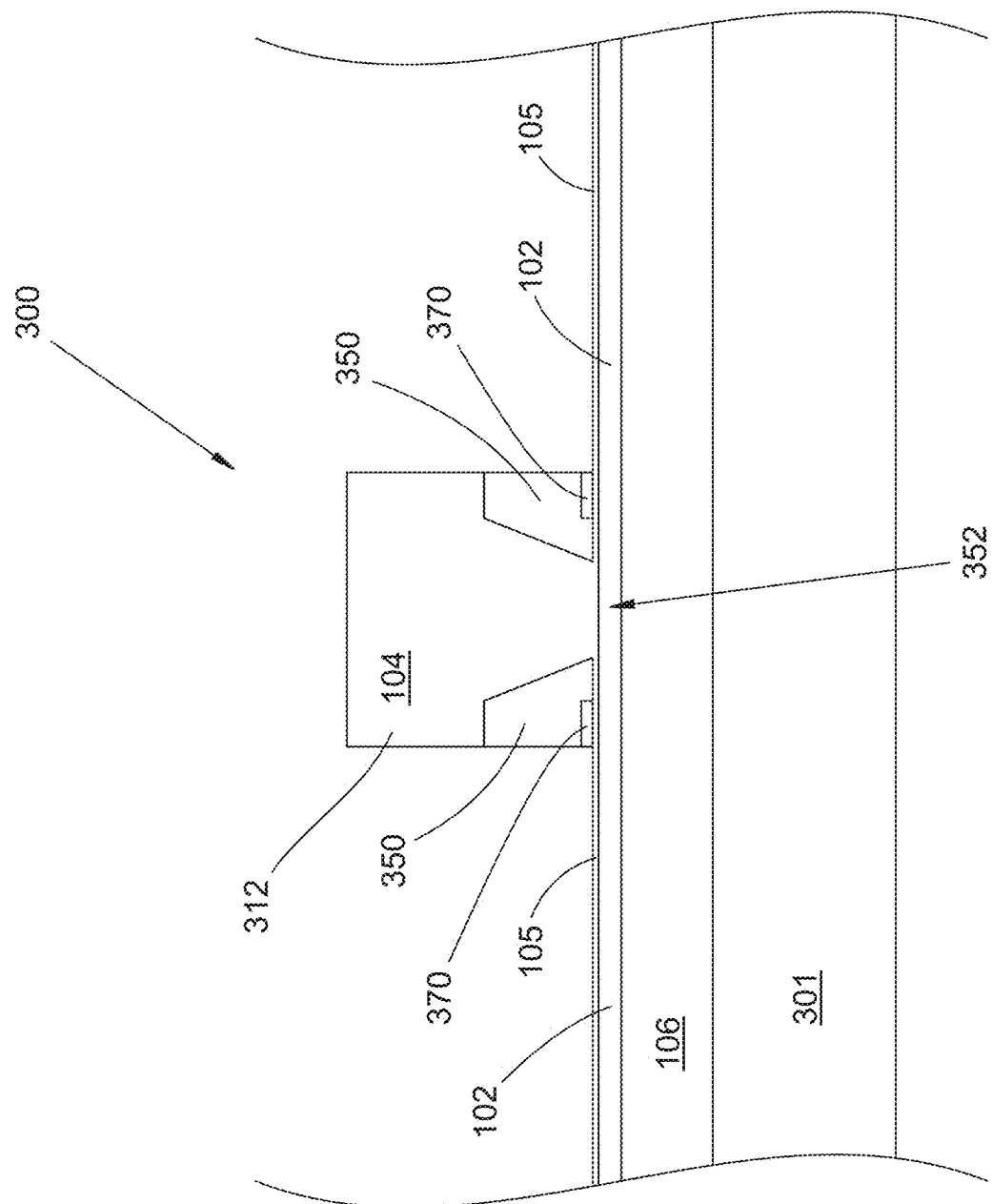

In FIG. 9E, the p-doped layer 104 is formed by any suitable growth or deposition technique; the material of the p-doped layer 104 fills the gap 352 and is in direct contact with the wafer surface (e.g., the p-doped layer 105 (if present) or the active layer 102). Any additional layers needed for, e.g., electrical contact or other purposes, can be formed on the p-doped layer 104. In FIG. 9F, the p-doped layer 104 and the current-restricting layer 351 have been etched to form the longitudinal ridge waveguide structure 312 that is wider than the gap 352. The remaining unetched portions of the current-restricting layer 351 form the current restrictors 350 in the form of a pair of longitudinal strips positioned on the active layer 102 (or on the p-doped layer 105 if present) along each side of the longitudinal ridge and extending medially partly into the longitudinal ridge 312. The longitudinal strips are laterally spaced apart by the gap 352.

Figure 6A:
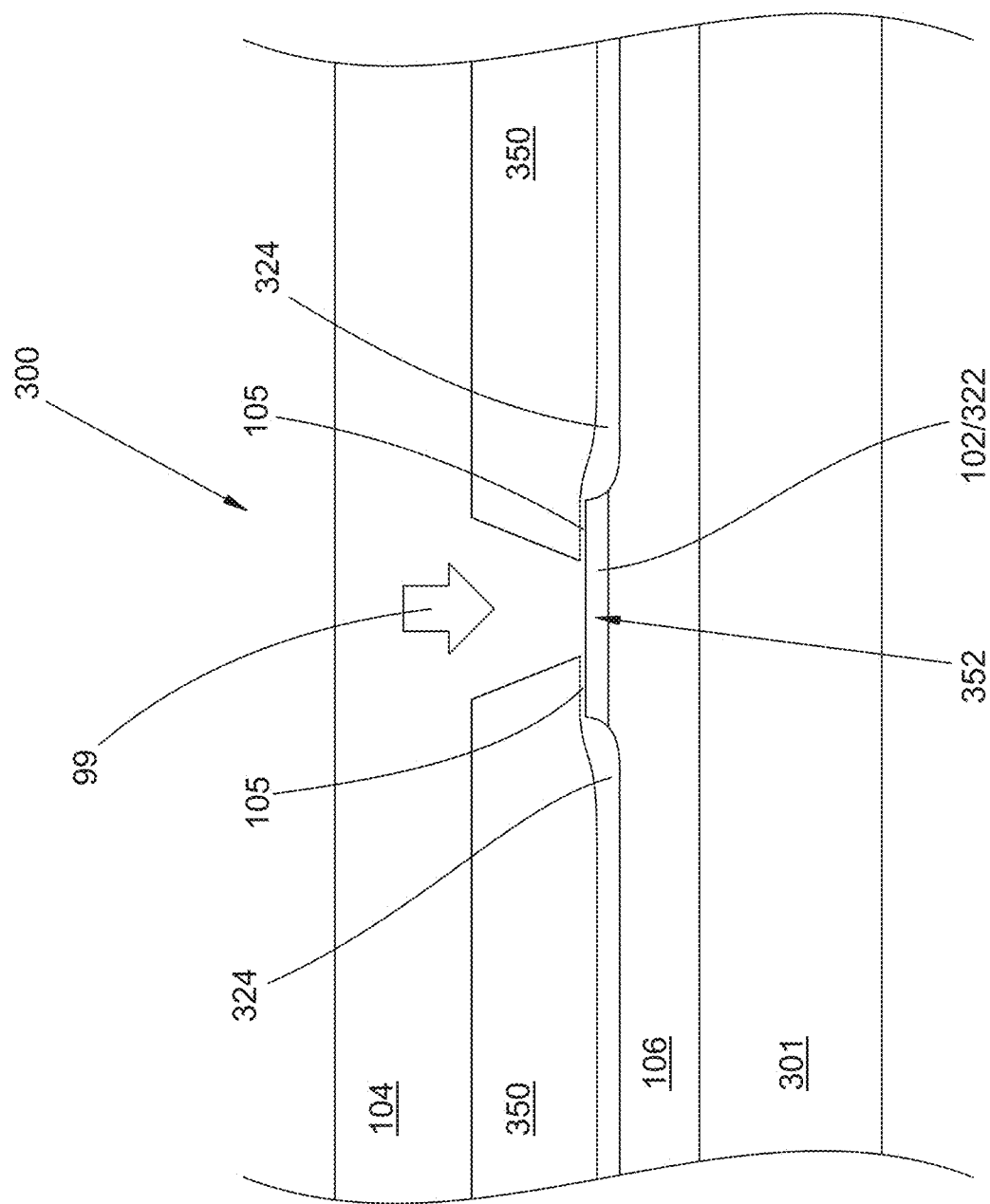
FIGS. 6A-6C and 7A-7C are schematic transverse cross-sectional views of examples of an semiconductor waveguide optical gain devices that each include a buried heterostructure waveguide (BHWG) structure.
Figure 6B:
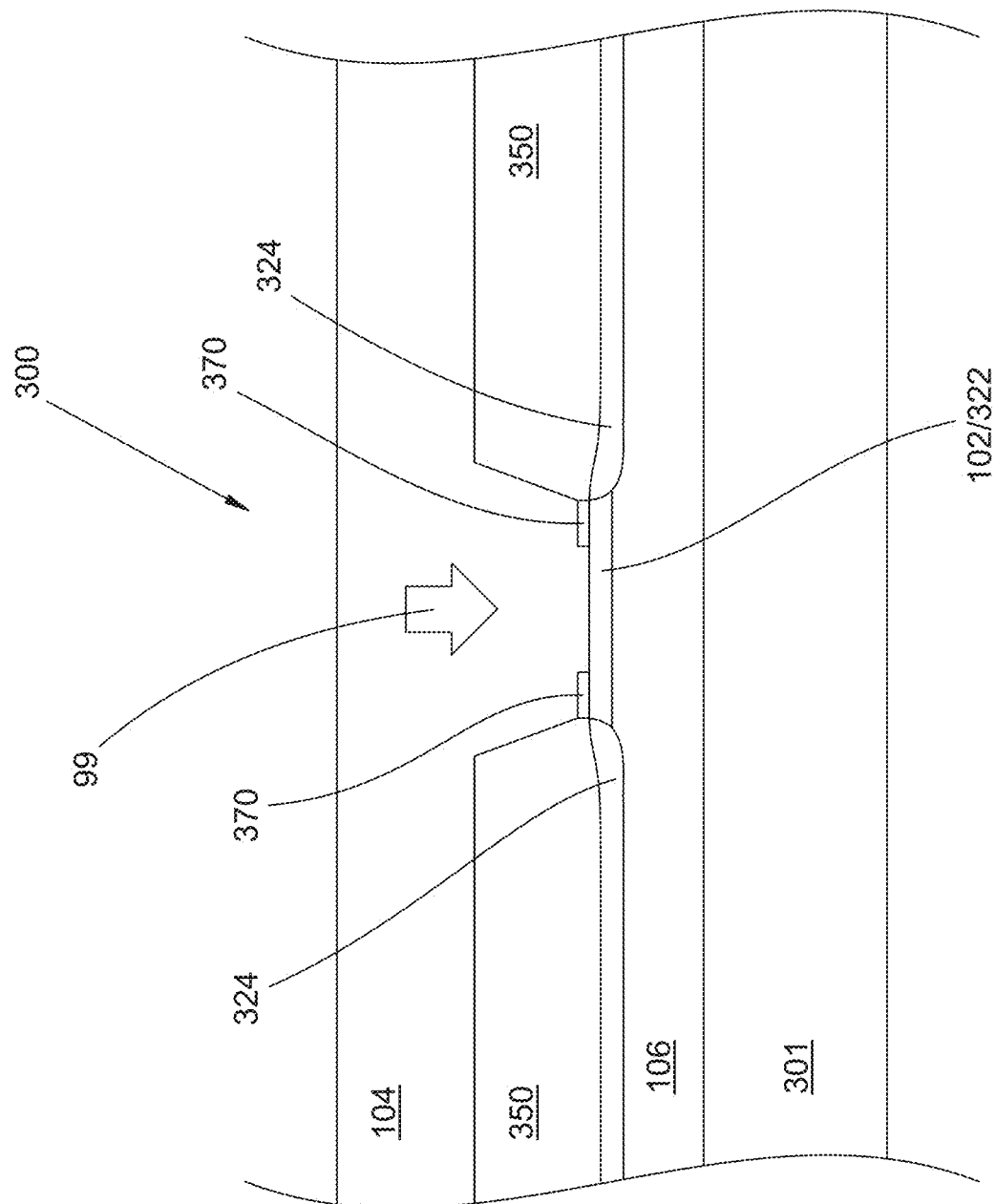
Figure 6C:
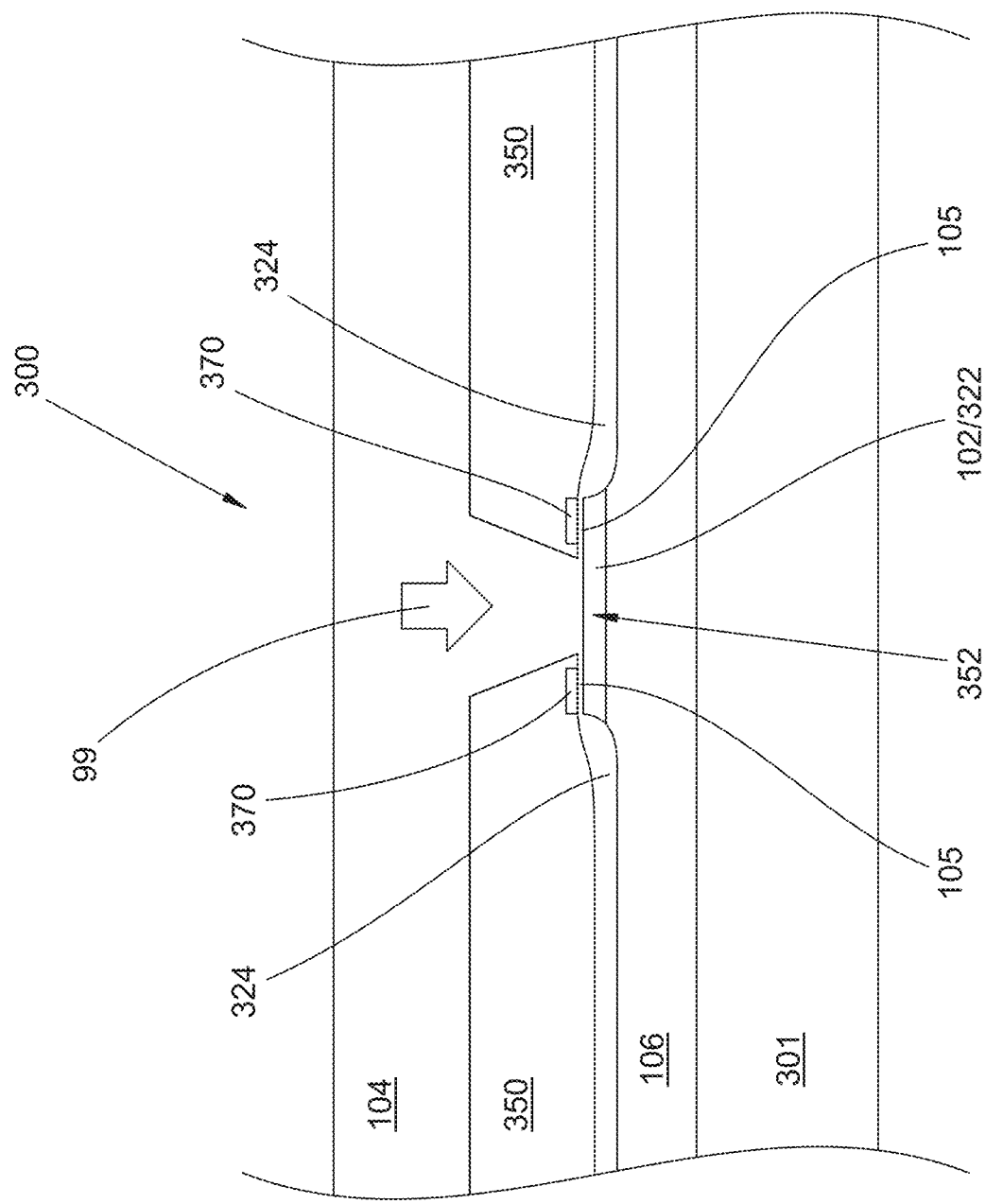
Figure 10B:
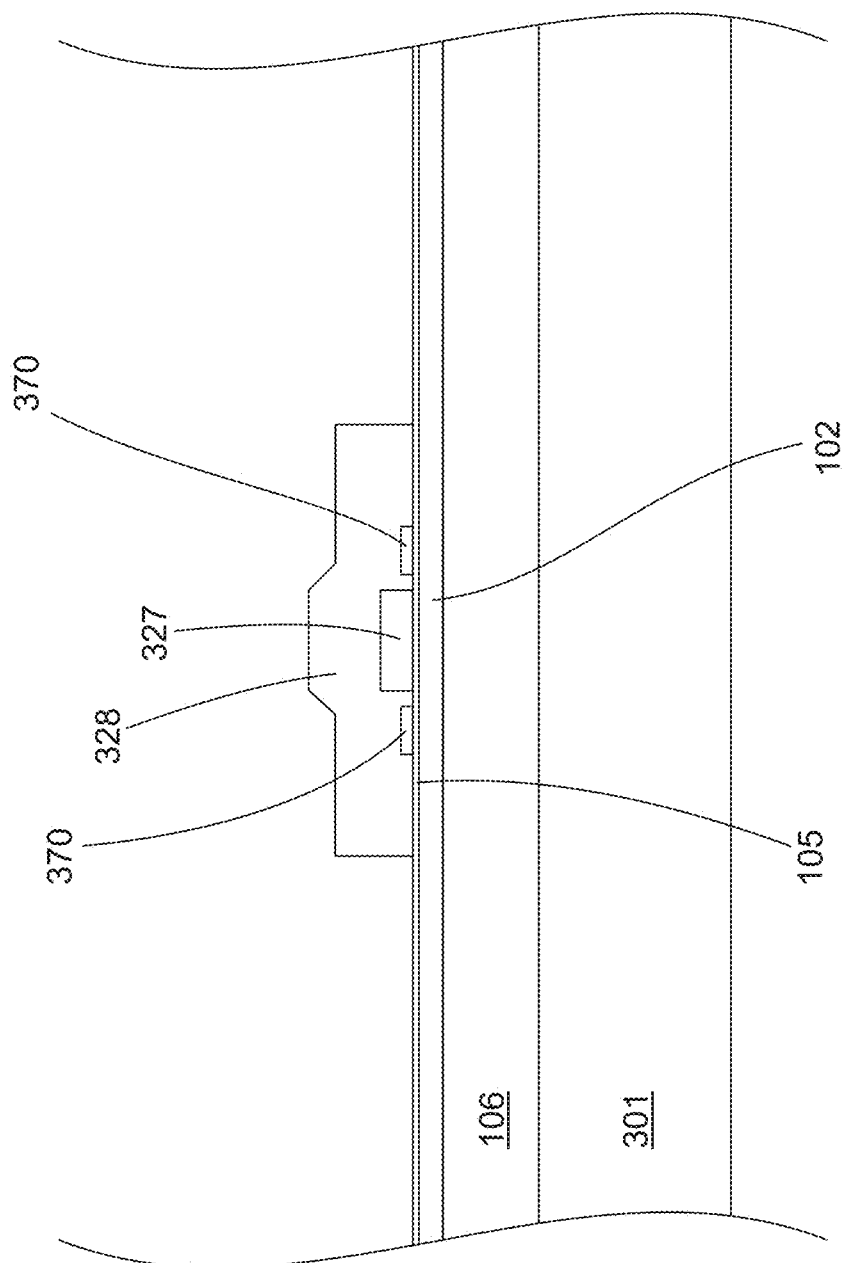
Figure 10C:
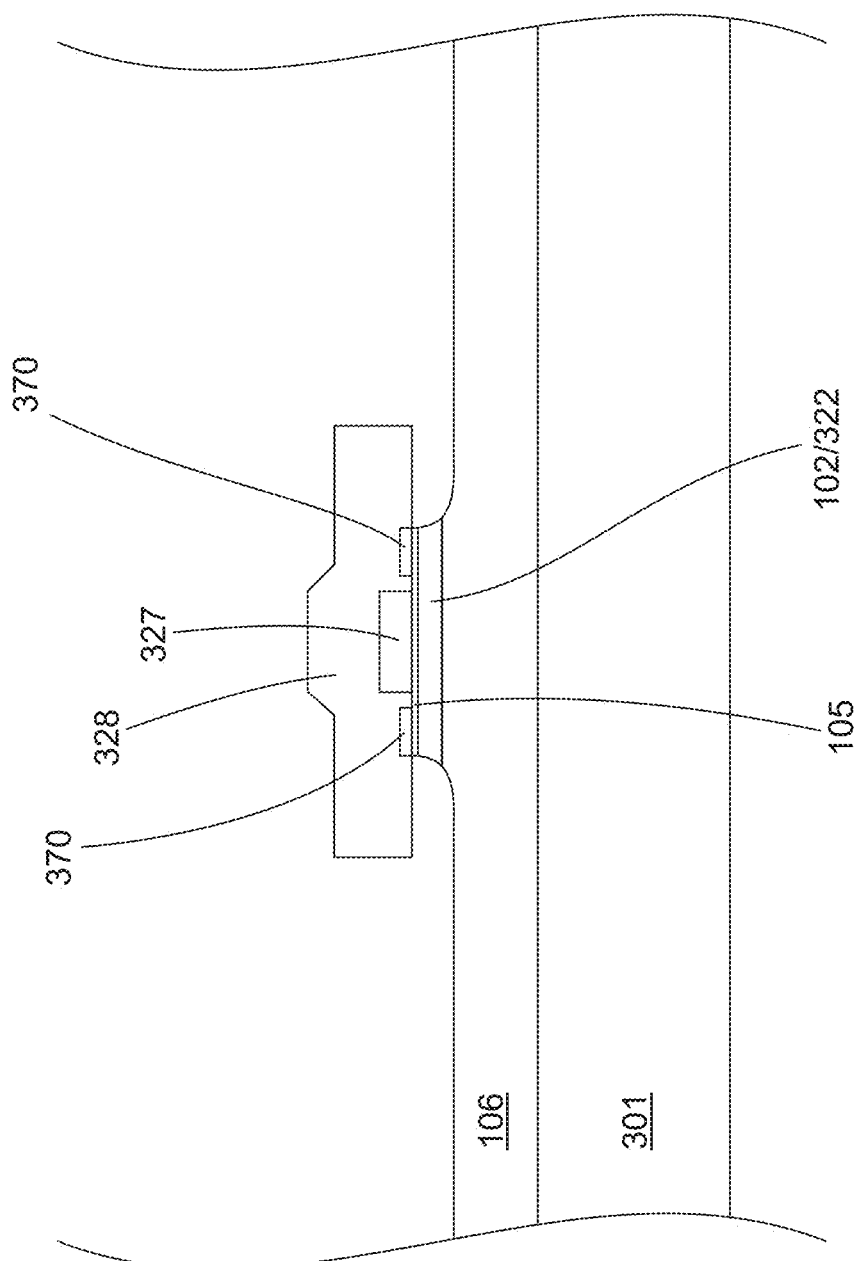

An example of a method for forming the example optical device of FIG. 6C (which includes a BHWG structure) is illustrated schematically in FIGS. 10A through 10H, and can begin with forming an elongated strip 322 of the active layer 102 on a first surface of a semiconductor wafer. In FIG. 10A the wafer includes the n-doped layer 106, the active layer 102, the thin p-doped layer 105, and the higher-index strips 370 (formed by any suitable spatially-selective processing technique); in other examples the higher-index strips 370 can be absent (in which case the method results in an optical device arranged as in FIG. 6A). In FIG. 10B a first mask 327 is formed on the wafer, then a wider mask 328 is formed over the mask 327. In FIG. 10C the active layer 102 and the p-doped layer 105 have been etched (e.g., by a non-selective wet etch or a combination of dry and wet etching) to form the strip 322. Alternatively, the strip 322 of the active layer 102 could be formed by spatially selective growth or deposition of the strip 322 on the n-doped layer 106. FIG. 10D shows the lateral current-blocking layers 324 formed on the first wafer surface with the strip 322 between them; in this example the current-blocking layers are p-doped semiconductor material.

Figure 10E:
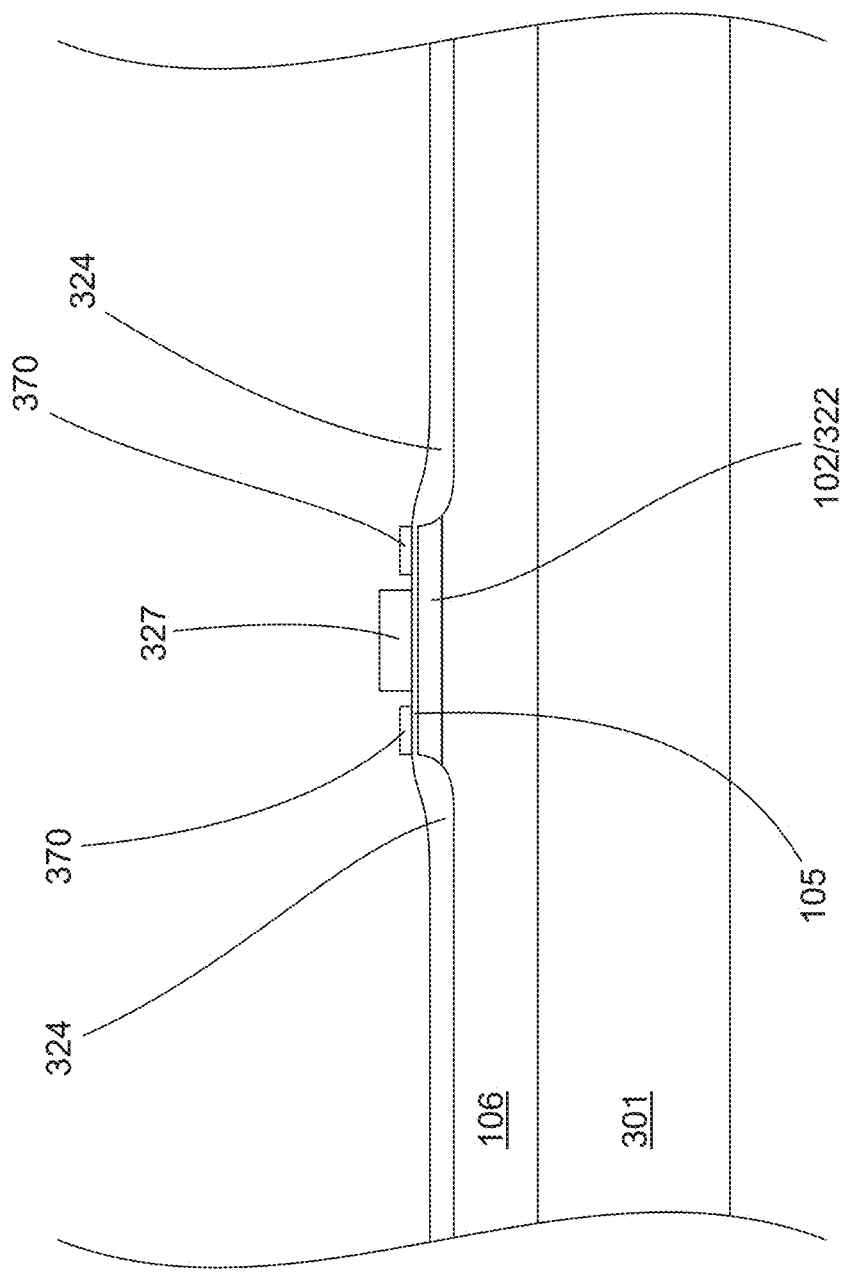
Figure 10G:
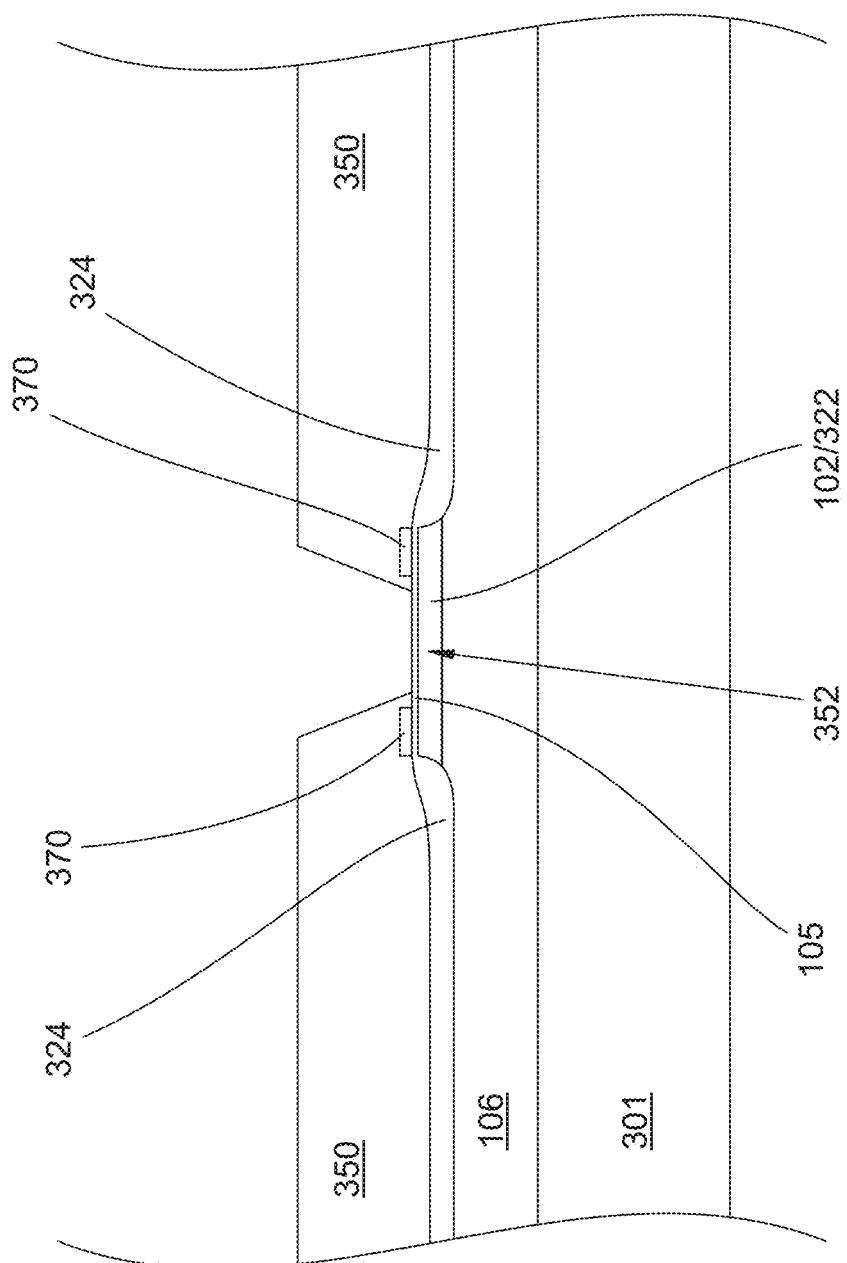
Figure 10H:
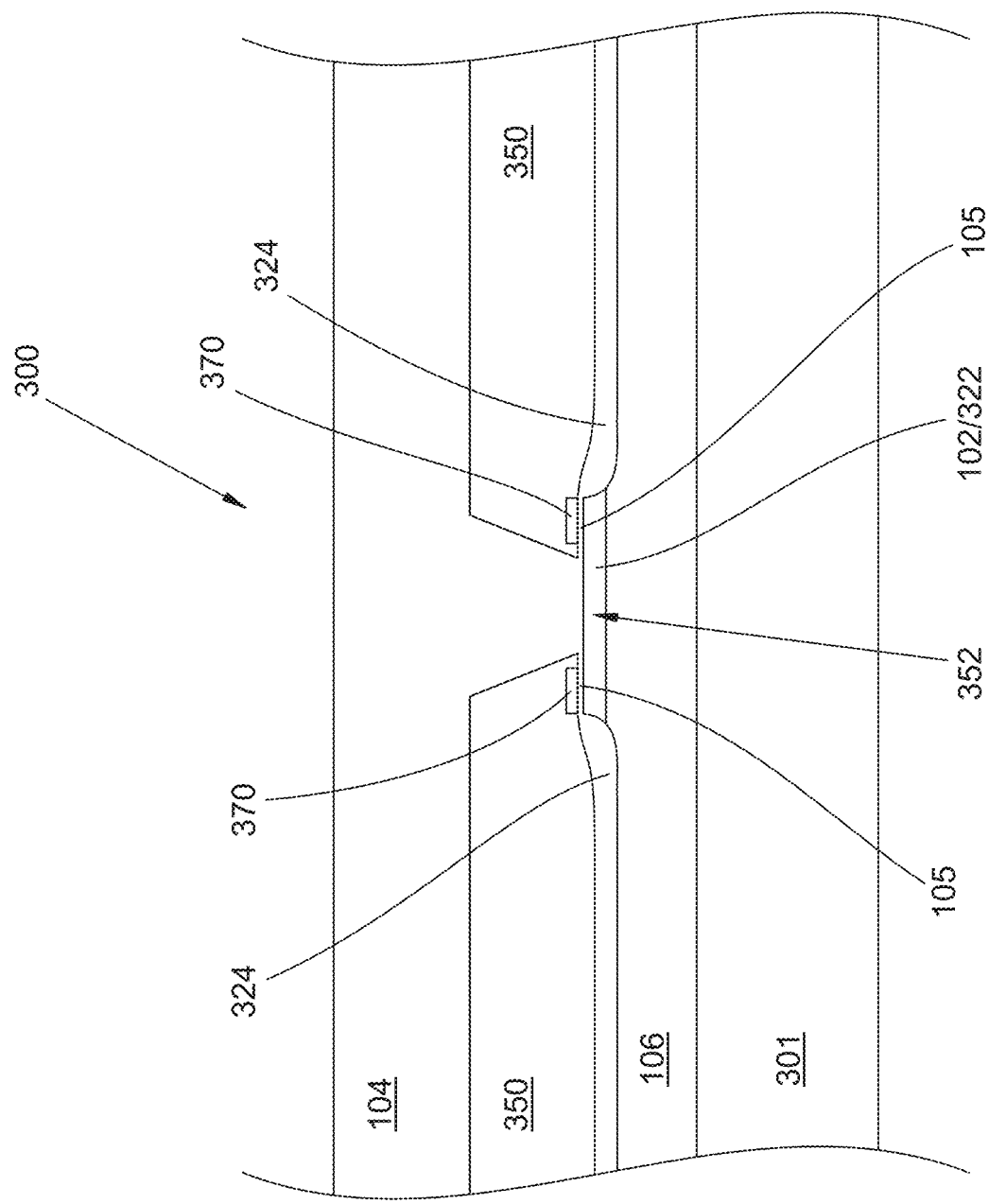

In FIG. 10E the mask 328 has been removed, and in FIG. 10F the current restrictors 350 have been formed with the gap 352 between them. The size of the mask 327 determines the size of the gap 352; the strip 322 of the active layer 102 is wider than the gap 352. In this example the current restrictors 350 are n-doped material. Instead of the masked deposition depicted, uniform deposition of the n-doped material followed by spatially selective etching of the gap 352 can be employed. In FIG. 10G the mask 327 has been removed. In FIG. 10H the p-doped layer 104 is formed by any suitable growth or deposition technique; the material of the p-doped layer 104 fills the gap 352 and is in direct contact with the p-doped layer 105. Any additional layers needed for, e.g., electrical contact or other purposes, can be formed on the p-doped layer 104.

Figure 7A:
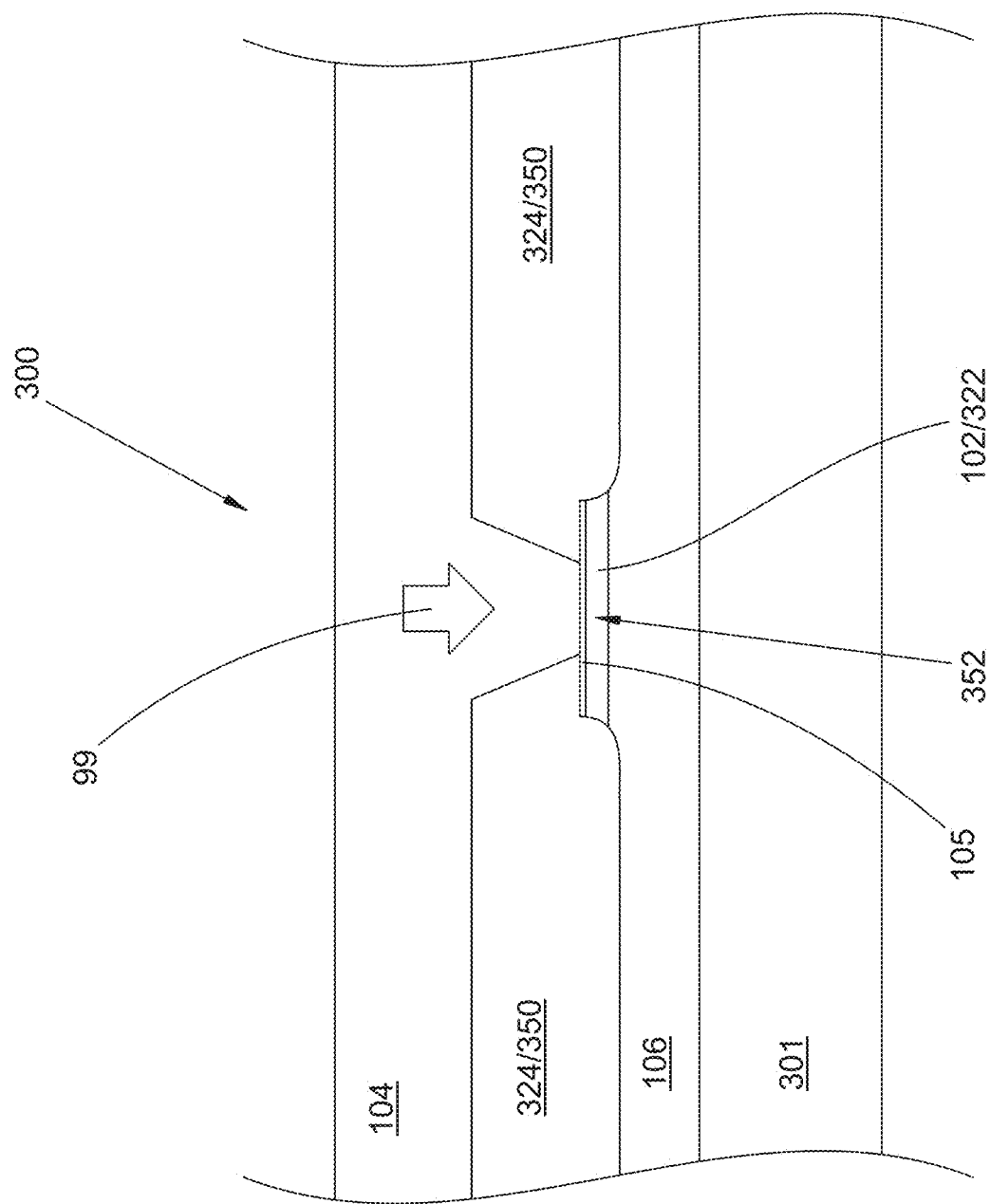
Figure 7B:
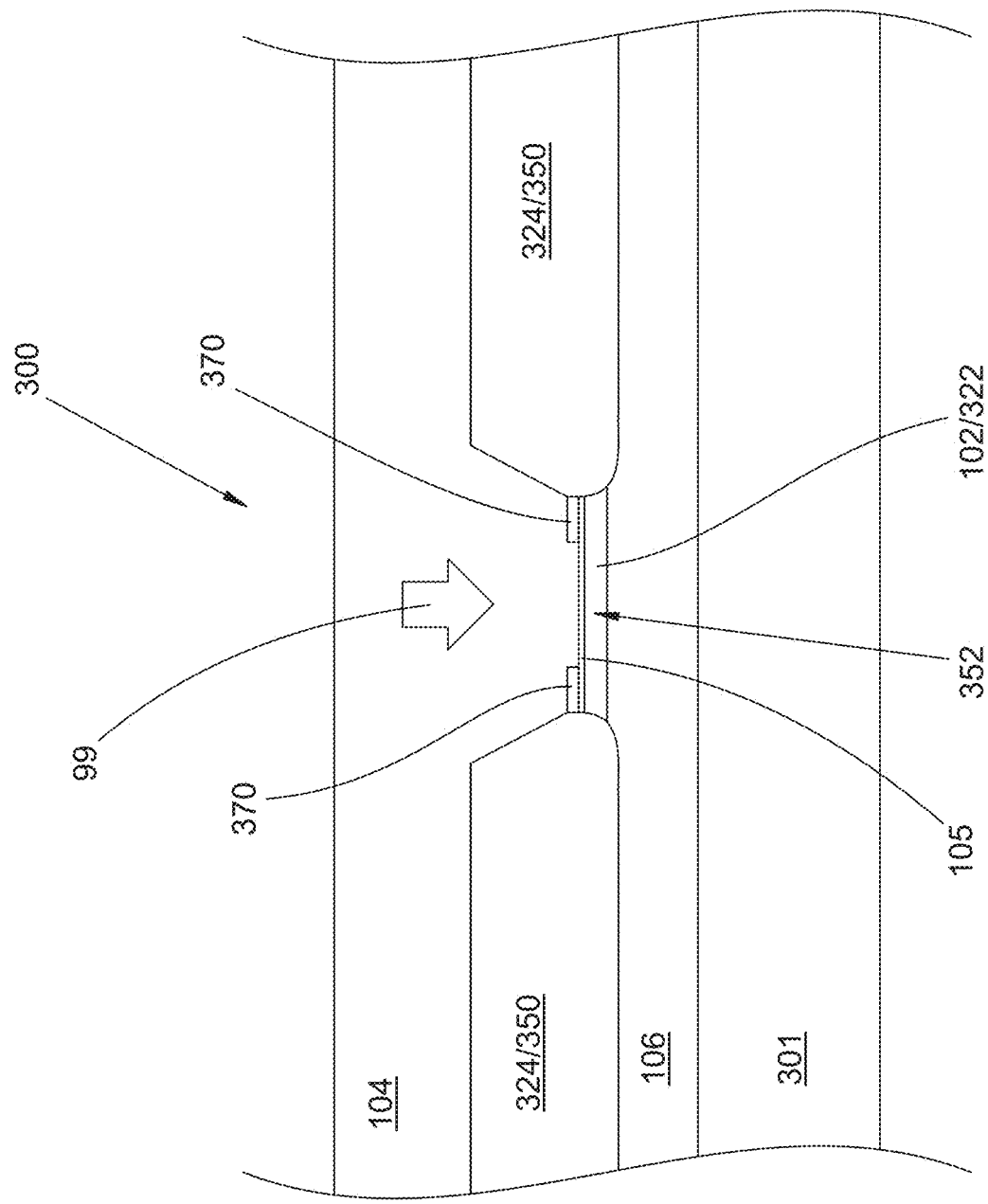
Figure 7C:
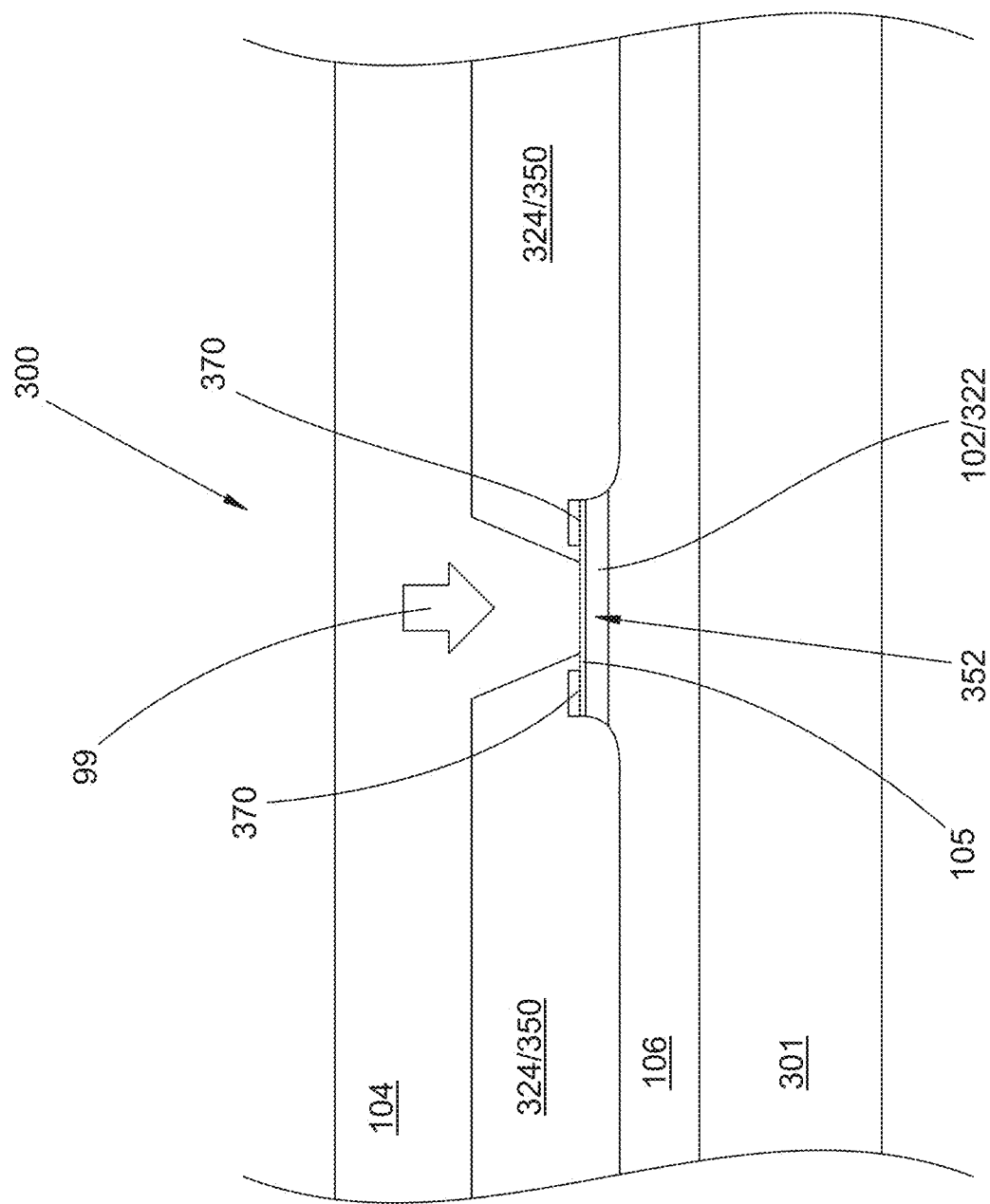
Figure 11A:
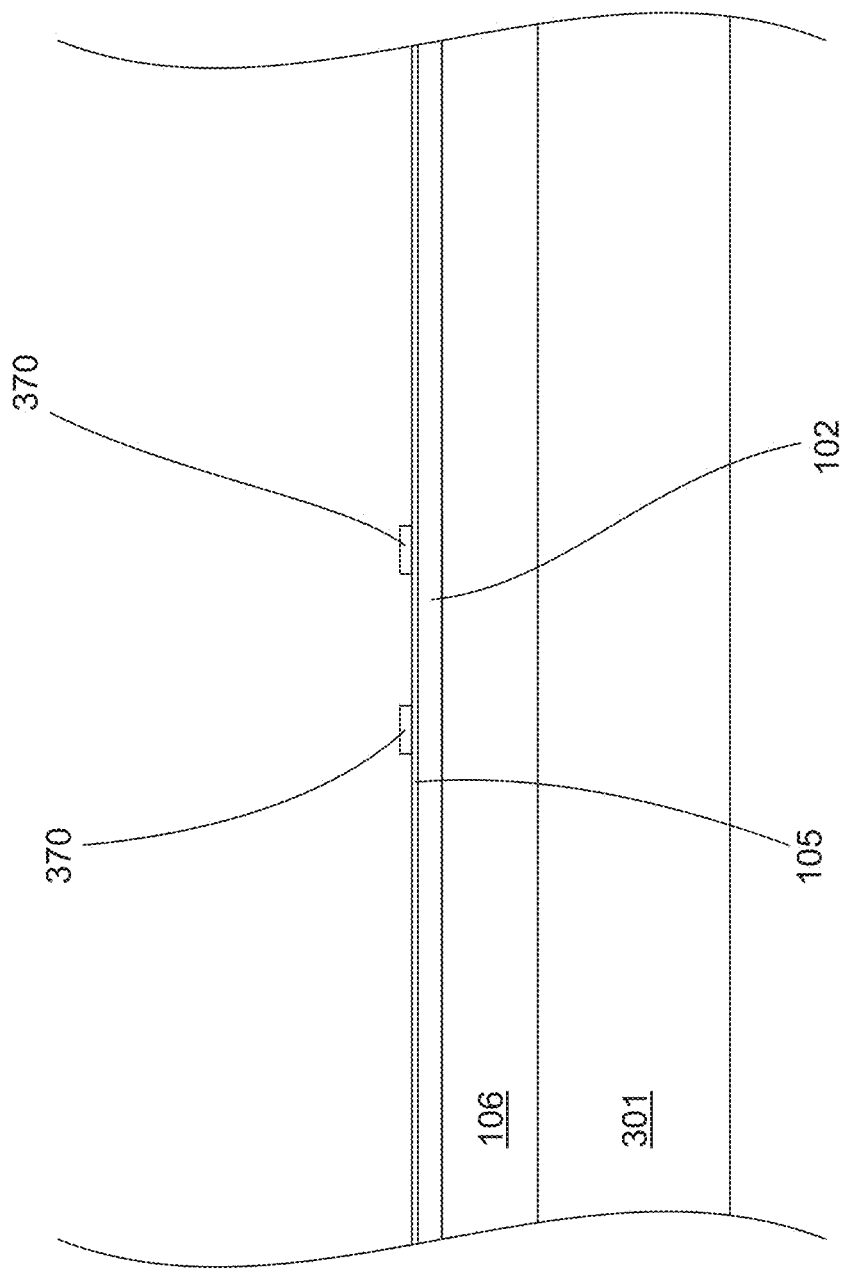
FIGS. 11A through 11G illustrate schematically a process sequence for making the example devices of FIGS. 7A-7C.
Figure 11B:
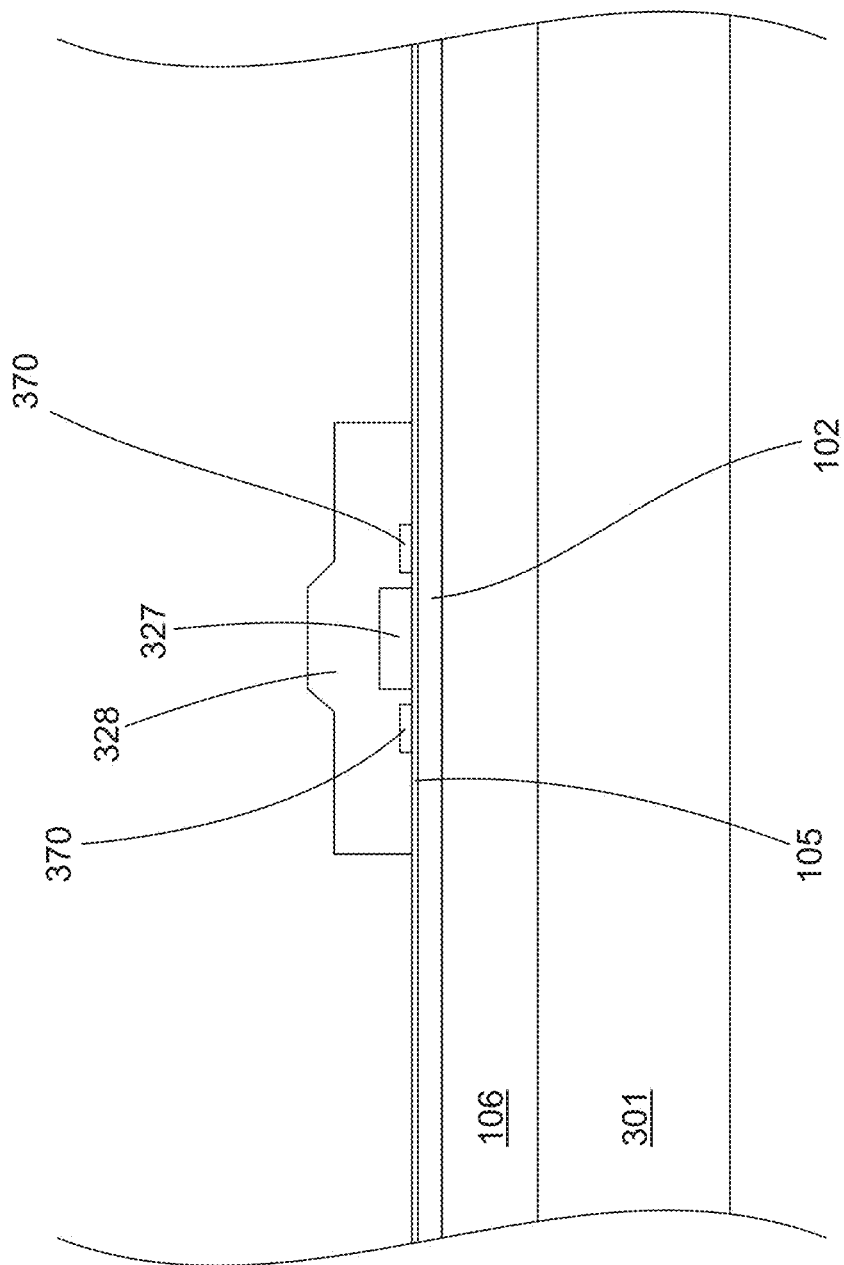
Figure 11C:
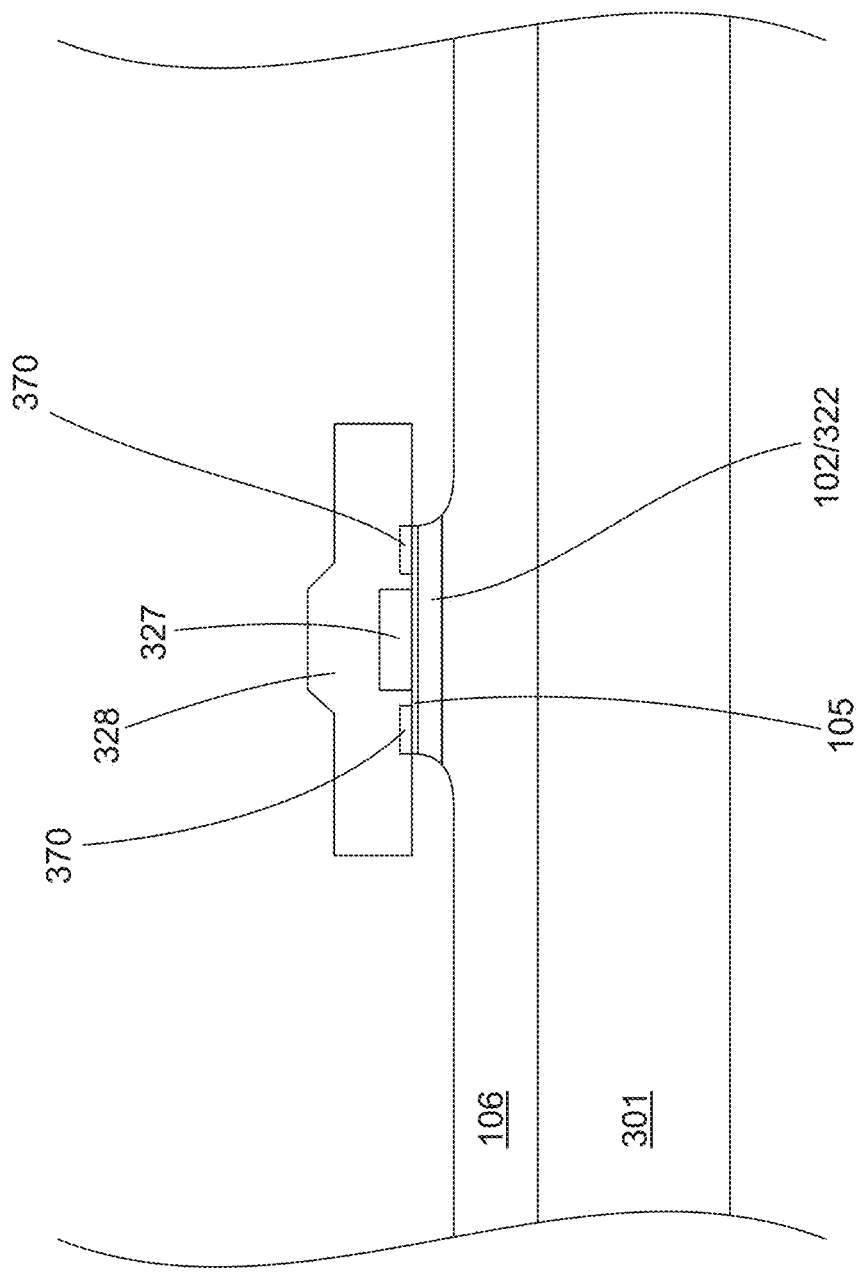
Figure 11D:
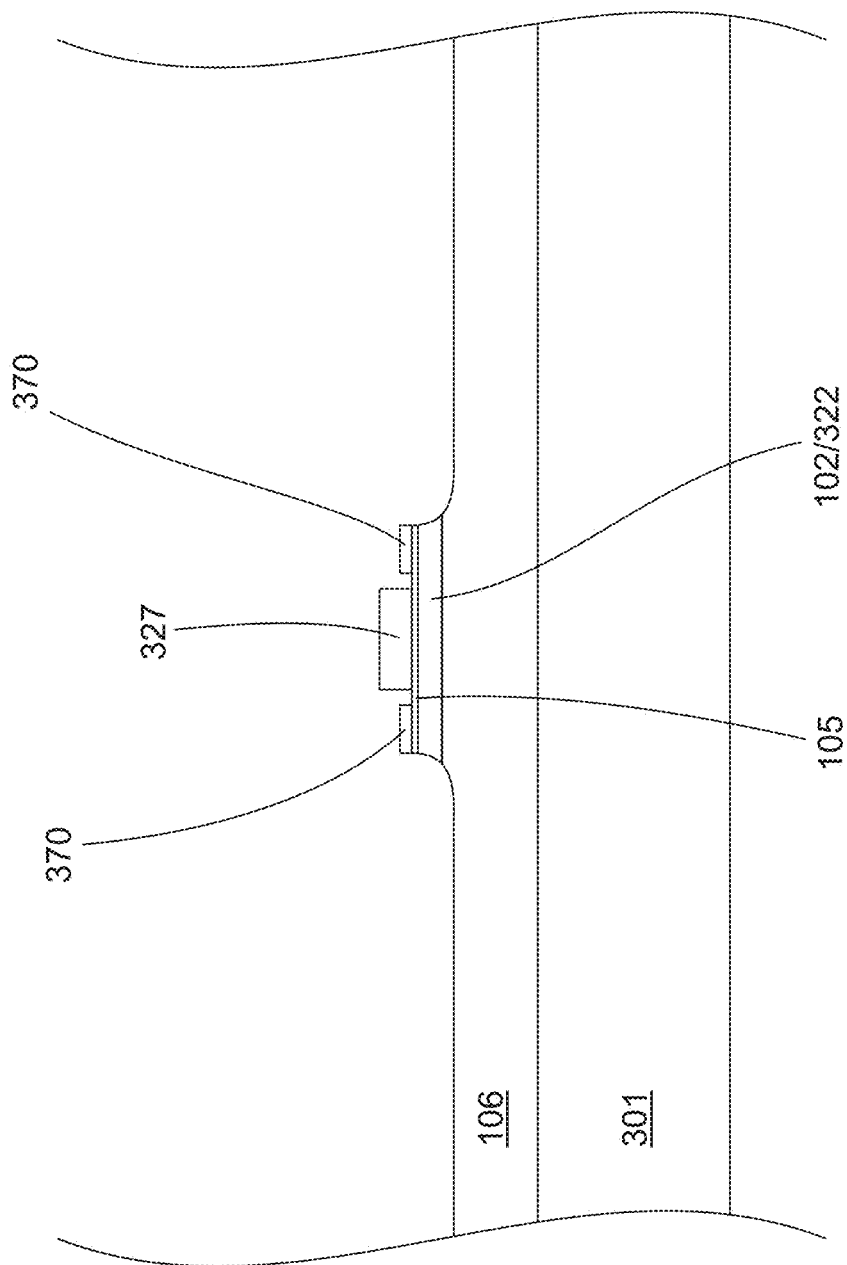
Figure 11E:
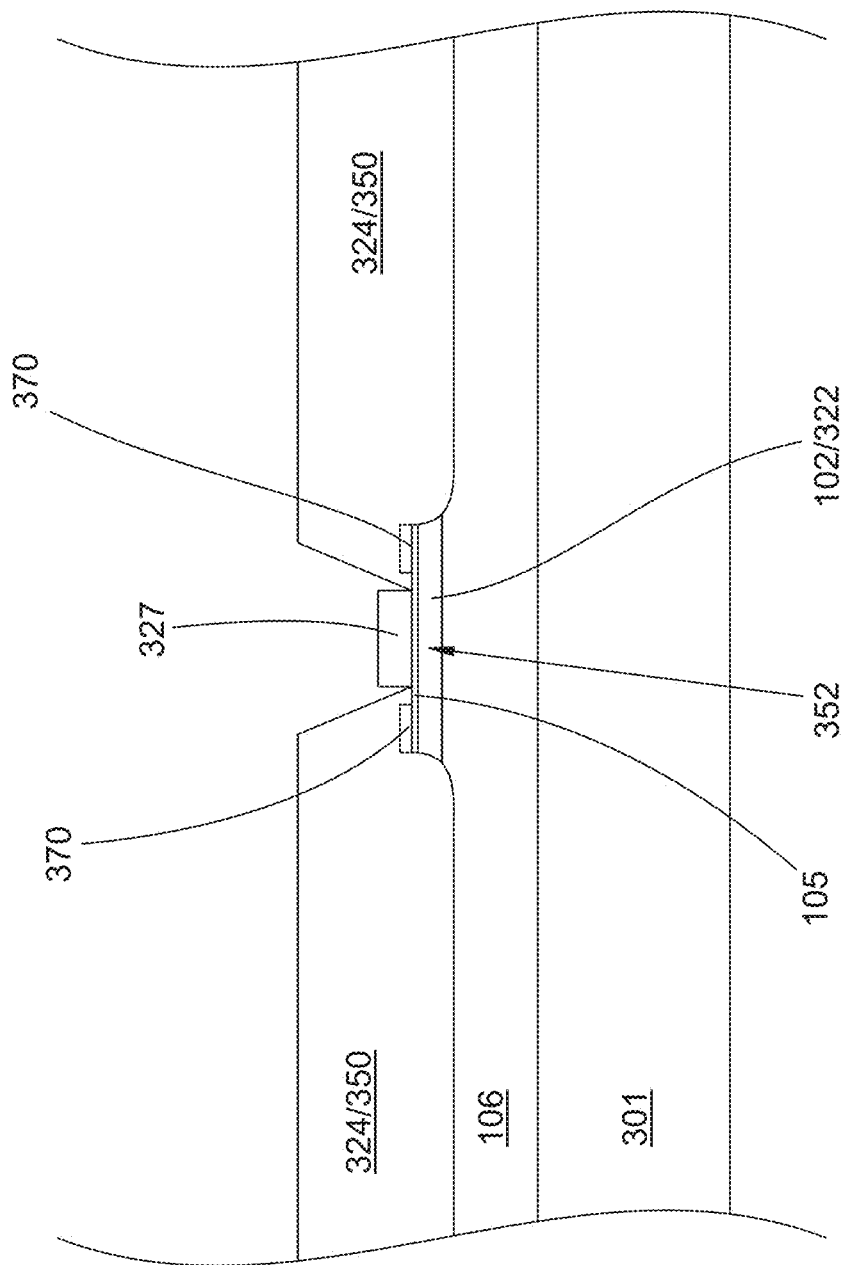
Figure 11F:
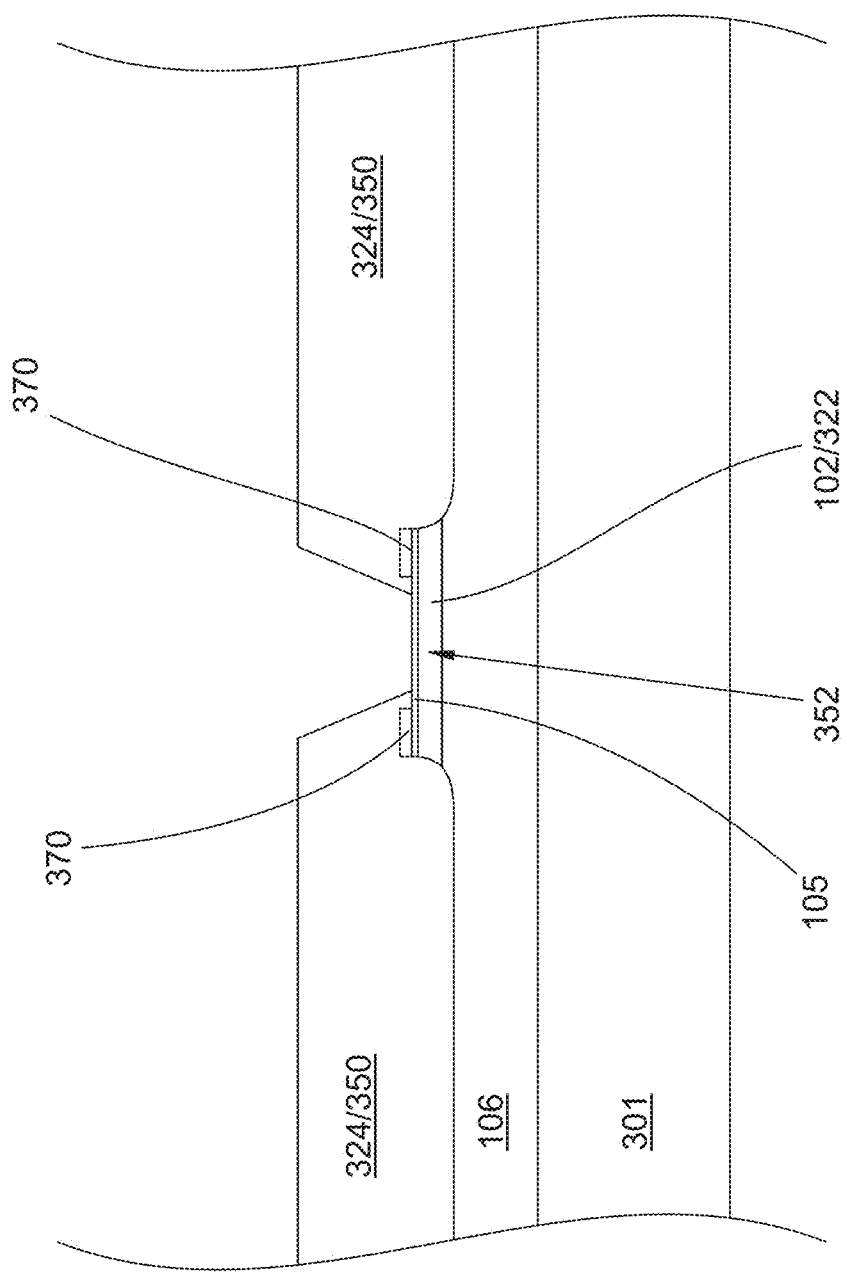
Figure 11G:
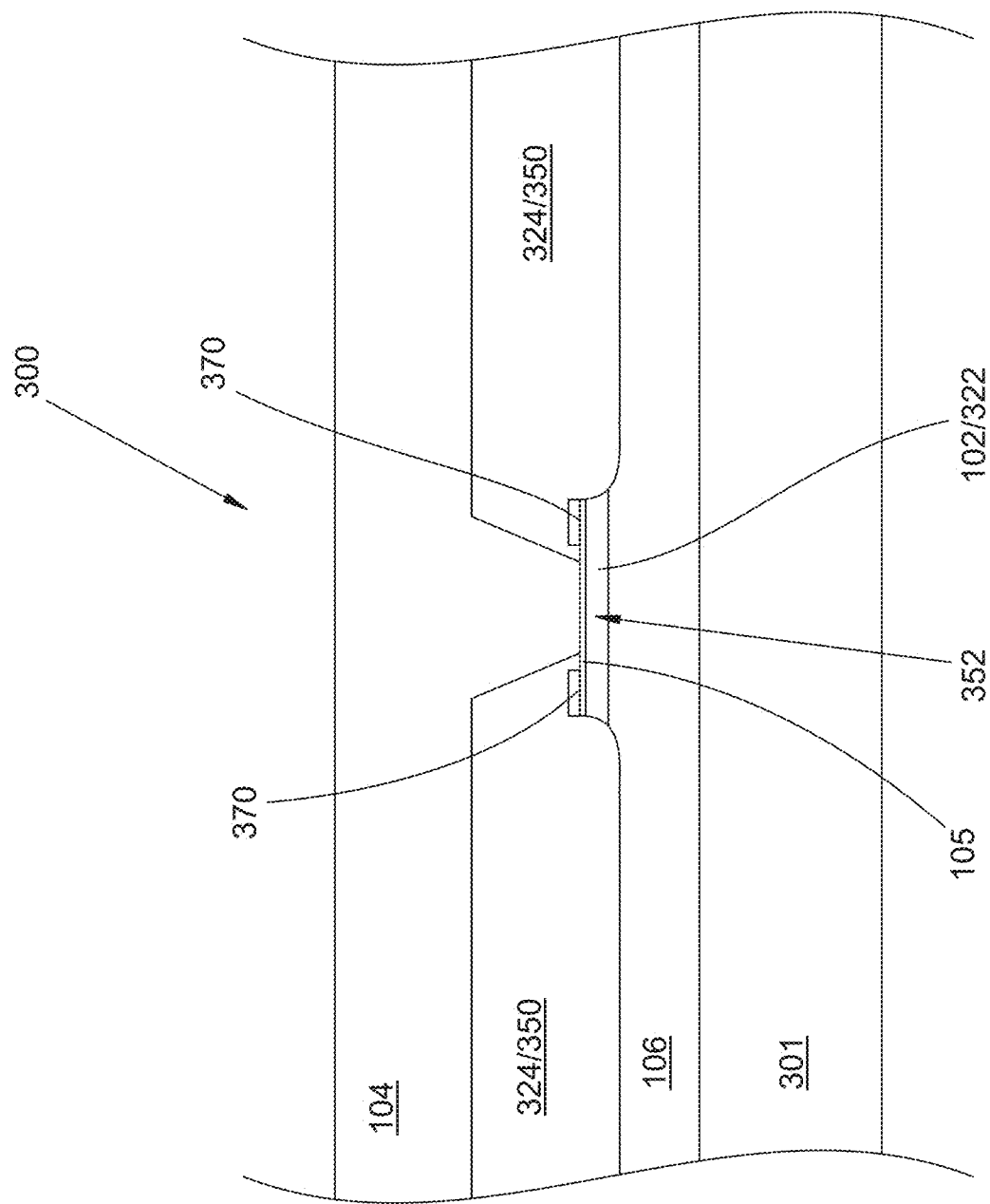

An example of a method for forming the example optical device of FIG. 7C (which includes a BHWG structure) is illustrated schematically in FIGS. 11A through 11G, and can begin with forming an elongated strip 322 of the active layer 102 on a first surface of a semiconductor wafer as described above. In examples wherein the higher-index strips 370 are absent, the method results in the optical device of FIG. 7A. FIGS. 11A through 11C are similar to FIGS. 10A through 10C, except that the thin p-doped layer 105 may or may not be present. In FIG. 11D the mask 328 has been removed. In FIG. 11E the lateral current-blocking layers 324 and the current restrictors 350 are formed in a single deposition step with the gap 352 between the current restrictors 350. The size of the mask 327 determines the size of the gap 352, and the strip 322 of the active layer 102 is wider than the gap 352. In this example the current-blocking layers 324 and the current restrictors 350 are semi-insulating semiconductor material. Instead of the masked deposition depicted, uniform deposition of the semi-insulating semiconductor material followed by spatially selective etching of the gap 352 can be employed. In FIG. 11F the mask 327 has been removed. In FIG. 11G the p-doped layer 104 is formed by any suitable growth or deposition technique; the material of the p-doped layer 104 fills the gap 352 and is in direct contact with the p-doped layer 105 (if present) or with the active layer 102. Any additional layers needed for, e.g., electrical contact or other purposes, can be formed on the p-doped layer 104.

Figure 8A:
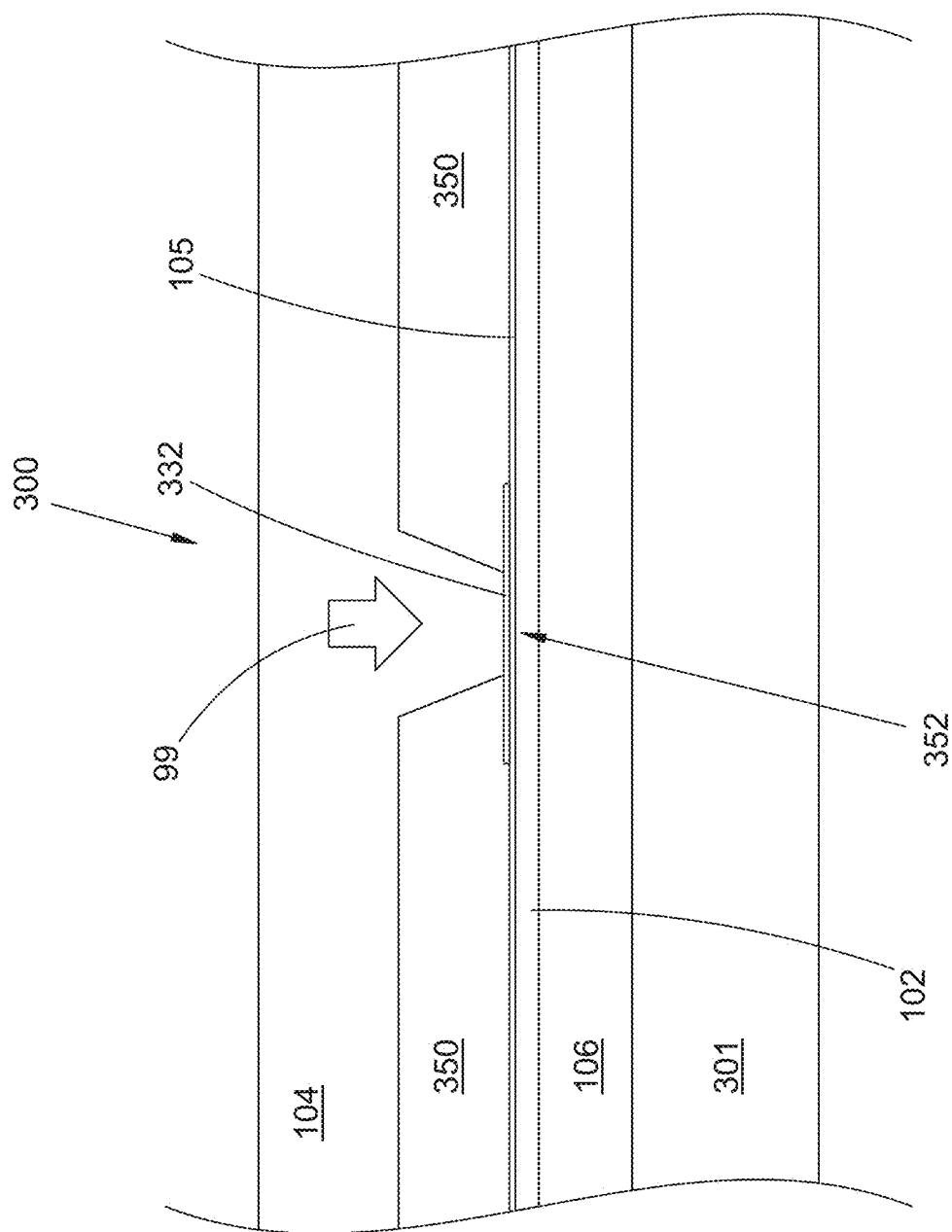
FIGS. 8A-8C are schematic transverse cross-sectional views of examples of inventive semiconductor waveguide optical gain devices that each include a planar buried ridge waveguide (PBRWG) structure.
Figure 8B:
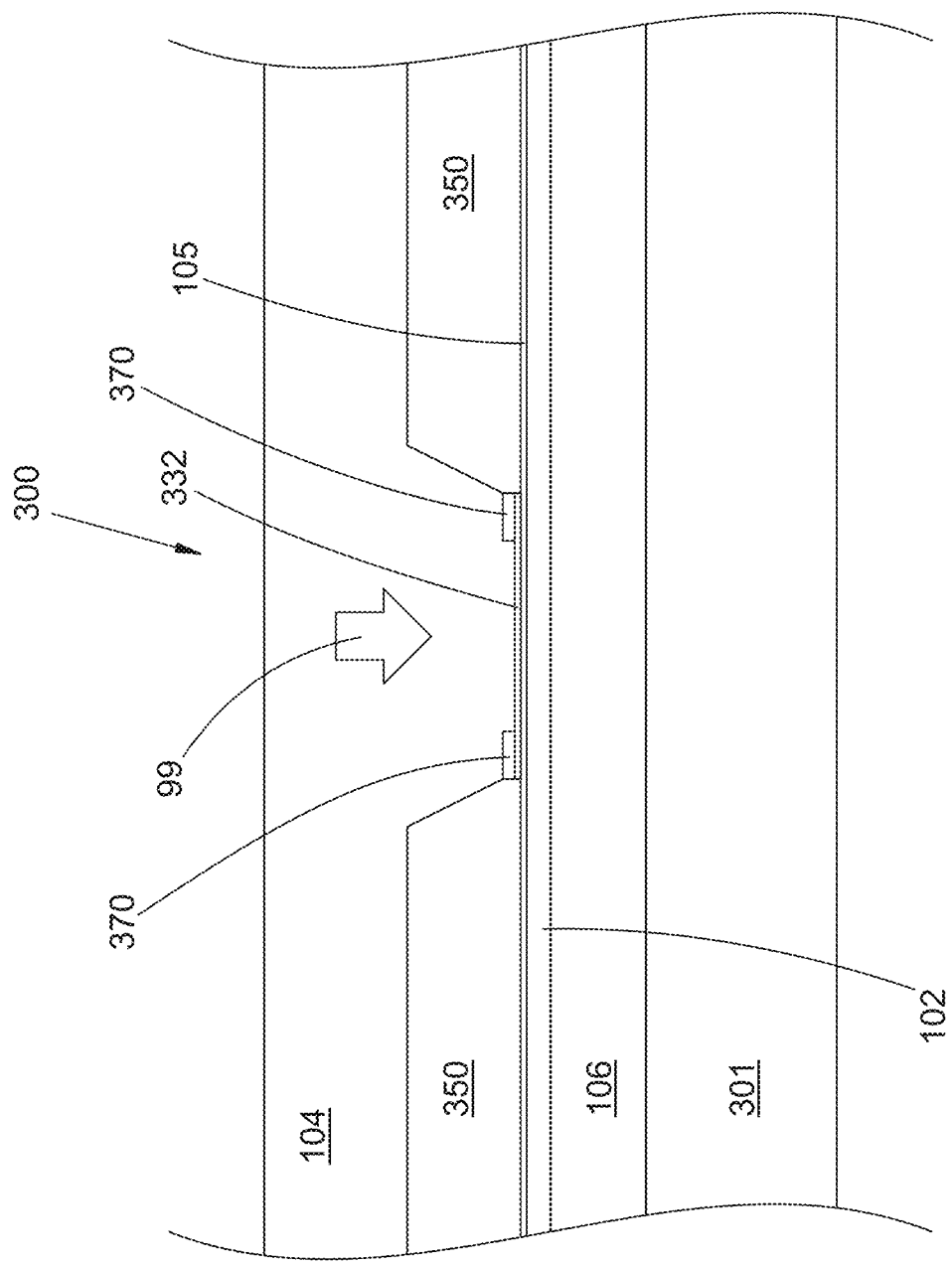
Figure 8C:
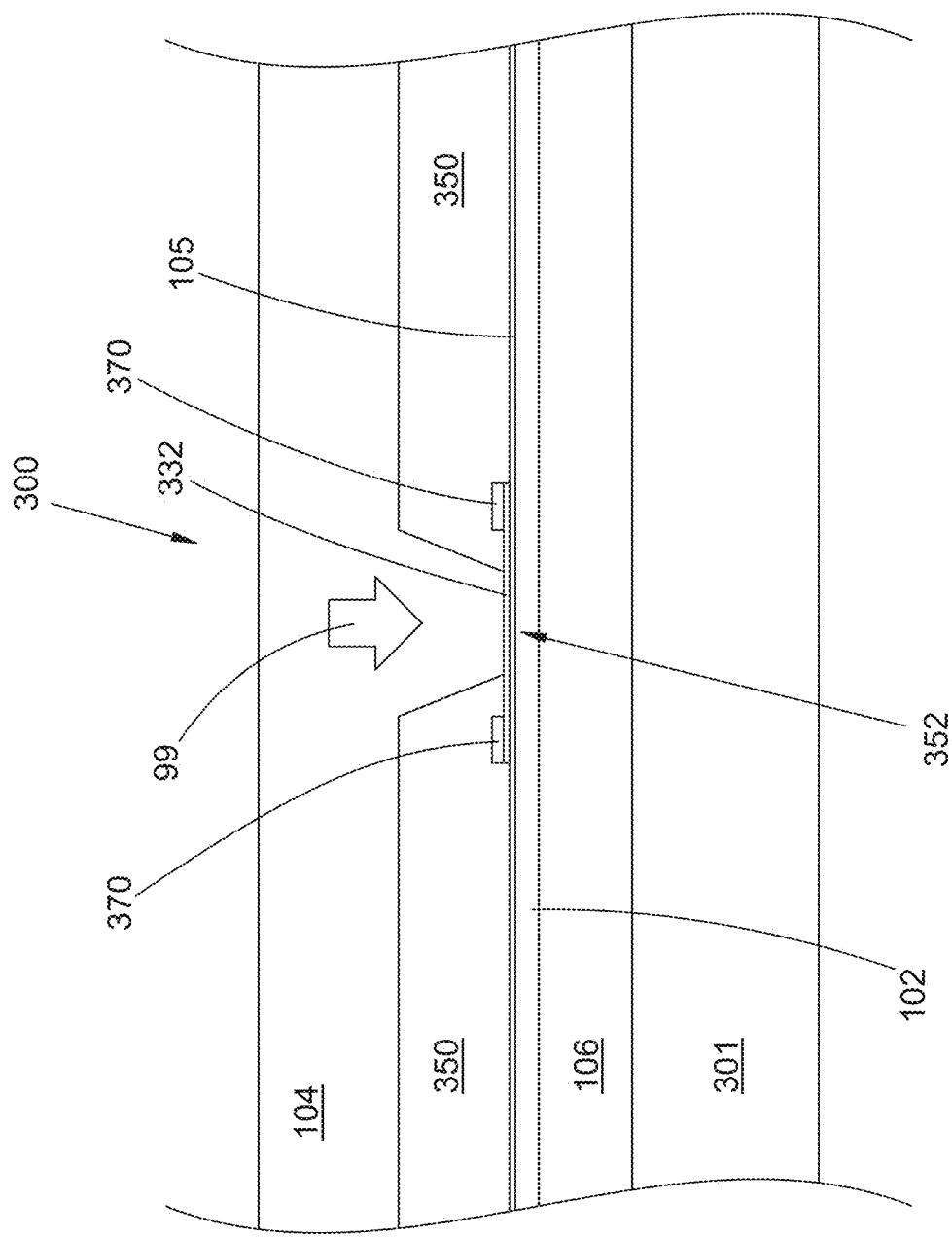
Figure 12C:
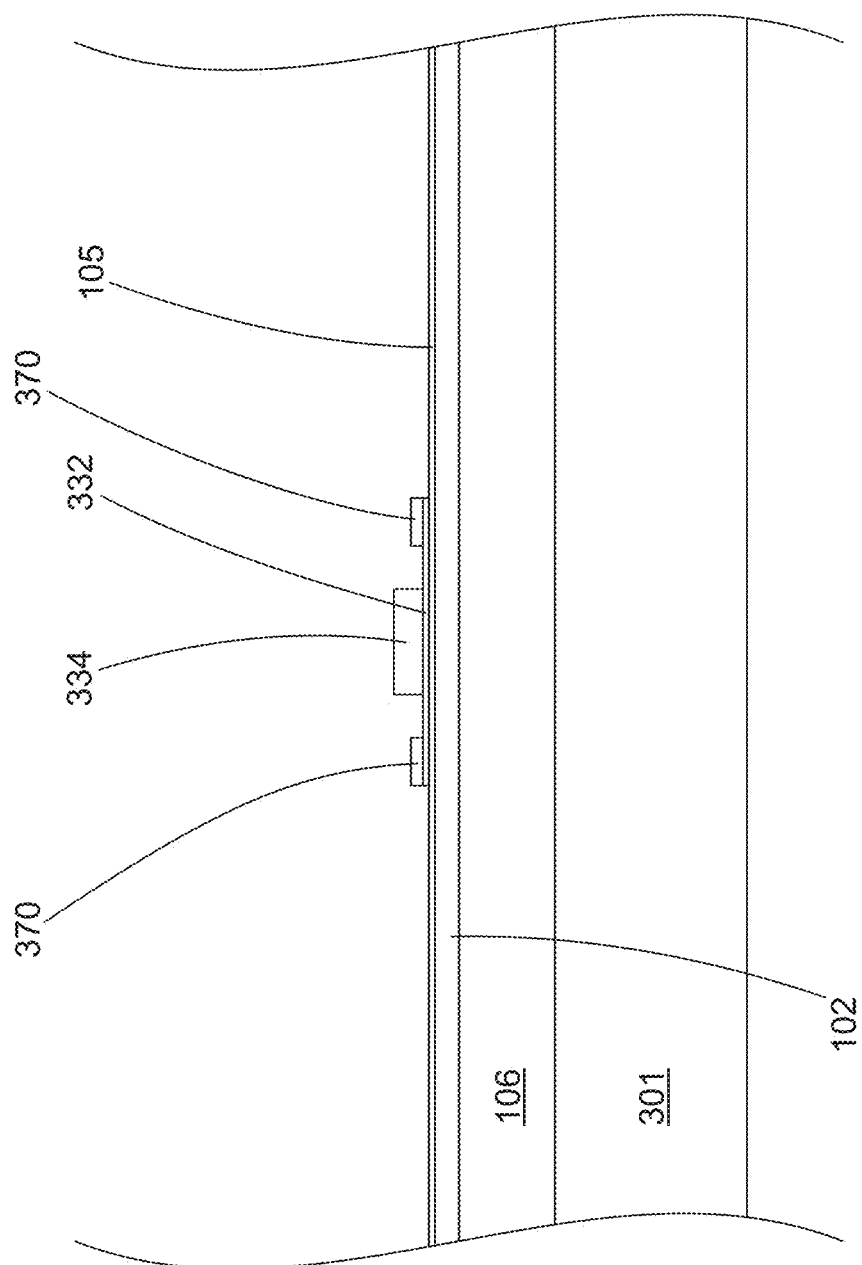
Figure 12D:
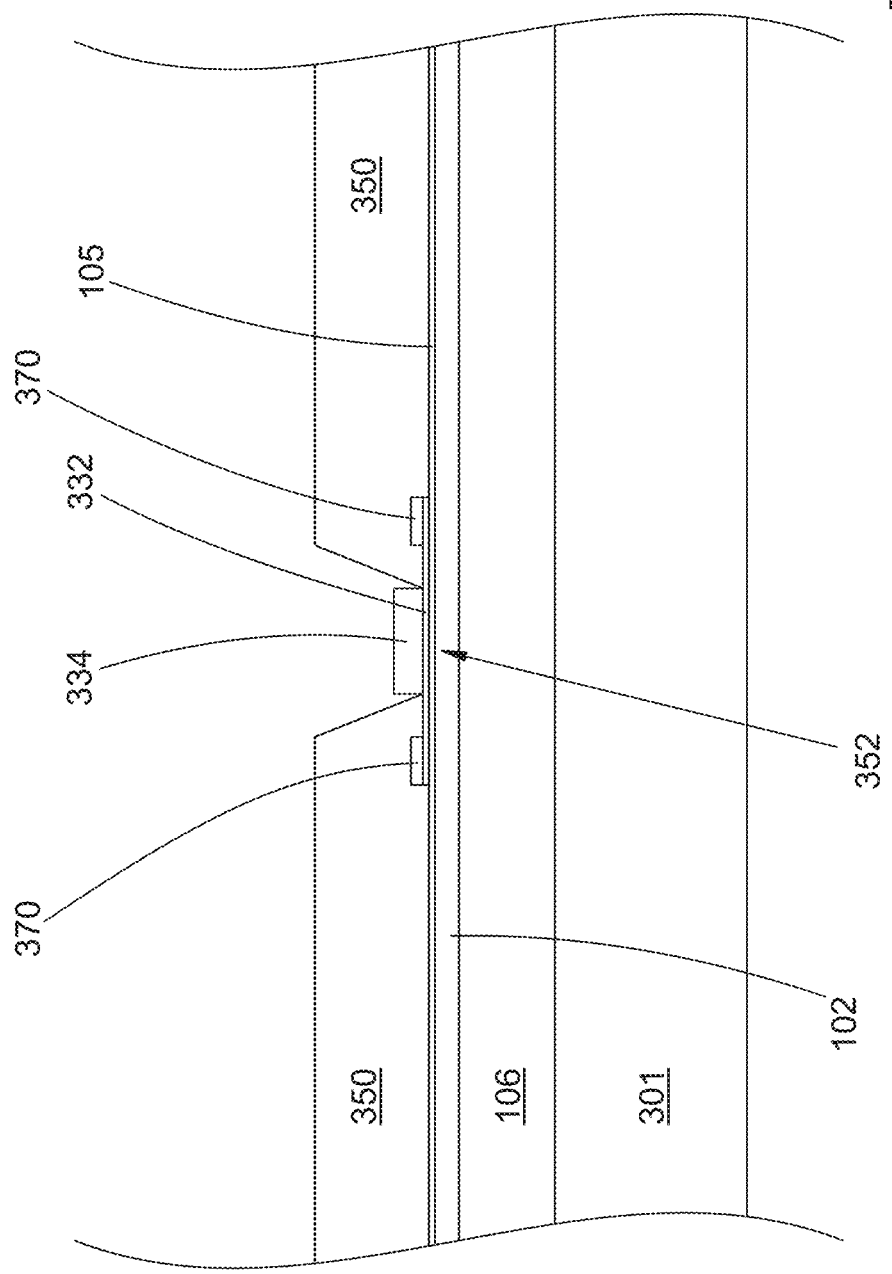
Figure 12E:
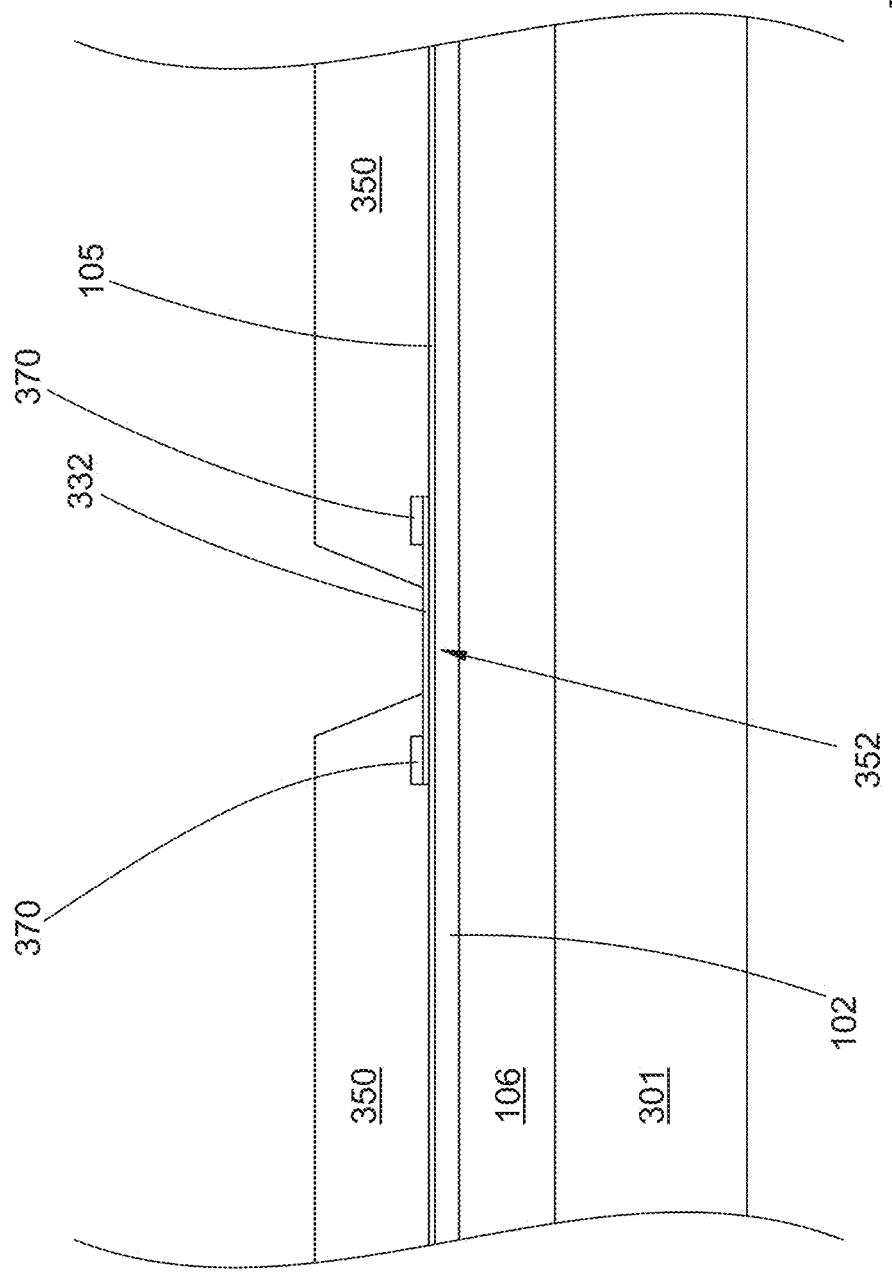
Figure 12G:
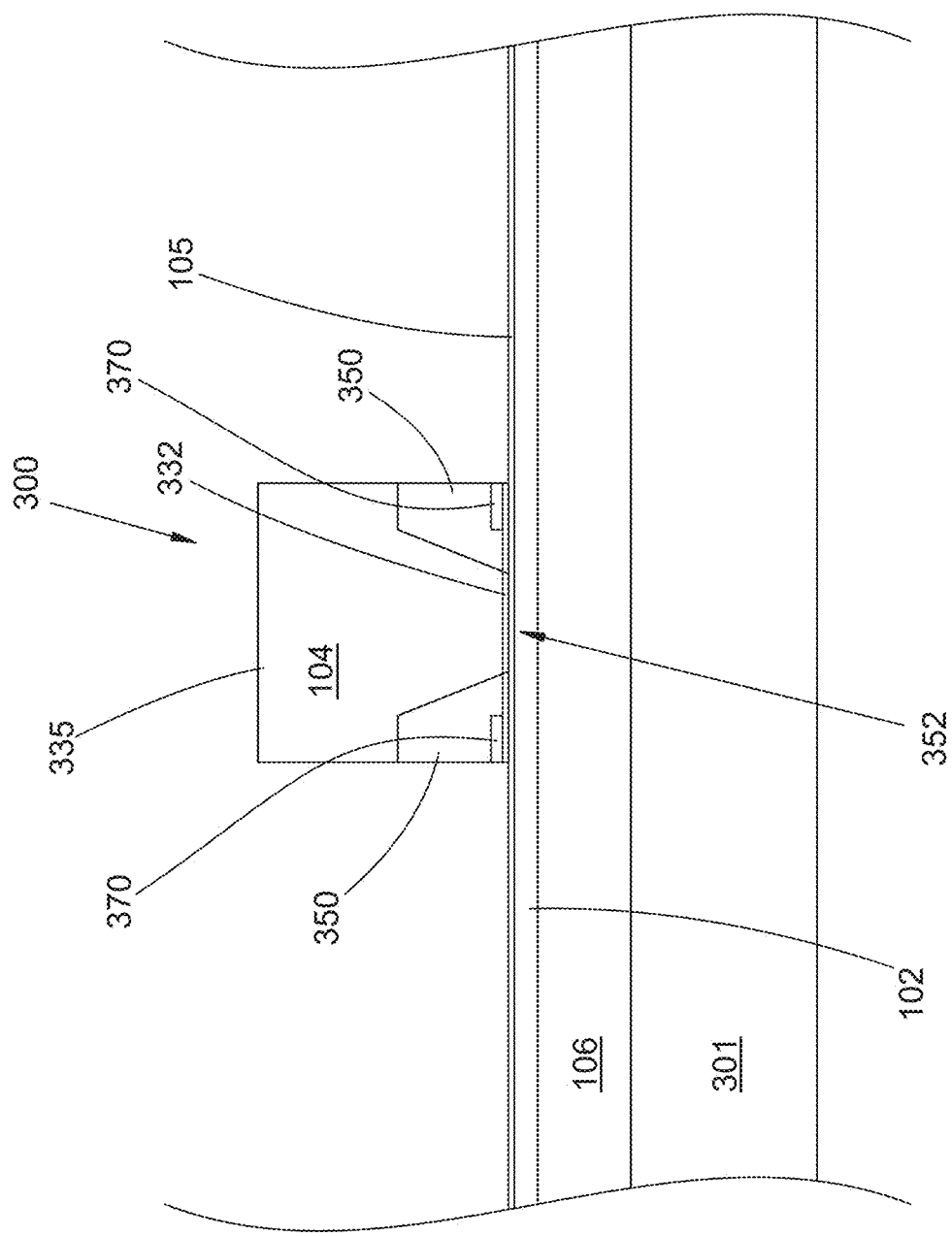

An example of a method for forming the example optical device of FIG. 8C is illustrated schematically in FIGS. 12A through 12G, and can begin with forming a higher-index strip 332 on a first surface of a semiconductor wafer. In FIG. 12A the wafer includes the n-doped layer 106, the active layer 102, the thin p-doped layer 105, and a layer 331 of the higher-index material. Masked etching of the higher-index layer 331 can be employed to yield the elongated strip 332 in FIG. 12B. Alternatively, spatially selective deposition of the higher-index material can be employed to form the strip 332. Those steps can include formation of the higher-index strips 370 (if present, and if the same material as the strip 332); alternatively, the strips 370 (if present) can be formed separately using any suitable spatially selective processing technique(s); in still other examples wherein the strips 370 are absent, the method yields a device as in FIG. 8A. In FIG. 12C a mask 334 is formed on the strip 332, and in FIG. 12D the current restrictors 350 are formed with the gap 352 between them. The size of the mask 334 determines the size of the gap 352; the strip 332 is wider than the gap 352. The current restrictors 350 can comprise n-doped semiconductor material (in which case the thin p-doped layer 105 is needed) or semi-insulating semiconductor material (in which case the thin p-doped layer 105 is optional). In FIG. 12E the mask 334 has been removed. In FIG. 12F the p-doped layer 014 has been formed and fills the gap 352 in direct contact with the p-doped layer 105 (if present) or with the active layer 102. Any additional layers needed for, e.g., electrical contact or other purposes, can be formed on the p-doped layer 104. The finished device can be arranged as in FIG. 12F; alternatively, the p-doped layer 104 can be etched to form a ridge 335, as in FIG. 12G.

In addition to the preceding, the following example embodiments fall within the scope of the present disclosure or appended claims. Any given Example below that refers to multiple preceding Examples shall be understood to refer to only those preceding Examples with which the given Example is not inconsistent, and to exclude implicitly those preceding Examples with which the given Example is inconsistent.

Example 1. An optical device comprising: (a) a substrate; (b) a bottom doped semiconductor layer on the substrate; (c) a top doped semiconductor layer on the bottom doped layer so that the bottom doped layer is between the substrate and the top doped layer, the top and bottom doped layers being of opposite n- or p-doping types; (d) a semiconductor active layer between the top and bottom doped layers, the active layer being arranged so as to emit light and exhibit optical gain at a nominal optical wavelength $\lambda_O$ through radiative recombination of charge carriers at the active layer resulting from forward-biased drive current flowing between the top and bottom doped layers through the active layer; (e) an optical waveguide structure including an optical gain section, the optical waveguide structure (i) defining lateral and longitudinal directions parallel to the top and bottom doped layers, and (ii) supporting one or more optical modes that spatially overlap portions of the bottom doped, top doped, and active layers in the optical gain section; and (f) one or more drive current structures that define a drive current path along which the drive current flows through the active layer in the optical gain section, (g) wherein the optical waveguide structure, the one or more drive current structures, or both, are positioned and arranged to result in a selected degree of spatial overlap between (i) a drive current lateral profile across the active layer in the optical gain section and (ii) a corresponding optical intensity lateral profile across the active layer in the optical gain section of a selected one of the one or more optical modes.

Example 2. The optical device of Example 1 wherein one or both of the optical waveguide structure or the one or more drive current structures are positioned and arranged to result in maximal degree of spatial overlap between (i) the drive current lateral profile across the active layer and (ii) the corresponding optical intensity lateral profile across the active layer of the selected one of the one or more optical modes.

Example 3. The optical device of any one of Examples 1 or 2 wherein the one or more drive current structures include one or more current restrictors arranged to form a longitudinal gap therebetween or therethrough, the gap being positioned along the optical waveguide structure and filled with doped semiconductor material, the one or more current restrictors being arranged so as to constrain the drive current to flow through the gap, width of the gap being less than width of the optical waveguide structure.

Example 4. The optical device of any one of Examples 1 or 2 wherein the optical waveguide structure includes a pair of longitudinal, laterally spaced-apart strips of higher-index semiconductor material positioned along the optical waveguide structure, the higher-index semiconductor material having a refractive index higher than refractive indices of the top and bottom doped layers, arrangement of the spaced-apart strips resulting in the corresponding optical intensity lateral profile across the active layer of the selected one of the one or more of the optical modes, the optical intensity lateral profile having a higher fraction of optical intensity within its full width at half maximum intensity (FWHM) compared to a corresponding mode of an otherwise identical reference optical waveguide structure that lacks the spaced-apart strips.

Example 5. The optical device of any one of Examples 1 or 2 wherein: (e') the one or more drive current structures include one or more current restrictors arranged to form a longitudinal gap therebetween or therethrough, the gap being positioned along the optical waveguide structure and filled with doped semiconductor material, the one or more current restrictors being arranged so as to constrain the drive current to flow through the gap, width of the gap being less than width of the optical waveguide structure; (f') the optical waveguide structure includes a pair of longitudinal, laterally spaced-apart strips of higher-index semiconductor material positioned along the optical waveguide structure, the higher-index semiconductor material having a refractive index higher than refractive indices of the top and bottom doped layers; and (g') the spaced-apart strips and the one or more current restrictors are positioned and arranged to result in the selected degree of spatial overlap between (i) the drive current lateral profile across the active layer and (ii) the corresponding optical intensity lateral profile across the active layer of the selected one of the one or more optical modes.

Example 6. The optical device of any one of Examples 1 through 5 wherein the optical waveguide structure includes one or more reflective or diffractive structures that define a laser resonator and the one or more supported optical modes are resonant optical modes of the laser resonator, so that the optical device is arranged as a semiconductor diode laser.

Example 7. The optical device of Example 6 wherein the optical waveguide structure includes at least one reflective end facet that at least partly defines the laser resonator.

Example 8. The optical device of Example 6 wherein the optical waveguide structure includes at least one distributed Bragg reflector (DBR) that at least partly defines the laser resonator.

Example 9. The optical device of Example 6 wherein the optical waveguide structure includes at least one waveguide grating that at least partly defines the laser resonator.

Example 10. The optical device of any one of Examples 1 through 5 wherein the optical waveguide structure defines a pair of optical ports positioned at corresponding positions along the optical waveguide structure with the one or more drive current structures therebetween, so that the optical device is arranged as a semiconductor optical amplifier.

Example 11. The optical device of any one of Examples 1 through 10 wherein the active layer includes one or more quantum wells, one or more multi-quantum wells, or a multitude of quantum dots.

Example 12. The optical device of any one of Examples 1 through 11 wherein the p-doped, n-doped, and active layers include one or more III-V semiconductor materials or compounds, alloys, or mixtures thereof.

Example 13. The optical device of any one of Examples 1 through 12 wherein the top doped layer is a p-doped layer and the bottom doped layer is an n-doped layer.

Example 14. The optical device of any one of Examples 1 through 12 wherein the top doped layer is an n-doped layer and the bottom doped layer is a p-doped layer.

Example 15. The optical device of any one of Examples 1 through 14 wherein (i) the optical waveguide structure is arranged as a ridge waveguide (RWG) structure that includes a longitudinal ridge that protrudes away from the substrate and the active layer, and (ii) the one or more drive current structures include at least a portion of the ridge, the ridge being arranged to enable drive current to flow therethrough and to define a portion of the drive current path.

Example 16. The optical device of Example 15 wherein the one or more drive current structures include one or more current restrictors formed on the active layer at a base of the RWG structure and arranged to form a longitudinal gap therebetween or therethrough, the gap being positioned along the RWG structure and filled with doped semiconductor material, the one or more current restrictors being arranged so as to constrain the drive current to flow through the gap, width of the gap being less than width of the RWG structure.

Example 17. The optical device of Example 15 wherein the optical waveguide structure includes a pair of longitudinal, laterally spaced-apart strips of higher-index semiconductor material positioned along the RWG structure at a base thereof, the higher-index semiconductor material having a refractive index higher than refractive indices of the top and bottom doped layers, arrangement of the spaced-apart strips resulting in the corresponding optical intensity lateral profile across the active layer of the selected one of the one or more of the optical modes, the optical intensity lateral profile having a higher fraction of optical intensity within its full width at half maximum intensity (FWHM) compared to a corresponding mode of an otherwise identical reference RWG structure that lacks the spaced-apart strips.

Example 18. The optical device of Example 15 wherein: (e') the one or more drive current structures include one or more current restrictors formed on the active layer at a base of the RWG structure and arranged to form a longitudinal gap therebetween or therethrough, the gap being positioned along the RWG structure and filled with doped semiconductor material, the one or more current restrictors being arranged so as to constrain the drive current to flow through the gap, width of the gap being less than width of the RWG structure; (f') the RWG structure includes a pair of longitudinal, laterally spaced-apart strips of higher-index semiconductor material positioned along the RWG structure at a base there, the higher-index semiconductor material having a refractive index higher than refractive indices of the top and bottom doped layers; and (g') the spaced-apart strips and the one or more current restrictors are positioned and arranged to result in the selected degree of spatial overlap between (i) the drive current lateral profile across the active layer and (ii) the corresponding optical intensity lateral profile across the active layer of the selected one of the one or more optical modes.

Example 19. The optical device of any one of Examples 15 through 18 wherein: (i) the longitudinal ridge is part of and protrudes from the top doped layer; (ii) the gap is filled with material of the top doped layer; and (iii) the one or more current restrictors are arranged as a pair of longitudinal strips of material positioned on the active layer along each side of the RWG structure and extending medially partly into the ridge, the longitudinal strips being laterally spaced apart by the gap.

Example 20. The optical device of Example 19 wherein (i) the one or more current restrictors include first doped semiconductor material of the same doping type as the bottom doped layer, and (ii) a second layer of semiconductor material of the same doping type as the top doped layer, sufficiently thin so as to prevent or restrict lateral flow of the laser drive current therethrough, separates the one or more current restrictors from the active layer, resulting in a reverse-biased p-n junction that prevents flow of the laser drive current through the one or more current restrictors into the active layer.

Example 21. The optical device of Example 19 wherein the one or more current restrictors include semi-insulating semiconductor material that prevents flow of the laser drive current through the one or more current restrictors into the active layer.

Example 22. The optical device of any one of Examples 1 through 14 wherein (i) the optical waveguide structure is arranged as a buried-heterostructure waveguide (BHWG) structure that includes in the optical gain section a longitudinal strip of the active layer between lateral current-blocking layers, and (ii) the one or more drive current structures include the lateral current-blocking layers that define a portion of the drive current path.

Example 23. The optical device of Example 22 wherein the one or more drive current structures include one or more current restrictors arranged to form a longitudinal gap therebetween or therethrough, the gap being positioned along the BHWG structure and filled with doped semiconductor material, the one or more current restrictors being arranged so as to constrain the drive current to flow through the gap, width of the gap being less than width of the BHWG structure.

Example 24. The optical device of Example 22 wherein the BHWG structure includes a pair of longitudinal, laterally spaced-apart strips of higher-index semiconductor material positioned along the BHWG structure, the higher-index semiconductor material having a refractive index higher than refractive indices of the top and bottom doped layers, arrangement of the spaced-apart strips resulting in the corresponding optical intensity lateral profile across the active layer of the selected one of the one or more of the optical modes, the optical intensity lateral profile having a higher fraction of optical intensity within its full width at half maximum intensity (FWHM) compared to a corresponding mode of an otherwise identical reference BHWG structure that lacks the spaced-apart strips.

Example 25. The optical device of Example 22 wherein: (e') the one or more drive current structures include one or more current restrictors arranged to form a longitudinal gap therebetween or therethrough, the gap being positioned along the BHWG structure and filled with doped semiconductor material, the one or more current restrictors being arranged so as to constrain the drive current to flow through the gap, width of the gap being less than width of the BHWG structure; (f') the optical waveguide structure includes a pair of longitudinal, laterally spaced-apart strips of higher-index semiconductor material positioned along the BHWG structure, the higher-index semiconductor material having a refractive index higher than refractive indices of the top and bottom doped layers; and (g') the spaced-apart strips and the one or more current restrictors are positioned and arranged to result in the selected degree of spatial overlap between (i) the drive current lateral profile across the active layer and (ii) the corresponding optical intensity lateral profile across the active layer of the selected one of the one or more optical modes.

Example 26. The optical device of any one of Examples 22 through 25 wherein: (i) the lateral current-blocking layers separate the bottom doped layer from the one or more current restrictors; (ii) the gap is filled with material of the top doped layer; and (iii) the one or more current restrictors extend medially partly between the active layer and portions of the top doped layer and are laterally spaced apart by the gap.

Example 27. The optical device of Example 26 wherein: (i) the lateral current-blocking layers include doped semiconductor material of the same doping type as the top doped layer and separate the one or more current restrictors from the bottom doped layer; (ii) a layer of doped semiconductor material, of the same doping type as the top doped layer and sufficiently thin so as to prevent or restrict lateral flow of the laser drive current therethrough, separates the one or more current restrictors from the active layer; and (iii) the one or more current restrictors include doped semiconductor material of the same doping type as the bottom doped layer, resulting in reverse-biased p-n junctions that prevent flow of the laser drive current through the one or more current restrictors into the active layer or into the bottom doped layer.

Example 28. The optical device of Example 26 wherein the one or more current restrictors include semi-insulating semiconductor material that prevents flow of the laser drive current through the one or more current restrictors into the active layer.

Example 29. The optical device of Example 26 wherein the lateral current-blocking layers and the one or more current restrictors form portions of a common layer of semi-insulating semiconductor material that prevents flow of laser drive current (i) through the lateral current-blocking layers into the bottom doped layer and (ii) through the one or more current restrictors into the active layer.

Example 30. The optical device of any one of Examples 1 through 14 wherein (i) the optical waveguide structure is arranged as a planar-buried-rib waveguide (PBRWG) structure that includes a longitudinal strip of higher-index semiconductor material on the active layer, the higher-index semiconductor material having a refractive index higher than refractive indices of the top and bottom doped layers, and (ii) the one or more drive current structures include lateral current-blocking layers that define a portion of the drive current path.

Example 31. The optical device of Example 30 wherein the one or more drive current structures include one or more current restrictors arranged to form a longitudinal gap therebetween or therethrough, the gap being positioned along the PBRWG structure and filled with doped semiconductor material, the one or more current restrictors being arranged so as to constrain the drive current to flow through the gap, width of the gap being less than width of the PBRWG structure.

Example 32. The optical device of Example 30 wherein the PBRWG structure includes a pair of longitudinal, laterally spaced-apart additional strips of a corresponding higher-index semiconductor material positioned along the PBRWG structure, the corresponding higher-index semiconductor material having a refractive index higher than refractive indices of the top and bottom doped layers, arrangement of the spaced-apart additional strips resulting in the corresponding optical intensity lateral profile across the active layer of the selected one of the one or more of the optical modes, the optical intensity lateral profile having a higher fraction of optical intensity within its full width at half maximum intensity (FWHM) compared to a corresponding mode of an otherwise identical reference PBRWG structure that lacks the spaced-apart additional strips.

Example 33. The optical device of Example 30 wherein: (e') the one or more drive current structures include one or more current restrictors arranged to form a longitudinal gap therebetween or therethrough, the gap being positioned along the PBRWG structure and filled with doped semiconductor material, the one or more current restrictors being arranged so as to constrain the drive current to flow through the gap, width of the gap being less than width of the PBRWG structure; (f') the optical waveguide structure includes a pair of longitudinal, laterally spaced-apart additional strips of a corresponding higher-index semiconductor material positioned along the PBRWG structure, the corresponding higher-index semiconductor material having a refractive index higher than refractive indices of the top and bottom doped layers; and (g') the spaced-apart additional strips and the one or more current restrictors are positioned and arranged to result in the selected degree of spatial overlap between (i) the drive current lateral profile across the active layer and (ii) the corresponding optical intensity lateral profile across the active layer of the selected one of the one or more optical modes.

Example 34. The optical device of any one of Examples 30 through 33 wherein: (i) the gap is filled with material of the top doped layer; and (ii) the one or more current restrictors extend medially partly between the active layer and portions of the top doped layer and are laterally spaced apart by the gap.

Example 35. The optical device of Example 34 wherein: (i) a layer of doped semiconductor material, of the same doping type as the top doped layer and sufficiently thin so as to prevent or restrict lateral flow of the laser drive current therethrough, separates the one or more current restrictors from the active layer; and (ii) the one or more current restrictors include doped semiconductor material of the same doping type as the bottom doped layer, resulting in reverse-biased p-n junctions that prevent flow of the laser drive current through the one or more current restrictors into the active layer.

Example 36. The optical device of Example 34 wherein the one or more current restrictors include semi-insulating semiconductor material that prevents flow of the laser drive current through the one or more current restrictors into the active layer.

Example 37. A method for making the optical device of any one of Examples 15 through 21, the method comprising: (A) forming a current-restricting layer on a first surface of a semiconductor wafer so that an elongated strip of the first wafer surface remains exposed within a gap through the current-restricting layer, the elongated strip defining longitudinal and lateral directions parallel to the wafer surface, wherein the semiconductor wafer includes a semiconductor active layer at the first wafer surface and a bottom doped semiconductor layer beneath and in contact with the active layer; (B) forming a top doped semiconductor layer on the current-restricting layer and on the first wafer surface within the gap, the top and bottom doped layers being of opposite doping types; and (C) etching through the top doped layer and the current-restricting layer to form a longitudinal ridge above the gap that is wider than the gap, wherein remaining unetched portions of the current-restricting layer form a pair of longitudinal strips positioned on the active layer along each side of the longitudinal ridge and extending medially partly into the longitudinal ridge, the longitudinal strips being laterally spaced apart by the gap.

Example 38. The method of Example 37 wherein: (i) the active layer is arranged so as to emit light and exhibit optical gain at a nominal laser wavelength $\lambda_0$ through radiative recombination of charge carriers at the active layer resulting from forward-biased laser drive current flowing between the top and bottom doped layers through the active layer; and (ii) the pair of longitudinal strips form a pair of spaced-apart current restrictors that are arranged so as to constrain the laser drive current to flow through the gap.

Example 39. The method of Example 38 wherein (i) the current-restricting layer includes doped semiconductor material of the same doping type as the bottom doped layer, (ii) the wafer surface includes a layer of doped semiconductor material of the same doping type as the top doped layer and sufficiently thin so as to prevent or restrict lateral flow of the laser drive current therethrough, and (iii) a portion of the top doped semiconductor layer of the wafer surface separates the one or more current restrictors from the active layer, resulting in a reverse-biased p-n junction that prevents flow of the laser drive current through the one or more current restrictors into the active layer.

Example 40. The method of Example 38 wherein the current restricting layer includes semi-insulating semiconductor material, so that the current restrictors prevent flow of the laser drive current through the one or more current restrictors into the active layer.

Example 41. A method for making the optical device of any one of Examples 22 through 29, the method comprising: (A) forming an elongated strip of a semiconductor active layer on a bottom doped semiconductor layer on a first surface of a semiconductor wafer, the elongated strip defining longitudinal and lateral directions parallel to the wafer surface; (B) forming lateral current-blocking layers on the first wafer surface with the elongated strip of the active layer between the lateral current-blocking layers; (C) forming a current-restricting layer on the first surface of the semiconductor wafer so that a medial portion of the elongated strip of the active layer remains exposed within a gap through the current-restricting layer, the strip being wider than the gap; and (D) forming a top doped semiconductor layer on the current-restricting layer and on the strip of the active layer within the gap, the top and bottom doped layers being of opposite doping types.

Example 42. The method of Example 41 wherein: (i) the active layer is arranged so as to emit light and exhibit optical gain at a nominal laser wavelength $\lambda_O$ through radiative recombination of charge carriers at the active layer resulting from forward-biased laser drive current flowing between the top and bottom doped layers through the active layer; and (ii) the current-restricting layer with the gap therethrough forms spaced-apart current restrictors that are arranged so as to constrain the laser drive current to flow through the gap.

Example 43. The method of Example 42 wherein: (i) the current-restricting layer includes doped semiconductor material of the same doping type as the bottom doped layer; (ii) the lateral current-blocking layer includes doped semiconductor material of the same doping type as the top doping layer; (iii) a layer of doped semiconductor material, of the same doping type as the top doped layer and sufficiently thin so as to prevent or restrict lateral flow of the laser drive current therethrough, separates the current restrictors from the active layer; and (iv) resulting reverse-biased p-n junctions, between the current restrictors and each of the lateral current-blocking layers and the thin doped material, prevents flow of the laser drive current through the one or more current restrictors into the active layer.

Example 44. The method of Example 42 wherein the lateral current-blocking layers and the current-restricting layer include semi-insulating semiconductor material, so that the current restrictors prevent flow of the laser drive current through the one or more current restrictors into the active layer.

Example 45. A method for making the optical device of any one of Examples 30 through 36, the method comprising: (A) forming an elongated strip of a higher-index doped semiconductor material on a first surface of a semiconductor wafer, the elongated strip defining longitudinal and lateral directions parallel to the wafer surface, wherein the semiconductor wafer includes a semiconductor active layer at the first wafer surface and bottom doped semiconductor layer beneath and in contact with the active layer, the higher-index doped material and the bottom doped layer being of opposite doping types; (B) forming a current-restricting layer on the first surface of the semiconductor wafer so that a medial portion of the elongated strip of the higher-index p-doped material remains exposed within a gap through the current-restricting layer, the strip being wider than the gap; and (C) forming a top doped semiconductor layer on the current-restricting layer and on the strip of the higher-index doped material within the gap, the top and bottom doped layers begin of opposite doping types.

Example 46. The method of Example 45 wherein: (i) the active layer is arranged so as to emit light and exhibit optical gain at a nominal laser wavelength $\lambda_O$ through radiative recombination of charge carriers at the active layer resulting from forward-biased laser drive current flowing between the top and bottom doped layers through the active layer; and (ii) the current-restricting layer with the gap therethrough forms spaced-apart current restrictors that are arranged so as to constrain the laser drive current to flow through the gap.

Example 47. The method of Example 45 wherein (i) the current-restricting layer includes doped semiconductor material of the same doping type as the bottom doped layer, (ii) the wafer surface includes a layer of doped semiconductor material of the same doping type as the top doped layer and sufficiently thin so as to prevent or restrict lateral flow of the laser drive current therethrough, and (iii) a portion of the top doped semiconductor layer of the wafer surface separates the one or more current restrictors from the active layer, resulting in a reverse-biased p-n junction that prevents flow of the laser drive current through the one or more current restrictors into the active layer.

Example 48. The method of Example 45 wherein the current restricting layer includes semi-insulating semiconductor material, so that the current restrictors prevent flow of the laser drive current through the one or more current restrictors into the active layer.

This disclosure is illustrative and not limiting. Further modifications will be apparent to one skilled in the art in light of this disclosure and are intended to fall within the scope of the present disclosure or appended claims. It is intended that equivalents of the disclosed example embodiments and methods, or modifications thereof, shall fall within the scope of the present disclosure or appended claims.

In the foregoing Detailed Description, various features may be grouped together in several example embodiments for the purpose of streamlining the disclosure. This method of disclosure is not to be interpreted as reflecting an intention that any claimed embodiment requires more features than are expressly recited in the corresponding claim. Rather, as the appended claims reflect, inventive subject matter may lie in less than all features of a single disclosed example embodiment. Therefore, the present disclosure shall be construed as implicitly disclosing any embodiment having any suitable subset of one or more features-which features are shown, described, or claimed in the present application-including those subsets that may not be explicitly disclosed herein. A "suitable" subset of features includes only features that are neither incompatible nor mutually exclusive with respect to any other feature of that subset. Accordingly, the appended claims are hereby incorporated in their entirety into the Detailed Description, with each claim standing on its own as a separate disclosed embodiment. In addition, each of the appended dependent claims shall be interpreted, only for purposes of disclosure by said incorporation of the claims into the Detailed Description, as if written in multiple dependent form and dependent upon all preceding claims with which it is not inconsistent. It should be further noted that the cumulative scope of the appended claims can, but does not necessarily, encompass the whole of the subject matter disclosed in the present application.

The following interpretations shall apply for purposes of the present disclosure and appended claims. The words "comprising," "including," "having," and variants thereof, wherever they appear, shall be construed as open ended terminology, with the same meaning as if a phrase such as "at least" were appended after each instance thereof, unless explicitly stated otherwise. The article "a" shall be interpreted as "one or more" unless "only one," "a single," or other similar limitation is stated explicitly or is implicit in the particular context; similarly, the article "the" shall be interpreted as "one or more of the" unless "only one of the," "a single one of the," or other similar limitation is stated explicitly or is implicit in the particular context. The conjunction "or" is to be construed inclusively unless: (i) it is explicitly stated otherwise, e.g., by use of "either . . . or," "only one of," or similar language; or (ii) two or more of the listed alternatives are understood or disclosed (implicitly or explicitly) to be incompatible or mutually exclusive within the particular context. In that latter case, "or" would be understood to encompass only those combinations involving non-mutually-exclusive alternatives. In one example, each of "a dog or a cat," "one or more of a dog or a cat," and "one or more dogs or cats" would be interpreted as one or more dogs without any cats, or one or more cats without any dogs, or one or more of each.

For purposes of the present disclosure or appended claims, when a numerical quantity is recited (with or without terms such as "about," "about equal to," "substantially equal to," "greater than about," "less than about," and so forth), standard conventions pertaining to measurement precision, rounding error, and significant digits shall apply, unless a differing interpretation is explicitly set forth, or if a differing interpretation is implicit or inherent (e.g., some small integer quantities). For null quantities described by phrases such as "equal to zero," "absent," "eliminated," "negligible," "prevented," and so forth (with or without terms such as "about," "substantially," and so forth), each such phrase shall denote the case wherein the quantity in question has been reduced or diminished to such an extent that, for practical purposes in the context of the intended operation or use of the disclosed or claimed apparatus or method, the overall behavior or performance of the apparatus or method does not differ from that which would have occurred had the null quantity in fact been completely removed, exactly equal to zero, or otherwise exactly nulled. Terms such as "parallel," "perpendicular," "orthogonal," "flush," "aligned," and so forth shall be similarly interpreted (with or without terms such as "about," "substantially," and so forth).

For purposes of the present disclosure and appended claims, any labelling of elements, steps, limitations, or other portions of an embodiment, example, or claim (e.g., first, second, third, etc., (a), (b), (c), etc., or (i), (ii), (iii), etc.) is only for purposes of clarity, and shall not be construed as implying any sort of ordering or precedence of the portions so labelled. If any such ordering or precedence is intended, it will be explicitly recited in the embodiment, example, or claim or, in some instances, it will be implicit or inherent based on the specific content of the embodiment, example, or claim. In the appended claims, if the provisions of 35 USC § 112 (f) are desired to be invoked in an apparatus claim, then the word "means" will appear in that apparatus claim. If those provisions are desired to be invoked in a method claim, the words "a step for" will appear in that method claim. Conversely, if the words "means" or "a step for" do not appear in a claim, then the provisions of 35 USC § 112 (f) are not intended to be invoked for that claim.

If any one or more disclosures are incorporated herein by reference and such incorporated disclosures conflict in part or whole with, or differ in scope from, the present disclosure, then to the extent of conflict, broader disclosure, or broader definition of terms, the present disclosure controls. If such incorporated disclosures conflict in part or whole with one another, then to the extent of conflict, the later-dated disclosure controls.

The Abstract is provided as required as an aid to those searching for specific subject matter within the patent literature. However, the Abstract is not intended to imply that any elements, features, or limitations recited therein are necessarily encompassed by any particular claim. The scope of subject matter encompassed by each claim shall be determined by the recitation of only that claim.

What is claimed is:

1. An optical device comprising:
    (a) a substrate;
    (b) a bottom doped semiconductor layer on the substrate;
    (c) a top doped semiconductor layer on the bottom doped layer so that the bottom doped layer is between the substrate and the top doped layer, the top and bottom doped layers being of opposite n- or p-doping types;
    (d) a semiconductor active layer between the top and bottom doped layers, the active layer being arranged so as to emit light and exhibit optical gain at a nominal optical wavelength $\lambda_0$ through radiative recombination of charge carriers at the active layer resulting from forward-biased drive current flowing between the top and bottom doped layers through the active layer;
    (e) an optical waveguide structure including an optical gain section, the optical waveguide structure (i) defining lateral and longitudinal directions parallel to the top and bottom doped layers, (ii) supporting one or more optical modes that spatially overlap portions of the bottom doped, top doped, and active layers in the optical gain section, and (iii) being arranged as a planar-buried-rib waveguide (PBRWG) structure that includes a central longitudinal strip of higher-index semiconductor material on the active layer, the higher-index semiconductor material having a refractive index higher than refractive indices of the top and bottom doped layers;
    (f) a pair of longitudinal, laterally spaced-apart strips of higher-index semiconductor material positioned along the PBRWG structure, the higher-index semiconductor material having a refractive index higher than refractive indices of the top and bottom doped layers, arrangement of the spaced-apart strips resulting in a corresponding optical intensity lateral profile across the active layer of a selected one of the one or more of the optical modes, the optical intensity lateral profile having a higher fraction of optical intensity within its full width at half maximum intensity (FWHM) compared to a corresponding mode of an otherwise identical reference PBRWG structure that lacks the spaced-apart strips; and
    (g) one or more drive current structures that define a drive current path along which the drive current flows through the active layer in the optical gain section, the one or more drive current structures including one or more current restrictors that are formed from lateral current-blocking layers that (i) extend laterally between the top and active layers, (ii) extend medially only to lateral edges of the central longitudinal strip, and (iii) are arranged to form a longitudinal gap therebetween or therethrough, the gap being positioned along the PBRWG structure and filled with doped semiconductor material, the one or more current restrictors being arranged so as to constrain the drive current to flow through the gap, width of the gap being no less than width of the central longitudinal strip of the PBRWG structure, (h) wherein the optical waveguide structure, the one or more drive current structures, or both, are positioned and arranged to result in a selected degree of spatial overlap between (i) a drive current lateral profile across the active layer in the optical gain section and (ii) the corresponding optical intensity lateral profile across the active layer in the optical gain section of the selected one of the one or more optical modes.

2. The optical device of claim 1 wherein one or both of the optical waveguide structure or the one or more drive current structures are positioned and arranged to result in a maximal degree of spatial overlap between (i) the drive current lateral profile across the active layer and (ii) the corresponding optical intensity lateral profile across the active layer of the selected one of the one or more optical modes.

3. The optical device of claim 1 wherein the PBRWG structure includes one or more reflective or diffractive structures that define a laser resonator and the one or more supported optical modes are resonant optical modes of the laser resonator, so that the optical device is arranged as a semiconductor diode laser.

4. The optical device of claim 1 wherein the PBRWG structure defines a pair of optical ports positioned at corresponding positions along the PBRWG structure with the one or more drive current structures therebetween, so that the optical device is arranged as a semiconductor optical amplifier.

5. The optical device of claim 3 wherein the PBRWG structure includes at least one distributed Bragg reflector (DBR) that at least partly defines the laser resonator.

6. The optical device of claim 3 wherein the PBRWG structure includes at least one waveguide grating that at least partly defines the laser resonator.

7. The optical device of claim 1 wherein the active layer includes one or more quantum wells, one or more multi-quantum wells, or a multitude of quantum dots.

8. The optical device of claim 1 wherein the top doped, bottom doped, and active layers include one or more III-V semiconductor materials or compounds, alloys, or mixtures thereof.

9. The optical device of claim 1 wherein the gap is filled with material of the top doped layer.

10. The optical device of claim 1 wherein (i) the one or more current restrictors include first doped semiconductor material of the same doping type as the bottom doped layer, and (ii) a second layer of doped semiconductor material, of the same doping type as the top doped layer and sufficiently thin so as to prevent or restrict lateral flow of the laser drive current therethrough, separates the one or more current restrictors from the active layer, resulting in reverse-biased p-n junctions that prevent flow of the laser drive current through the one or more current restrictors between the top and bottom doped layers.

11. The optical device of claim 1 wherein the one or more current restrictors include semi-insulating semiconductor material that prevents flow of the laser drive current through the one or more current restrictors between the top and bottom doped layers.

12. A method for making the optical device of claim 1, the method comprising:

(A) forming the central longitudinal strip of higher-index semiconductor material on a first surface of the substrate, the central longitudinal strip defining the longitudinal and lateral directions parallel to the substrate surface, wherein the substrate includes the semiconductor active layer at the first surface of the substrate and the bottom doped semiconductor layer beneath and in contact with the active layer;

(B) forming the pair of longitudinal, laterally spaced-apart strips of higher-index semiconductor material on the first surface of the substrate or on the central longitudinal strip;

(C) forming the lateral current-restricting layers on the first surface of the substrate so that an elongated portion of the central longitudinal strip remains exposed within the gap through the current-restricting layer; and (D) forming the top doped semiconductor layer on the current-restricting layer and on the central longitudinal strip within the gap.

13. A method for making an optical device, the method comprising:

(A) forming a central longitudinal strip of higher-index semiconductor material on a first surface of a substrate, the central longitudinal strip defining longitudinal and lateral directions parallel to the first substrate surface, wherein the substrate includes a semiconductor active layer at the first substrate surface and a bottom doped semiconductor layer beneath and in contact with the active layer;

(B) forming a pair of longitudinal, laterally spaced-apart strips of higher-index semiconductor material on the first surface of the substrate or on the central longitudinal strip;

(C) forming one or more current-restricting layers on the first surface of the substrate so that the central longitudinal strip remains exposed within a longitudinal gap between or through the one or more current-restricting layers, width of the gap being no less than width of the central longitudinal strip; and (D) forming a top doped semiconductor layer on the one or more current-restricting layers and on the central longitudinal strip within the gap, wherein the top and bottom doped layers are of opposite n- or p-doping types, and wherein the higher-index semiconductor materials of the central longitudinal strip and the pair of spaced-apart strips have refractive indices higher than refractive indices of the top and bottom doped layers, wherein:

(E) the semiconductor active layer is arranged so as to emit light and exhibit optical gain at a nominal optical wavelength $\lambda_0$ through radiative recombination of charge carriers at the active layer resulting from forward-biased drive current flowing between the top and bottom doped layers through the active layer;

(F) the central longitudinal strip, the active layer, the pair of strips, and the bottom doped layer form an optical waveguide structure, including an optical gain section thereof, arranged as a planar-buried-rib waveguide (PBRWG) that supports one or more optical modes that spatially overlap portions of the bottom doped, top doped, and active layers in the optical gain section, arrangement of the pair of strips resulting in a corresponding optical intensity lateral profile across the active layer of a selected one of the one or more of the optical modes that has a higher fraction of optical intensity within its full width at half maximum intensity (FWHM) compared to a corresponding mode of an otherwise identical reference PBRWG structure that lacks the pair of strips of higher-index semiconductor material;

(G) the one or more current-restricting layers form one or more drive current structures that include one or more current restrictors that extend medially only to lateral edges of the central longitudinal strip to define a drive current path along which the drive current flows through the active layer in the optical gain section and constrain the drive current to flow through the gap; and (H) the optical waveguide structure, the one or more drive current structures, or both, are positioned and arranged to result in a selected degree of spatial overlap between (i) a drive current lateral profile across the active layer in the optical gain section and (ii) the corresponding optical intensity lateral profile across the active layer in the optical gain section of the selected one of the one or more optical modes.

14. The method of claim 13 wherein one or both of the optical waveguide structure or the one or more drive current structures are positioned and arranged to result in a maximal degree of spatial overlap between (i) the drive current lateral profile across the active layer and (ii) the corresponding optical intensity lateral profile across the active layer of the selected one of the one or more optical modes.

15. The method of claim 13 further comprising forming in or on the PBRWG structure one or more reflective or diffractive structures that define a laser resonator so that the one or more supported optical modes are resonant optical modes of the laser resonator and the optical device is arranged as a semiconductor diode laser.

16. The method of claim 15 wherein the PBRWG structure includes at least one distributed Bragg reflector (DBR) that at least partly defines the laser resonator.

17. The method of claim 15 wherein the PBRWG structure includes at least one waveguide grating that at least partly defines the laser resonator.

18. The method of claim 13 further comprising forming a pair of optical ports defined by the PBRWG structure and positioned at corresponding positions along the PBRWG structure with the one or more drive current structures therebetween, so that the optical device is arranged as a semiconductor optical amplifier.

19. The method of claim 13 wherein the active layer includes one or more quantum wells, one or more multi-quantum wells, or a multitude of quantum dots.

20. The method of claim 13 wherein the top doped, bottom doped, and active layers include one or more III-V semiconductor materials or compounds, alloys, or mixtures thereof.

21. The method of claim 13 wherein the gap is filled with material of the top doped layer.

22. The method of claim 21 wherein (i) the one or more current restrictors include first doped semiconductor material of the same doping type as the bottom doped layer, and (ii) a second layer of doped semiconductor material, of the same doping type as the top doped layer and sufficiently thin so as to prevent or restrict lateral flow of the laser drive current therethrough, separates the one or more current restrictors from the active layer, resulting in reverse-biased p-n junctions that prevent flow of the laser drive current through the one or more current restrictors between the top and bottom doped layers.

23. The method of claim 21 wherein the one or more current restrictors include semi-insulating semiconductor material that prevents flow of the laser drive current through the one or more current restrictors between the top and active layers.

* * * * *